US010090819B2

(12) United States Patent
Croft, III

(10) Patent No.: US 10,090,819 B2
(45) Date of Patent: Oct. 2, 2018

(54) SIGNAL PROCESSOR FOR LOUDSPEAKER SYSTEMS FOR ENHANCED PERCEPTION OF LOWER FREQUENCY OUTPUT

(71) Applicant: James J. Croft, III, Bellevue, WA (US)

(72) Inventor: James J. Croft, III, Bellevue, WA (US)

(*) Notice: Subject to any disclaimer, the term of this patent is extended or adjusted under 35 U.S.C. 154(b) by 314 days.

(21) Appl. No.: 14/978,280

(22) Filed: Dec. 22, 2015

(65) Prior Publication Data
US 2016/0112023 A1 Apr. 21, 2016

Related U.S. Application Data

(63) Continuation of application No. 14/276,881, filed on May 13, 2014, now Pat. No. 9,247,342.

(60) Provisional application No. 61/823,356, filed on May 14, 2013.

(51) Int. Cl.
*H03G 5/16* (2006.01)
*H04R 1/28* (2006.01)
*H04R 3/04* (2006.01)
*H04R 3/00* (2006.01)

(52) U.S. Cl.
CPC .......... *H03G 5/165* (2013.01); *H04R 1/2811* (2013.01); *H04R 1/2819* (2013.01); *H04R 3/002* (2013.01); *H04R 3/04* (2013.01); *H04R 2430/03* (2013.01)

(58) Field of Classification Search
None
See application file for complete search history.

(56) References Cited

U.S. PATENT DOCUMENTS

| 2,113,976 | A | 4/1938 | Bagno |
| 4,113,983 | A | 9/1978 | Steel |
| 4,182,930 | A | 1/1980 | Blackmer |
| 4,327,250 | A | 4/1982 | von Recklinghausen |
| 4,481,662 | A | 11/1984 | Long et al. |
| 4,628,528 | A | 12/1986 | Bose et al. |
| 4,637,402 | A | 1/1987 | Adelman |

(Continued)

OTHER PUBLICATIONS

Aarts, "High-Efficiency Low-BL Loudspeakers", Journal of the Audio Engineering Society, Jul./Aug. 2005, pp. 579-592, vol. 53, No. 7/8.

(Continued)

*Primary Examiner* — Paul Huber
(74) *Attorney, Agent, or Firm* — Michael R. Schacht; Schacht Law Office, Inc.

(57) ABSTRACT

A signal processing system for controlling a lower frequency acoustic range of an acoustic output of a loudspeaker system. The system includes an input to receive at least a first channel audio signal, corresponding to the acoustic output of at least one loudspeaker with at least one electro-acoustic transducer with a vibratile diaphragm. The signal processing system includes at least one transpositional gain controller processor for transposition of at least a portion of the amplitude of at least one band of frequencies in a lower frequency audio signal range of the audio signal, to an increased gain in at least one transpositional target frequency in the lower frequency audio signal range. The transpositional gain controller processor includes at least one of at least one, static or dynamic, transpositional gain controller. The system may include at least one additional signal processor, supporting preservation of a perceived fidelity of the acoustic output.

29 Claims, 22 Drawing Sheets

(56) References Cited

U.S. PATENT DOCUMENTS

| | | |
|---|---|---|
| 4,739,514 A | 4/1988 | Short et al. |
| 4,757,548 A | 7/1988 | Fenner, Jr. |
| 4,790,014 A | 12/1988 | Watanabe et al. |
| 4,982,435 A | 1/1991 | Kato et al. |
| 5,092,424 A | 3/1992 | Schreiber et al. |
| 5,255,324 A | 10/1993 | Brewer et al. |
| 5,305,388 A | 4/1994 | Konno |
| 5,359,665 A | 10/1994 | Werrbach |
| 5,473,700 A | 12/1995 | Fenner |
| 5,481,617 A | 1/1996 | Bjerre |
| 5,509,080 A | 4/1996 | Roberts |
| 5,548,650 A | 8/1996 | Clark |
| 5,577,126 A | 11/1996 | Klippel |
| 5,668,885 A | 9/1997 | Oda |
| 5,771,296 A | 6/1998 | Unemura |
| 5,875,255 A | 2/1999 | Campbell |
| 5,923,766 A | 7/1999 | Oda |
| 5,930,373 A | 7/1999 | Shashoua et al. |
| 6,111,960 A | 8/2000 | Aarts et al. |
| 6,134,330 A | 10/2000 | De Poortere et al. |
| 6,169,811 B1 | 1/2001 | Croft, III |
| 6,285,767 B1 | 9/2001 | Klayman |
| 6,456,718 B1 | 9/2002 | Aarts |
| 6,584,205 B1 | 6/2003 | Croft, III et al. |
| 6,665,408 B1 | 12/2003 | Schott |
| 6,704,426 B2 | 3/2004 | Croft, III |
| 6,865,274 B1 | 3/2005 | Aarts et al. |
| 6,931,135 B1 | 8/2005 | Kohut |
| 6,961,435 B2 | 11/2005 | Aarts et al. |
| 7,013,011 B1 | 3/2006 | Weeks et al. |
| 7,054,455 B2 | 5/2006 | Aarts |
| 7,079,660 B2 | 7/2006 | Ohama et al. |
| 7,103,193 B2 | 9/2006 | Croft, III |
| 7,162,042 B2 | 1/2007 | Spencer et al. |
| 7,224,808 B2 | 5/2007 | Spencer et al. |
| 7,274,793 B2 | 9/2007 | Combest et al. |
| 7,298,852 B2 | 11/2007 | Croft, III |
| 7,317,800 B1 | 1/2008 | Vierthaler et al. |
| 7,372,966 B2 | 5/2008 | Bright |
| 7,382,888 B2 | 6/2008 | Aylward et al. |
| 7,394,908 B2 | 7/2008 | Katou et al. |
| 7,466,829 B1 | 12/2008 | Anderson |
| 7,474,752 B2 | 1/2009 | Aarts et al. |
| 7,564,981 B2 | 7/2009 | Croft, III |
| 7,596,229 B2 | 9/2009 | Croft, III |
| 7,702,114 B2 | 4/2010 | Aarts |
| 7,729,498 B2 | 6/2010 | Spencer et al. |
| 7,907,736 B2 | 3/2011 | Yuen et al. |
| 7,933,769 B2 | 4/2011 | Bessette |
| 7,961,888 B2 | 6/2011 | Kasargod et al. |
| 8,005,233 B2 | 8/2011 | Smith |
| 8,019,088 B2 | 9/2011 | Holman |
| 8,036,394 B1 | 10/2011 | Yonemoto et al. |
| 8,045,731 B2 | 10/2011 | Aoki et al. |
| 8,073,149 B2 | 12/2011 | Kuze |
| 8,077,882 B2 | 12/2011 | Shimura et al. |
| 8,098,835 B2 | 1/2012 | Moon et al. |
| 8,103,010 B2 | 1/2012 | Maruko et al. |
| 8,150,050 B2 | 4/2012 | Lee et al. |
| 8,150,066 B2 | 4/2012 | Kubo |
| 8,165,322 B2 | 4/2012 | Jambor et al. |
| 8,180,071 B2 | 5/2012 | Yamazaki et al. |
| 8,189,809 B2 | 5/2012 | Aarts |
| 8,213,636 B2 | 7/2012 | De Muynke et al. |
| 8,229,135 B2 | 7/2012 | Sun et al. |
| 8,238,576 B2 | 8/2012 | Cooper et al. |
| 8,275,137 B1 | 9/2012 | Liu et al. |
| 8,275,152 B2 | 9/2012 | Smirnov et al. |
| 8,284,956 B2 | 10/2012 | Kasargod et al. |
| 8,290,180 B2 | 10/2012 | Yamada et al. |
| 8,351,621 B2 | 1/2013 | Lehnert et al. |
| 8,416,965 B2 | 4/2013 | Hung |
| 8,488,811 B2 | 7/2013 | Smithers et al. |
| 8,582,784 B2 | 11/2013 | Minnaar |
| 8,588,428 B2 | 11/2013 | Croft, III |
| 8,625,813 B2 | 1/2014 | Vickers |
| 8,638,953 B2 | 1/2014 | Jonsson et al. |
| 8,693,706 B2 | 4/2014 | Yokoyama |
| 8,705,764 B2 | 4/2014 | Baritkar et al. |
| 8,712,065 B2 | 4/2014 | Solgaard et al. |
| 8,750,525 B2 | 6/2014 | Martz et al. |
| 8,750,538 B2 | 6/2014 | Avendano et al. |
| 8,792,654 B2 | 7/2014 | Basaran et al. |
| 8,798,281 B2 | 8/2014 | Gautama |
| 2001/0036285 A1 | 11/2001 | Aarts et al. |
| 2001/0049994 A1 | 12/2001 | Wachi et al. |
| 2002/0048378 A1 | 4/2002 | Oki |
| 2003/0044023 A1 | 3/2003 | Larsen |
| 2003/0091203 A1 | 5/2003 | Croft, III et al. |
| 2003/0223588 A1 | 12/2003 | Trammell et al. |
| 2004/0011191 A1 | 1/2004 | Larsen |
| 2004/0022400 A1 | 2/2004 | Magrath |
| 2004/0071299 A1 | 4/2004 | Yoshino |
| 2004/0158458 A1 | 8/2004 | Sluijter et al. |
| 2005/0002534 A1 | 1/2005 | Aubauer et al. |
| 2005/0041815 A1 | 2/2005 | Trammell et al. |
| 2005/0185802 A1 | 8/2005 | Yoshida |
| 2005/0207584 A1 | 9/2005 | Bright |
| 2005/0245221 A1 | 11/2005 | Beyer |
| 2005/0276425 A1 | 12/2005 | Forrester et al. |
| 2006/0014570 A1 | 1/2006 | Marx et al. |
| 2006/0098827 A1 | 5/2006 | Paddock et al. |
| 2007/0026903 A1 | 2/2007 | Aarts |
| 2007/0030983 A1 | 2/2007 | Aarts |
| 2007/0058816 A1 | 3/2007 | Ko |
| 2007/0098182 A1 | 5/2007 | Aarts et al. |
| 2007/0127731 A1 | 6/2007 | Aarts et al. |
| 2007/0140511 A1 | 6/2007 | Lin et al. |
| 2007/0237343 A1 | 10/2007 | Schobben et al. |
| 2007/0253576 A1 | 11/2007 | Bai et al. |
| 2007/0274538 A1 | 11/2007 | Van Reck |
| 2007/0288110 A1 | 12/2007 | Inoue et al. |
| 2007/0299655 A1 | 12/2007 | Laaksonen et al. |
| 2008/0091416 A1 | 4/2008 | Kim et al. |
| 2008/0152168 A1 | 6/2008 | Magrath |
| 2008/0170721 A1 | 7/2008 | Sun et al. |
| 2008/0175409 A1 | 7/2008 | Lee et al. |
| 2008/0212788 A1 | 9/2008 | Bech et al. |
| 2008/0226088 A1 | 9/2008 | Aarts et al. |
| 2008/0267426 A1 | 10/2008 | De Poortere |
| 2009/0041265 A1 | 2/2009 | Kubo |
| 2009/0052695 A1 | 2/2009 | Yamada et al. |
| 2009/0271186 A1 | 10/2009 | LeBlanc et al. |
| 2010/0086148 A1 | 4/2010 | Hung et al. |
| 2010/0158272 A1 | 6/2010 | Vickers |
| 2010/0158273 A1 | 6/2010 | Cheah et al. |
| 2010/0215192 A1 | 8/2010 | Minnaar |
| 2010/0226508 A1 | 9/2010 | Aarts et al. |
| 2010/0232624 A1 | 9/2010 | Zhang |
| 2010/0246854 A1 | 9/2010 | Aarts |
| 2011/0044471 A1 | 2/2011 | Aarts et al. |
| 2011/0091048 A1 | 4/2011 | Bai et al. |
| 2011/0135115 A1 | 6/2011 | Choi et al. |
| 2011/0153314 A1 | 6/2011 | Oxford et al. |
| 2011/0176696 A1 | 7/2011 | Kasargod et al. |
| 2011/0317850 A1 | 12/2011 | Yokoyama |
| 2012/0008788 A1 | 1/2012 | Jonsson et al. |
| 2012/0063614 A1 | 3/2012 | Crockett et al. |
| 2012/0106742 A1 | 5/2012 | Bharitkar et al. |
| 2012/0106750 A1 | 5/2012 | Thormundsson et al. |
| 2012/0140952 A1 | 6/2012 | Shimura et al. |
| 2012/0179456 A1 | 7/2012 | Ryu et al. |
| 2012/0179496 A1 | 7/2012 | Wargin et al. |
| 2012/0189131 A1 | 7/2012 | Ueno et al. |
| 2012/0191462 A1 | 7/2012 | Aoki et al. |
| 2012/0259626 A1 | 10/2012 | Li et al. |
| 2012/0300949 A1 | 11/2012 | Rauhala et al. |
| 2013/0003989 A1 | 1/2013 | Tsang |
| 2013/0016857 A1 | 1/2013 | Oxford et al. |
| 2013/0044896 A1 | 2/2013 | Ekstrand |
| 2013/0077794 A1 | 3/2013 | Risbo et al. |
| 2013/0077795 A1 | 3/2013 | Risbo et al. |
| 2013/0077796 A1 | 3/2013 | Risbo et al. |
| 2013/0094665 A1 | 4/2013 | Muench et al. |

(56) References Cited

U.S. PATENT DOCUMENTS

| | | |
|---|---|---|
| 2013/0116746 A1 | 5/2013 | Polak |
| 2013/0163767 A1 | 6/2013 | Gauger, Jr. et al. |
| 2013/0177171 A1 | 7/2013 | Yokoyama |
| 2013/0230191 A1 | 9/2013 | Hoang Co Thuy et al. |
| 2013/0259245 A1 | 10/2013 | Cheng et al. |
| 2014/0086418 A1 | 3/2014 | Lubberhuizen et al. |
| 2014/0211968 A1 | 7/2014 | Choi et al. |
| 2014/0254827 A1 | 9/2014 | Bailey |

OTHER PUBLICATIONS

Gan et al., "Perceptually-Motiviated Objective Grading of Nonlinear Processing in Virtual-Bass Systems," Journal of the Audio Engineering Society, Nov. 2011, pp. 804-824, vol. 59, No. 11.

Geddes, "An Introduction to Band-Pass Loudspeaker Systems," Journal of the Audio Engineering Society, May 1989, pp. 308-342, vol. 37, No. 5.

Small, "Vented-Box Loudspeaker Systems Part 1," Journal of The Audio Engineering Society, Jun. 1973, pp. 363-372, vol. 21, No. 5.

Small, "Vented-Box Loudspeaker Systems Part 2," Journal of the Audio Engineering Society, Jul./Aug. 1973, pp. 438-444, vol. 21, No. 6.

SIGNAL PROCESSOR FOR LOUDSPEAKER SYSTEMS FOR ENHANCED PERCEPTION OF LOWER FREQUENCY OUTPUT

RELATED APPLICATIONS

This application is a continuation of U.S. patent application Ser. No. 14/276,881 filed May 13, 2014, currently pending.

U.S. patent application Ser. No. 14/276,881 claims benefit of U.S. Provisional Application Ser. No. 61/823,356 filed May 14, 2013.

The contents of all related applications listed above are incorporated herein by reference.

TECHNICAL FIELD

This invention is in the category of audio loudspeaker systems, more specifically, loudspeaker systems with signal processing for the purpose of enhancing low frequency capability.

BACKGROUND AND RELATED ART

In the audio field it has always been desirable for audio systems to be made smaller and lower cost, while at the same time producing the low frequency performance of a larger, higher cost system. This is also a goal in miniature devices, such as cell phones, tablet computers, and small multi-media loudspeakers systems. Similarly, even in larger systems, increased low frequency performance has been desired, such as in the professional, large venue loudspeaker system category, where systems are run at their full capability, singular systems that could achieve the low frequency capability in one loudspeaker enclosure that could duplicate that of two or more loudspeakers systems would be desirable. Additionally, increased low frequency capability has applications in all forms of audio reproduction that includes a low frequency range, including automotive systems, domestic audio systems, consumer audio devices, TV sound systems, home theater and surround sound systems, and music reproduction systems of all types.

A number of technologies have been suggested, each of which provide an enhancement to some aspect of lower frequencies in loudspeaker systems, but each prior art approach also comes with distinct perceptual shortcomings that in the final evaluation makes for a perceptually unconvincing alternative to a larger loudspeaker system.

Bass reproduction has two primary perceptual attributes that need to be satisfied in a small system if it is to convincingly replicate the perceived bass capability of a larger system; 1) tonal balance quality, and 2) physical impact, body-felt, quantity. And to match the capability of a larger system, both of these attributes must be achieved without audible overload distortion.

One approach of the prior art is that of systems that incorporate dynamic equalization, with the earliest of this type being U.S. Pat. No. 4,113,983, "INPUT FILTERING APPARATUS FOR LOUDSPEAKERS", by Paul Steel, followed by later systems, such as U.S. Pat. No. 4,327,250 "DYNAMIC SPEAKER EQUALIZER", by Daniel von Recklinghausen, U.S. Pat. No. 5,481,617, "LOUDSPEAKER ARRANGEMENT WITH FREQUENCY DEPENDENT AMPLITUDE REGULATIONS" by Egon Bjerre, U.S. Pat. No. 5,548,650 "SPEAKER EXCURSION CONTROL" by David Clarke, and U.S. Pat. No. 5,577,126, "Overload Protection Circuit for Transducers", by Wolfgang Klippel, all of the same basic concept but with various processor control architectures.

These low frequency dynamic equalization systems basically equalize and extend low frequencies to allow a small loudspeaker to reproduce lower bass tones more accurately at small signal levels, but at larger signal levels, the majority of low frequencies are suppressed to avoid overload distortion from the low frequency woofer transducer, which also suppresses low frequency aural bass tonal level, and also, physical bass impact, at these larger signal levels, creating a thin sounding loudspeaker with substantially reduced bass impact, with very poor perceptual bass accuracy at all but very small signal levels. The bass is removed, and nothing is done to make up for, or correct the perception of poor bass reproduction at larger signal levels.

US Patent Application 2005/0207584, "SYSTEM FOR LIMITING LOUDSPEAKER DISPLACEMENT" by Andrew Bright, is another dynamic equalizer with additional signal processing, including digital implementation of the dynamic equalization. This system ultimately still suffers from similar limitations of other dynamic equalization processors reduction of physical bass impact and tonal balance quality at large signal levels without a means to correct these shortcomings.

Another approach is U.S. Patent Application 2004/0022400 "BASS COMPRESSOR" by Anthony Magrath, which uses a compressor as a 'hard-clipper', to limit bass and to use the distortion from the compressor such that the resultant distortion is heard as an increase in bass. This approach is problematic in that synthetic bass created by distortion has limited independent control. The requirements for optimal symmetry for compression/clipping and distortion based enhancement of low frequencies can be in conflict without isolated control, limiting the ability to independently allow the creation of an audible perceived bass response faithful to the original program source or desired bass tone increase. Also, the original physical bass impact is reduced when the compressor is activated. The application of Minnaar, "METHOD AND DEVICE FOR EXTENSION OF LOW FREQUENCY OUTPUT FROM A LOUDSPEAKER", U.S. Patent Application 2010/0215192, is essentially a device similar in concept to Magrath but with an alternative control scheme.

Another approach to simulating greater performance from a smaller, lower powered, sound system is that of systems deploying the psychoacoustic effect of fundamental tracking or virtual pitch. An example of this type of system is typified in U.S. Pat. No. 5,668,885, "LOW FREQUENCY AUDIO CONVERSION CIRCUIT" by Mikio Oda. In these systems, a low frequency range is either inherently attenuated, or substantially removed by a static high pass filter, and an attempt is made to fill in a perception of the fundamental frequencies that were removed, by introducing harmonics of those now-missing bass frequencies, in the upper bass and lower midrange frequencies that can be more easily reproduced by the small loudspeaker and woofer transducer. The harmonics are generated statically, at all signal levels. While this can to some degree replace the bass "tones" over a narrow range of frequencies, it does not replace any of the physical bass impact of the bass, and it often applied over too wide of a frequency range to even accurately replace the tonal aspects for all the bass frequencies that are filtered out, resulting in both a total loss of physical bass impact and incomplete, or compromised, tonal quality. U.S. Pat. No. 5,930,373, "METHOD AND SYSTEM FOR ENHANCING QUALITY OF SOUND SIGNAL", by Meir Shashoua, et al is based in the same concept of attempting to replace the tonal loss from a loudspeaker system with attenuated low frequency response, but similarly does nothing to compensate for loss of low frequency physical impact and because the artificial bass is used at small signal levels and large signal levels, it can impart an unrealistic coloration to the bass tone at all levels. Additional disclosures of this type of system are provided by Gan and Hawksford in "Perceptually-Motivated Objective Grading of Nonlinear Processing in Virtual-Bass Systems", published in the Audio Engineering Society Journal, November 2011.

Prior art U.S. Patent Application 2007/0098182 "AUDIO FREQUENCY RANGE ADAPTATION" by R. M. Aarts, and in "High-Efficiency Low-BL Loudspeakers", also by R. M. Aarts in the Audio Engineering Society Journal, July/August 2005, in order to reduce the size of a low frequency loudspeaker, uses a separate subwoofer box optimized to be efficient at one frequency, and uses a mapping processor to map the output of all bass frequencies below approximately 120 Hz to the one frequency. The subwoofer essentially plays just one frequency to replace all bass frequencies below 120 Hz, and this approach is applied statically at all signal levels. Because, in this system, for all bass frequencies there is only one frequency that is being reproduced, the audible output created has an unnatural bass tonal quality for all audio bass frequencies, at all signal levels. This is another system that creates a significant vacancy of frequencies throughout the bass range, with a perceptual "one note" bass effect, and it fails to recreate a realistic facsimile of a high quality low frequency system, and is relegated to use in low fidelity systems.

A common enclosure design is a sealed, acoustic suspension enclosure which exhibits increased diaphragm displacement throughout the lower frequencies without any resonant chamber based frequency and range of reduced diaphragm displacement, and tend to be a poor performer for low frequency acoustic output relative to diaphragm displacement. Historically vented box loudspeakers have been known to provide greater output at a vented box tuning frequency, for a given diaphragm displacement, but exhibit significantly greater diaphragm displacement for all frequencies below the tuning frequency and also for a band of frequencies above the tuning frequency, and therefore are limited in the ability to take advantage of the reduced diaphragm displacement at the vented box tuning to produce greater output over the full range of bass frequencies. These systems are disclosed in "Vented-Box Loudspeaker Systems Part 1 and Part 2", in the Journal of the Audio Engineering Society, June and July/August 1973 issues, by Richard H. Small.

Single and multi-tuned bandpass enclosures attempt to improve output capability but still suffer from increased diaphragm displacement above the lowest tuning frequency, thereby limiting total output capability to the weakest, high displacement frequencies which substantially override the gains from the reduced displacement frequencies. These systems are disclosed in "An Introduction to Band-Pass Loudspeaker Systems" by Earl R. Geddes, in the Journal of the Audio Engineering Society, May 1989 issue.

Additional loudspeaker enclosure designs have been introduced to attempt to create smaller low frequency systems that can reproduce lower frequencies and play them louder without distortion, such as U.S. Pat. No. 4,628,528, "PRESSURE WAVE TRANSDUCING" by Amar Bose and U.S. Pat. No. 5,092,424 "ELECTROACOUSTICAL TRANSDUCING WITH AT LEAST THREE CASCADED SUBCHAMBERS", by William Schreiber, et al. These can provide reduced diaphragm motion at a few narrow frequency ranges, but have other portions of the bass range where the diaphragm motion is significantly greater, and may have even poorer performance than an acoustic suspension system at those high displacement frequencies and cannot support full output bass without overloading except at a few narrow frequencies, and so the maximum level capability of the systems over the full range of low frequencies is substantially limited to the output capability of the highest displacement frequency ranges and the reduced displacements in the narrow ranges cannot fully contribute to maximizing undistorted bass output through the bass frequency range.

Other systems have developed variations on these themes, primarily introducing more efficient processing algorithms and refinements, but none that change the fundamental limitations of these approaches to provide large bass system performance in a small device without significantly compromising perceived sound quality and quantity.

There is a still an unfulfilled need for an approach that can improve the perceived bass quantity and extension for a given size of low frequency system, without significantly compromising the bass quality and fidelity.

It would be desirable to have a low frequency loudspeaker enclosure and signal processing system that can maximize the low frequency capability and increase the sound quantity in the low frequency range for a given size enclosure while substantially maintaining the perception of sound quality, providing perceived tonal accuracy and realistic physical bass impact.

Applicant hereby incorporates herein by reference any U.S. patents and U.S. patent applications, and technical papers cited or referred to in this application to the extent the prior disclosure is consistent herewith, and to the extent inconsistent, this later disclosure shall control.

SUMMARY

A signal processing system for controlling a lower frequency acoustic range of the acoustic output of a loudspeaker system. The system includes an input to receive at least a first channel audio signal, corresponding to the acoustic output of at least one loudspeaker that includes at least one electro-acoustic transducer with a vibratile diaphragm. The signal processing system includes at least one transpositional gain controller processor for transposition of at least a portion of the amplitude of at least one band of frequencies in a lower frequency audio signal range of the audio signal, to an increased gain in at least one transpositional target frequency in the lower frequency audio signal range. The transpositional gain controller processor may include at least one of, at least one static transpositional gain controller and at least one dynamic transpositional gain controller.

In another example of the signal processing system, as described above, the system is further configured to respond to at least a portion of at least one band of frequencies in the lower frequency acoustic range of the acoustic output of the loudspeaker, having an amplitude, depressed below a reference level amplitude response, or preferred reference target response curve, in the lower frequency acoustic range. At least a portion of the reduced amplitude may be due to at least one of a gain reduction of a gain filter, including a static or dynamic gain filter, an acoustic amplitude response of the at least one loudspeaker, or the acoustic environment external to the loudspeaker, such as the acoustical effects of a listening environment.

The signal processing system may provide a perceived amplitude correction for the reduced amplitude, such that the at least one transpositional gain controller processor transposes at least a portion of the reduced amplitude, of the at least one band of frequencies, as an increased gain in the at least one transpositional target frequency in at least one audio signal channel in the lower frequency audio signal range. The transpositional gain controller processor includes at least one of at least one static transpositional gain controller and at least one dynamic transpositional gain controller.

As a further example signal processing system, supplementing either of the examples of the signal processing system disclosed above, at least one additional signal processor, in addition to the transpositional gain controller processor, may be added. The at least one additional signal processor may operate in one or more of the at least one audio signal channel. Also, the at least one additional signal processor, may include one or more of at least one of a phase change, a time delay, a dynamic gain filter, a harmonics generator and a dynamic harmonics generator.

The harmonics generator and the dynamic harmonics generator may generate harmonics of at least a portion of the at least one band of frequencies and the harmonics of the at least one harmonics generator, or at least one dynamic harmonics generator, can be in one or more of the at least one audio signal channels.

In the case of any of the processors being a dynamic processor, they may be responsive to a threshold detector with at least one amplitude threshold.

As a still further example of the signal processing system the at least one additional signal processor may be applied to support the preservation of a perceived fidelity of the acoustic output of the loudspeaker. The at least one additional signal processor may be applied to support the preservation of the perceived fidelity of the acoustic output during the transpositional process.

These and other attributes will become apparent as examples of the signal processing system are further described herein.

BRIEF DESCRIPTION OF THE DRAWINGS

The figures depict examples of the present invention for the purposes of illustration only. One skilled in the art will readily recognize from the following discussion that alternative embodiments of the structure and methods illustrated herein may be employed without departing from principles described.

DETAILED DESCRIPTION

Figure 1:
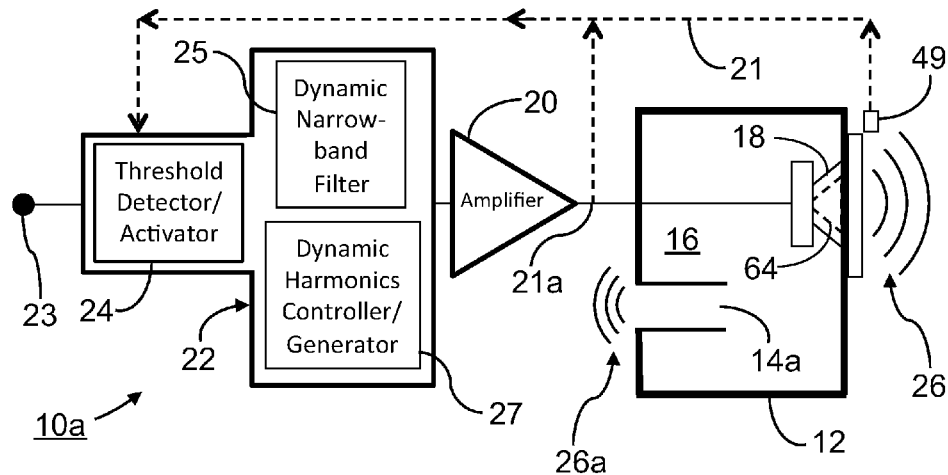
FIG. 1 is a first example loudspeaker system bass-reflex resonant chamber loudspeaker enclosure with a passive acoustic port radiator and low frequency signal processor.
Figure 6:
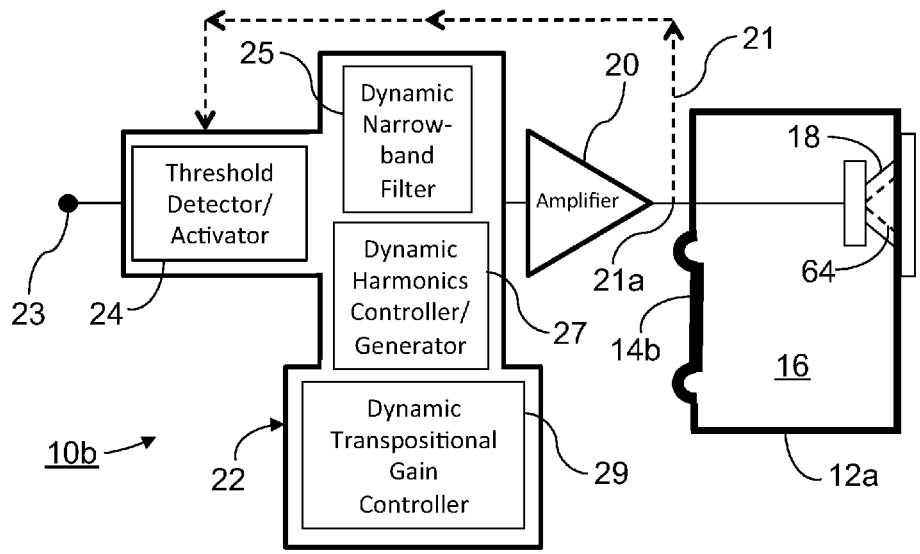
FIG. 6 is another example of the loudspeaker system and signal processor further including a dynamic transpositional gain controller.

FIG. 1 represents a first example 10a of the inventive loudspeaker system, including a multi-mode signal processor 22 for minimizing audible overload distortion while increasing perceived low frequency output capability, comprising at least one loudspeaker enclosure 12, including at least one low frequency resonant chamber 16 and at least one electro-acoustical transducer 18, with a vibratile diaphragm 64 for converting an input electrical signal, which may be an input audio electrical signal, received at input 23, and amplified by amplifier 20 to amplifier output/loudspeaker input point 21a, into a corresponding amplified acoustic output signal 26, including a resonant chamber output 26a, with the resonant chamber 16 consisting of at least one of a bass-reflex resonant chamber and a wave-resonant air-column chamber, with the example loudspeaker system of FIG. 1 showing a bass reflex enclosure 12 with resonant chamber 16. The acoustic mass of the passive acoustic radiator 14a, and the compliance of the air volume in chamber 16 form a bass-reflex resonance creating the resonant chamber resonance tuning frequency ($F_{RC1}$) 34 in graph 30a of FIG. 3. Passive acoustic mass radiator 14a, as shown in FIG. 1 as an open vent or port, but may optionally be interchanged with a passive diaphragm radiator, as shown in FIG. 6 as 14b.

Figure 3:
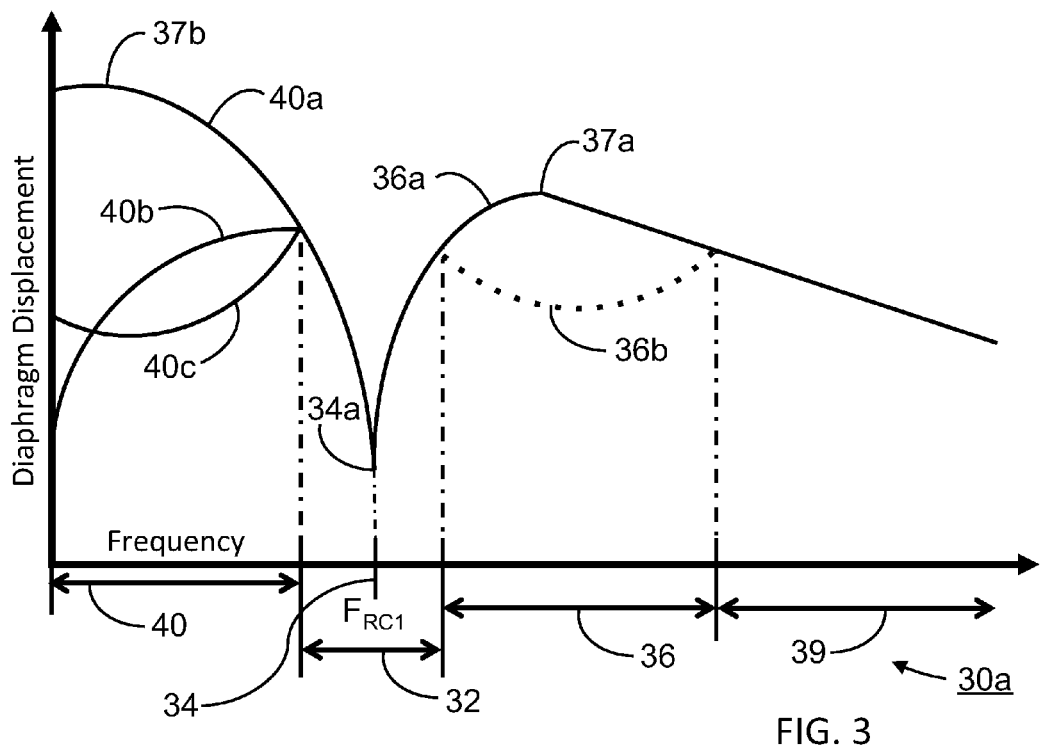
FIG. 3 is a graphic representation of the diaphragm displacement as a function of frequency of the bass-reflex resonant chamber loudspeaker enclosure of FIG. 1.

Also referring to FIG. 3, the loudspeaker system 10a includes a first frequency range 32 with a reduced diaphragm displacement and a fundamental resonant chamber resonance frequency 34 at which a displacement characteristic of the vibratile diaphragm 64 as a function of frequency has a minimum 34a.

The loudspeaker system 10a also includes a second frequency range 36, adjacent to, and higher in frequency than, the first frequency range 32, includes an increased diaphragm displacement and a frequency ($F_{MAX1}$) 37a, at which the displacement characteristic of the vibratile diaphragm 64 as a function of frequency has a maximum 37a. The system also includes a third frequency range 39, above the frequency $F_{MAX1}$ 37a.

Additionally, the system 10a includes multi-mode signal processing block 22, with a primary dynamic narrowband filter 25 for primarily dynamically adjusting a gain of one or more frequencies within the second frequency range 36, and a processing block 22 with a harmonics controller, configured to include a primary dynamic harmonics generator 27 to produce harmonics 74 (shown in FIG. 4) in the third frequency range 39 and dynamically adjusting a harmonics gain in the third frequency range 39 with the produced harmonics 74 corresponding to the dynamically gain adjusted frequencies 36b within the second frequency range 36 and the produced harmonics 74 creating a virtual frequency gain replacement 72 for gain adjusted frequencies 36b in the second frequency range 36. Frequency range 39 may extend upward in frequency as far as needed to for the selections of produced harmonics to create the most effective virtual fundamental frequency gain in a gain reduced frequency range.

Figure 8A:
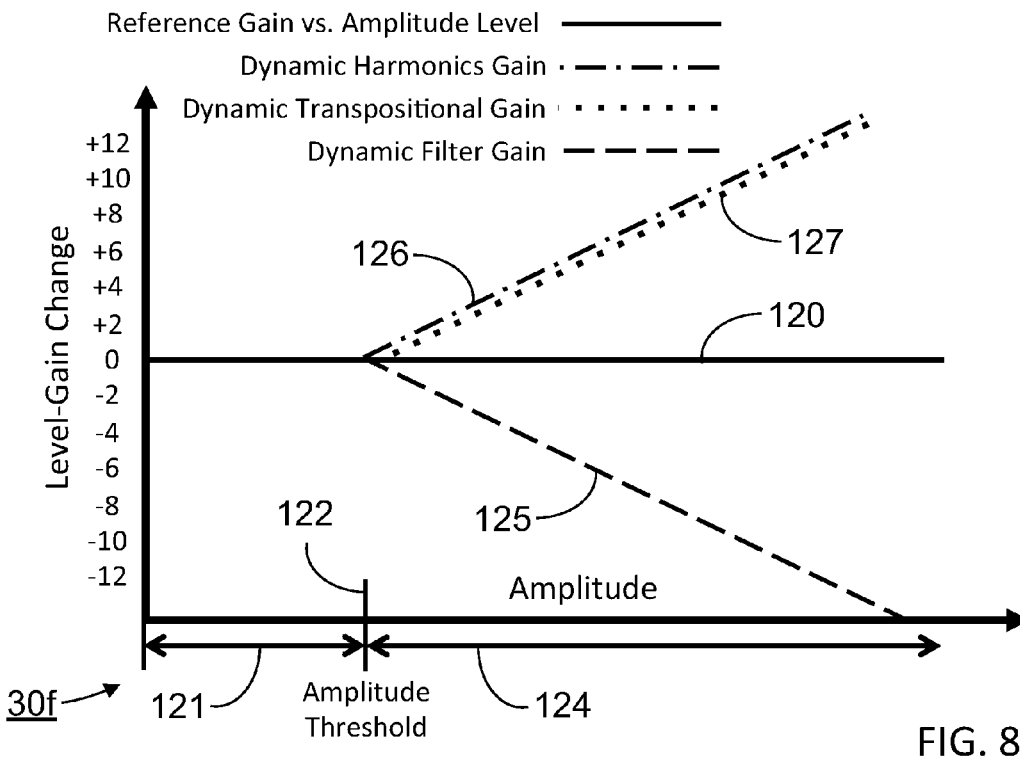
FIG. 8A is a graphic representation of the dynamic filter gain, dynamic harmonics gain, and dynamic transposed frequency gain below and above the threshold.

Referring to FIG. 1, and also FIG. 8A, a threshold detector and activator 24 is configured to detect a primary narrowband audio amplitude 120 threshold 122 (of FIG. 8A) based on an audio drive signal at amplifier 20 output 21a corresponding to a displacement of the transducer 18 diaphragm 64 within the second frequency range 36, and, the displacement threshold 122 may correspond to an audible overload distortion of the transducer 18 acoustic output 26.

In an example loudspeaker system and signal processor, when a corresponding amplified audio signal level 120 is below the primary narrowband amplitude threshold 122, the primary dynamic narrowband filter 25 and the primary dynamic harmonics generator 27 is inactive. When the primary narrowband audio amplitude threshold 122 is exceeded, the primary dynamic narrowband filter 25 is activated and the dynamic harmonics generator is activated 27, and as a level of an audio input signal within the second frequency range is increased further 124, the dynamic filter gain 125 of the primary dynamic narrowband filter 25 is reduced further preferably holding the displacement of diaphragm 64 to a maximum limited amplitude to minimize overload distortion, and the dynamic harmonics gain 126 of the dynamic harmonics generator 27 is increased, such that when operating at amplitude levels 120 above the audio amplitude threshold 122 the signal processor 22 operates with the dynamic narrowband filter 25 gain 125 and the dynamic harmonic generator 27 gain 126 corresponding in an inverse relationship to each other wherein as the dynamic filter gain 125 in the second frequency band 36 is dynamically reduced to minimize audible overload distortion, the first frequency range 32 acoustic level is substantially maintained relative to that of the acoustic level of the second frequency range 36, to more effectively maintain a perceived physical bass impact, and the dynamic harmonics gain 126 in the third frequency range 39 is increased to more effectively maintain a perception of a tonal level 72 (FIG. 4) in the second frequency range 36.

The threshold detector/activator 24 may be optimized with a predictive model to predict threshold parameters for loudspeaker system 10a, including transducer 18, and compare to an analysis of the input signal directly or the corresponding amplified audio signal after a volume/gain control setting of an amplifier 20, which may include predictive information about the forward gain profile of the amplification circuits to the point of the output 21a of the amplifier 20. Alternatively, the system may sense a signal level, or distortion level, and use feedback 21 to the threshold detector/activator block 24 from a point from the output 21a of amplifier 20 (which may be equivalent to loudspeaker 12 or transducer 18 input). Also feedback 21 may be derived from a sensor 49 at the loudspeaker transducer 18 output, sensing acoustic output 26, or diaphragm 64, displacement. The sensor may be coupled to the diaphragm 64 of transducer 18 or may be mounted on the transducer or suspended near the transducer diaphragm 64. The primary threshold may be a diaphragm 64 displacement limit relative to approaching the onset of a predetermined acoustic level or audible distortion level. A threshold may also relate to a transducer voice coil temperature reaching a level of either raising the impedance of the transducer to create an onset of distortion/compression, or voice coil temperature relative to overheating or potential damage. The threshold may also relate to an amplifier 20 overload level, or clipping, as the level approaches, or exceeds, a predetermined level or audible distortion level. The threshold detector 24 may have one or more thresholds to trigger the activation processing modes of the signal processor 22, and some of which may be secondary thresholds that may relate to additional parameters of the loudspeaker system and may activate different aspects of the processor or control one or more frequency ranges of the loudspeaker system.

Figure 4:
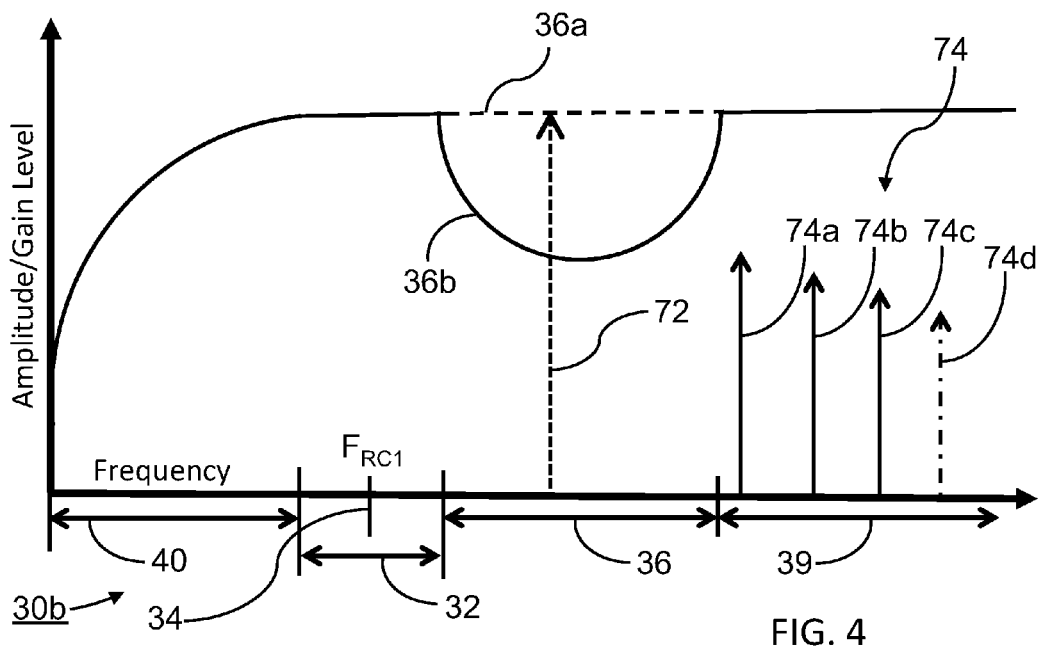
FIG. 4 is spectral representation of the dynamic harmonics generator.

The control structures of the first example 10a of the loudspeaker system and signal processor incorporate separate dynamic narrowband filter 25 and dynamic harmonics generator 27 processes and may utilize an asymmetrical attack and release time with substantially instantaneous dynamic gain filter reduction onset, and slower, or longer gain recovery time, preferably at least 4 times longer than the attack time, to minimize audible distortion artifacts, or audible pumping distortion, from the dynamic narrowband filter 25 and to optimize control of the harmonics of the dynamic harmonic generator 27 independently of the dynamic narrowband filter 25 for optimization of harmonic levels, and generation and control of an all even harmonics only, all odd harmonics only, or a controlled mix of even and odd harmonics. Additionally, the harmonics generator may include a harmonics shaper to vary the gain level of one or more harmonics relative to the other harmonics, such as shaping the harmonics such that each higher harmonic number may be attenuated relative to each lower adjacent harmonic number, i.e. as seen in FIG. 4, showing generated harmonics 74, with a second harmonic 74a, followed by a reduced level, third harmonic 74b, followed by a further reduced level, fourth harmonic 74c, and 74d representing any additional harmonics, of which one or all may be lower in level than all preceding harmonics. In any of the example systems the harmonics 74 may be represented by as few as two harmonics or by an extended series of harmonics, of three or greater.

As the dynamic narrowband filter, operates as a narrowband gain controller in second frequency range 36, it may preferably allow the frequencies below (and above) narrow threshold band 36 (of FIG. 2) to remain substantially unaffected, by the primary function of dynamic narrowband filter 25, supporting the resonant chamber resonance frequency 34 in the first frequency range 32 and the frequencies in the third frequency range 39 operating substantially without gain attenuation, unless enacted by predetermined additional process control in signal processor 22.

An organization of the control blocks within signal processor 22 are such that the threshold detector/activator 24 is in series with and ahead of following processor blocks of, the dynamic narrowband filter 25 and dynamic harmonic controller/generator 27, which operate in parallel with each other and couple the output to amplifier 20 in this example system. The threshold detector/activator 24, upon reaching a predetermined threshold, can active the dynamic narrowband filter 25, and the dynamic harmonics controller/generator 27, substantially simultaneously.

Alternatively, in other example systems, all the gain blocks in signal processor 22 could operate in series, for instance, the threshold detector/activator 24 could activate dynamic narrowband filter 25, which could serially activate the dynamic harmonics controller/generator 27 upon a gain reduction being activated in the dynamic narrowband filter.

Figure 2:
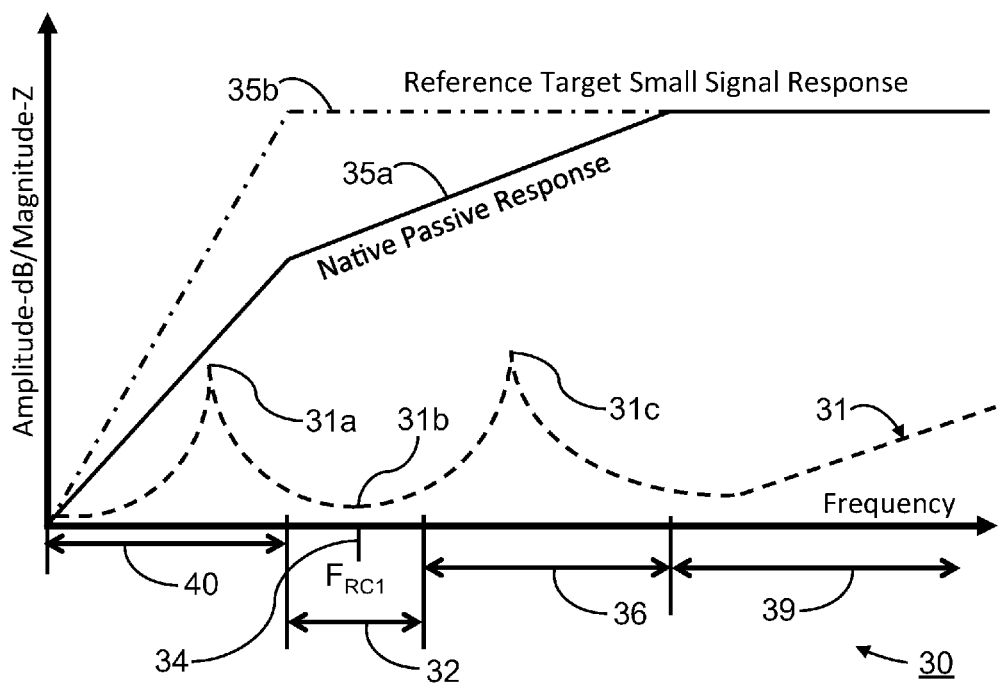
FIG. 2 is a spectral representation of one example of native amplitude response, target small signal amplitude response, and impedance curve.

FIG. 2 includes a spectral graph representation 30 of an example of a passive, pre-processed, native system amplitude response 35a and one example of a reference, or target small signal response 35b representing a frequency response of a system operating below the amplitude threshold. When reducing the size of a given loudspeaker system, or optimizing a system to be more efficient, the response in the lower frequency range may droop, or attenuate in amplitude as a function of a reduction in frequency, as shown in the native response curve 35a. In one example system of the loudspeaker system with signal processor, the amplitude may fall in response at a rate per octave through first range 32 and second frequency range 36, operate substantially flat over the third frequency range 39, and fall at a steeper slope in the fourth range 40, below the first frequency range 32. This reduction in low frequency response may allow for an overall loudspeaker system design that provides greater system efficiency in, and in some enclosure types, above the third frequency range 39. This native response with low frequency attenuation may allow the enclosure size to be reduced for a given efficiency above the second frequency range 36. The upper high-pass corner frequency is shown at the intersection frequency range 36 and frequency range 39, but system parameters may also be chosen to have the transition be somewhat above or below this frequency intersection frequency. In some system alignments, the native response 35a may be a preferred starting, passive frequency response of transducer 18 and enclosure 12 before applying any electronics or equalization. The reference target curve may have a preferred response that is a substantially flat frequency response to as low a frequency as possible, plus or minus an amplitude tolerance error but may have a somewhat different amplitude response, that achieves a preferred tonal balance, or match to an environment, or use model. The reference target curve may be achieved with transducer 18 and enclosure 12 parameters, or may be a fixed, starting electronic equalization applied to the native passive response to achieve a preferred reference target small signal curve. As an example 10a in FIG. 1 the system may be equalized to have a substantially flat, starting frequency response, with the term "starting frequency response" referring to a small signal response, when operating below the amplitude threshold, before the dynamic narrowband filter is activated upon the amplitude threshold being exceeded, wherein the amplitude threshold relates to the narrow band second frequency range. The term narrowband, in the dynamic narrowband filter 25 and the bandwidth of the second frequency range 36, may refer to a bandwidth of approximately two octaves or less, and, in some examples, may be less than one octave, to maintain more bandwidth of non-gain reduced frequencies at and above the first frequency range, while still avoiding the perception of audible overload distortion, by dynamically suppressing gain in the high excursion frequency range 36, and particularly frequencies near a maximum excursion frequency such as $F_{MAX1}$ 37b, as shown in graph 30a of FIG. 3. The signal processing block 22, with dynamic narrowband filter 25 and dynamic harmonics generator 27, is deployed to maintain aural and physical impact perception fidelity to a preferred target response curve, such as example target curve 35b while minimizing audible overload distortion of loudspeaker system 10a.

Also shown in FIG. 2 is enclosure/transducer impedance curve 31, corresponding to the example shown in FIG. 1, wherein an impedance minimum 31b corresponds to resonant chamber resonance frequency $F_{RC1}$ 34 in first frequency range 32. Transducer resonance impedance peak 31a may be within frequency range 40 or at the lower frequency portion of frequency range 32, and transducer impedance peak 31c may fall within second frequency range 36 or may be at a somewhat higher frequency, in frequency range 39.

The frequency of the resonant chamber resonance $F_{RC1}$ 34 can be seen as corresponding to an impedance minimum as a function of frequency, and represents the resonant chamber resonance, with the frequency 34 defined primarily by the enclosure volume 16 compliance and passive acoustic radiator acoustic mass, substantially independent of the transducer parameters, whereas the frequencies of impedance peaks 31a and 31c are transducer resonances determined by the combination of transducer Thiele-Small parameters and the enclosure parameters.

Resonant chamber based loudspeakers of the loudspeaker system and signal processor, including resonant bass-reflex and resonant air-columns, exhibit at least one chamber resonance causing the loudspeaker system 10 to exhibit a fundamental resonant chamber resonance frequency 34 at a low operating frequency range where the diaphragm displacement as a function of frequency is minimized as opposed to a, non-resonant chamber based enclosure, such as an acoustic suspension or open baffle for which there is no resonant chamber resonance or diaphragm displacement minimum as a function of frequency, and transducer diaphragm motion is increased at low frequencies.

Referring again to FIG. 3, showing diaphragm displacement graph 30a, wherein the vertical portion of the graph represents diaphragm displacement for a given constant driver voltage and the horizontal portion of the graph represents frequency. Frequency range 32 is a reduced diaphragm displacement range, including fundamental resonant chamber resonance frequency $F_{RC1}$ 34 with transducer 18 diaphragm 64 displacement minimum 34a, which as a function of frequency represents a significant reduction in diaphragm excursion relative to adjacent frequencies for a constant input voltage vs. frequency to the transducer 18 in enclosure 12 of FIG. 1. The second frequency range 36 is an increased diaphragm displacement range, with a maximum displacement frequency 37a which can be a primary limiting factor relative to displacement limited output capability of the loudspeaker system 10a. A woofer transducer will have a diaphragm displacement limit wherein various components in the transducer, such as the suspension and magnetic circuit with voice coil, have been required, by the audio signal program material, to move so far as to have its movement become non-linear, which may result in audible overload distortion. Upon the audio input signal containing frequencies in frequency range 36 that increase in amplitude to the level that a diaphragm 64 displacement threshold is exceeded, the threshold detector 24 may activate the dynamic narrowband filter to start attenuating frequency range 36 in a manner shown in narrowband gain reduced curve 36b. By gain reducing frequency range 36 with a narrowband filter, frequencies above and below frequency range 36 may remain substantially unaltered, and the loudspeaker system can play louder overall without audible overload distortion. Below frequency range 32 is a fourth frequency range 40 which is another higher displacement frequency range with frequency 37b representing a displacement maximum, which may be a peak, or a maximum reached that continues at the same level substantially down to below 1 Hz. The diaphragm displacement in frequency range 40 is much greater than frequency range 32 for the same voltage input to the transducer 18. In this range a fixed filter may be incorporated into equalization built into signal processor 22, such as a high-pass filter or a narrowband filter, with a gain reduction curve like the one shown as high pass filter curve 40b or narrowband filter 40c. Fixed, in this case meaning that the gain of the curve as a function of frequency is constant with input voltage level. In some embodiments of the loudspeaker system and signal processor this may be a dynamic high pass filter, with a non-linear gain relative to input voltage. Curve 40a represents the diaphragm displacement for the loudspeaker in FIG. 1, without the high pass filter. The implementation of high pass filter curve 40b or narrowband filter 40c may allow the system to substantially increase total output without being overloaded in frequency range 40 by low frequency, or subsonic frequencies which may overload the transducer 18 diaphragm 64 displacement capability, causing audible overload distortion, and potential damage to the transducer 18. This high-pass filter may be of any order, but preferably it is at least a second, or higher, order high pass filter to effectively reduce gain adequately to avoid diaphragm overload under worst case program material conditions with very high level, low frequency audio, or subsonic signals. The filter may also be an under-damped high-pass filter as part of establishing the reference target frequency response, by having the under-damped characteristic cause a gain boost in frequency range 32 and in some embodiments, at least a portion of the frequency range 36, while applying significant attenuation to a significant portion of frequency range 40. While "Q" values for an under-damped filter may be of any useful value to compliment the particular system parameters, but generally a range between a "Q" of 1.4, with 3 dB of peaking, and a "Q" of 4, with 12 dB of peaking, would be preferred.

Any of the examples of the loudspeaker system and signal processor may additionally have a starting, fixed equalization, to a predetermined, target small signal response shape, as a starting spectral balance and frequency response curve.

FIG. 4 shows dynamic gain and harmonics generation in amplitude/gain level graph 30b showing frequency range 36 and frequency range 36 being represented with significant gain reduced frequency curve example 36b. Frequency 34 shows chamber fundamental, resonant chamber resonance tuning frequency $F_{RC1}$ as being maintained at a substantially full gain level during an overload protective gain reduction being applied to frequency range 36 as discussed above. When frequency range 36 is gain reduced, to minimize diaphragm 64 displacement, the harmonics generator produces harmonic series 74 in frequency range 39, including harmonics, 74a, 74b, 74c, (74d representing more or less included harmonics as they may be even or odd harmonics or a mix of both and may be carried up to a higher harmonic count or limited to just the lower harmonics first, second, third, and may be attenuated with each increasing harmonic number) creating perceived, virtual fundamental frequency 72 at reference target level 36a as the harmonics create a psycho-acoustic, virtual pitch representation of the suppressed fundamental frequencies 36b which is perceived by the listener as substantially the same tonal character and tonal level 36a as that frequency range before it was gain reduced to curve 36b and it is perceived at substantially full gain level 36a, creating a virtual fundamental 72, tonally duplicating the fundamental as if it had not been gain reduced. This can be applied to one or more gain reduced fundamentals in the frequency range 36.

This balance of having the gain reduced in frequency range 36 to protect from audible overload distortion, and the harmonics in frequency range 39 having a corresponding gain increase to create virtual tone replacement frequencies 72 maintains the perceived tonal balance of the loudspeaker system while allowing the system to operate at much greater output levels while minimizing audible overload distortion. Also, by maintaining the system gain at frequencies in frequency range 32, much of the perceived physical impact from reproduced bass frequencies is preserved such that the system minimizes overload distortion while playing louder, while sustaining tonal and physical impact fidelity. Frequency range 40 for this example shows a high pass filter characteristic similar to that shown in FIG. 3 and described above.

In an example loudspeaker system with signal processor, the dynamic harmonics generator 27 can operate effectively for a given gain suppressed frequency band of two octaves or less, and in some examples when creating a virtual tonal replacement of approximately 1.5 octaves or less, and the bandwidth of the dynamic narrowband filter has a maximum bandwidth of less than two octaves, and in some examples of the loudspeaker system, approximately 1.5 octaves or less, and to have the narrowband gain filter bandwidth 36b and the harmonics generator virtual fundamentals 72, within frequency range 36, have a bandwidth that substantially matches the gain reduced bandwidth 36b. Beside the bandwidths corresponding between the narrowband filter and the virtual tones of the harmonics generator, the gain reduction of the narrowband filter and the gain increase of the generated harmonic series 74, should have a corresponding inverse gain relationship to have the tonal effect of the narrowband gain reduction 36b be at least partially perceptually replaced by the perceived level of the virtual tone or tones, 72. It is advantageous to have the perceived level of the virtual tone or tones, 72 create a perception of the same tonal quality as if the gain reduced frequencies had not been gain reduced.

Figure 5:
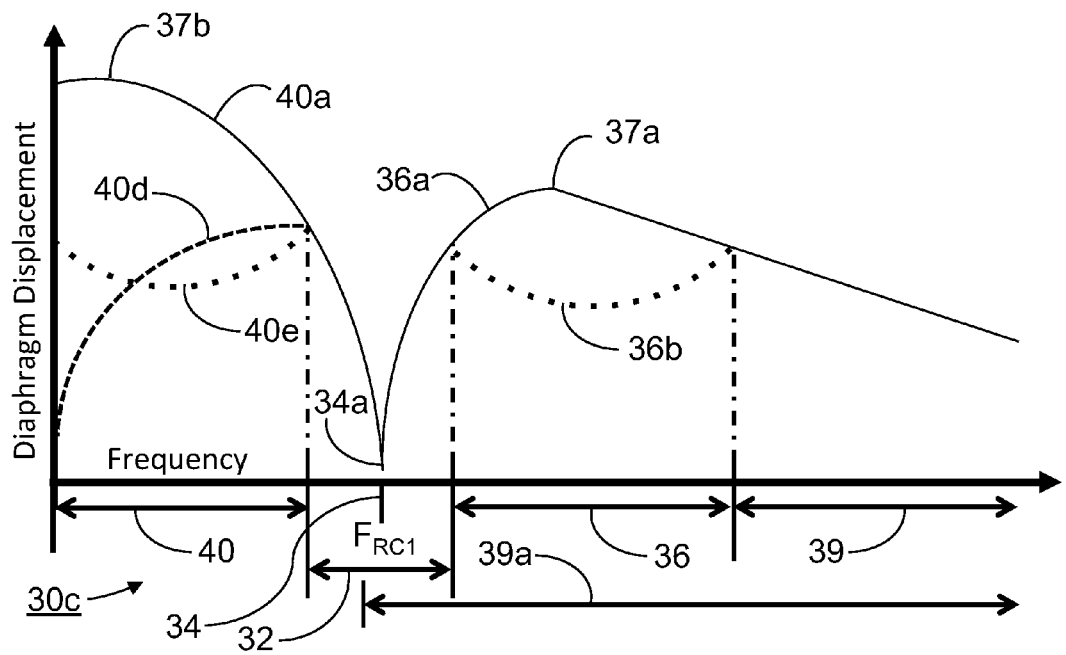
FIG. 5 is another example graphic representation of the diaphragm displacement as a function of frequency.

FIG. 5 shows a graph 30c displaying 'diaphragm displacement' (or excursion) in the vertical, and frequency in the horizontal, similar to that shown in FIG. 3, wherein a first frequency range 32 with reduced diaphragm displacement, including fundamental resonant chamber resonance frequency 34, also referred to herein as $F_{RC1}$, corresponding to diaphragm displacement minimum 34a as a function of frequency, which is caused by the fundamental resonance frequency 34 of a resonant chamber in a loudspeaker enclosure, the resonant chamber being one of a bass reflex (or Helmholtz-reflex) chamber, or a wave-resonant air-column chamber, where in this example, referring to loudspeaker system in FIG. 1, the resonant chamber is that of a bass reflex chamber 16 with a resonance frequency 34.

Also shown is a second frequency range 36 with an increased diaphragm displacement, including a maximum displacement frequency 37a, the second frequency range adjacent to, and higher in frequency, than the first frequency range 32, and the second frequency range including a maximum displacement frequency 37a, also referred to herein as $F_{MAX1}$. The frequency range 36 is also represented with small signal, below amplitude threshold, full gain response 36a, and dynamic gain reduced response, as an example curve illustration 36b when dynamic narrowband filter 25 (FIG. 1) is activated. This curve differs from that of FIG. 3 by way of additional filter curve choices 40d and 40e, in the fourth frequency range 40 which adjacent and below first frequency range 32, with maximum displacement frequencies 37b, full gain response show as curve 40a, having an optional dynamic gain reduced response, as two examples shown in 40d or 40e with one of a dynamic high-pass filter shape example 40d and a dynamic narrowband filter shape example 40e with this dynamic filter. This illustration of dynamic filter responses can be used with any of the enclosure systems disclosed herein, but can have particular value when used with the resonant chamber, bandpass enclosures of FIG. 9, FIG. 9A and FIG. 9B, with at least one resonant chamber 16 and sealed chamber 13.

Referring to the loudspeaker system 10a with signal processor 22, in FIG. 1, the dynamic narrowband filter block may include secondary band-limited dynamic filters, to perform the dynamic high-pass curve 40d or dynamic narrowband curve 40e gain reductions upon reaching a secondary band-limited threshold, embodied in the threshold detector/activator 24. The secondary band limited threshold would be coordinated with monitoring or predicting a signal amplitude in frequency range 40, such that upon reaching a predetermined secondary threshold, a gain adjustment process, would be invoked to include a dynamic gain reduction curve 40d or 40e. As with the primary threshold detection and primary dynamic gain reduction in frequency range 36, the dynamic gain reductions in frequency range 40 would be dormant when below the secondary band-limited threshold level, and active when at or above the secondary band-limited threshold level. Also, as with the dynamic filter operation in frequency range 36, the band limited dynamic filter operation in frequency range 40 would leave frequency range substantially unaffected by the gain reduction in frequency range 40.

Additionally, a secondary harmonics generator may operate in coordination with the secondary dynamic gain reduction filter such that as the gain is reduced in frequency range 40, a virtual tone gain is activated and increased in frequency range 40 by way of corresponding harmonics and corresponding harmonics gain being generated in a frequency range above frequency range 40 to sustain a perception of a pre-gain-reduced tonal level and fidelity of frequency range 40.

The harmonics generated in correspondence with gain reduced frequencies in frequency range 40 may fall within frequency range 39a, which may extend below frequency range 39 to a frequency within frequency range 32. As program material, such as music or movie soundtracks, changes dynamically on a moment to moment basis when high intensity input signals are in the range of frequency range 40, the program material may be lessened in frequency range 36, such that at least a portion of frequency range 36 may be available for generated harmonics supporting gain reduced frequencies in frequency range 40. Some portion of frequency range 39 or 39a may support generated harmonics for frequency range 40. It may be the case that if frequency range 36 was being gain reduced to avoid audible overload that additional generated harmonics gain may or may not be produced in the portion of frequency range 39a that overlaps with frequency range 36.

Figure 5A:
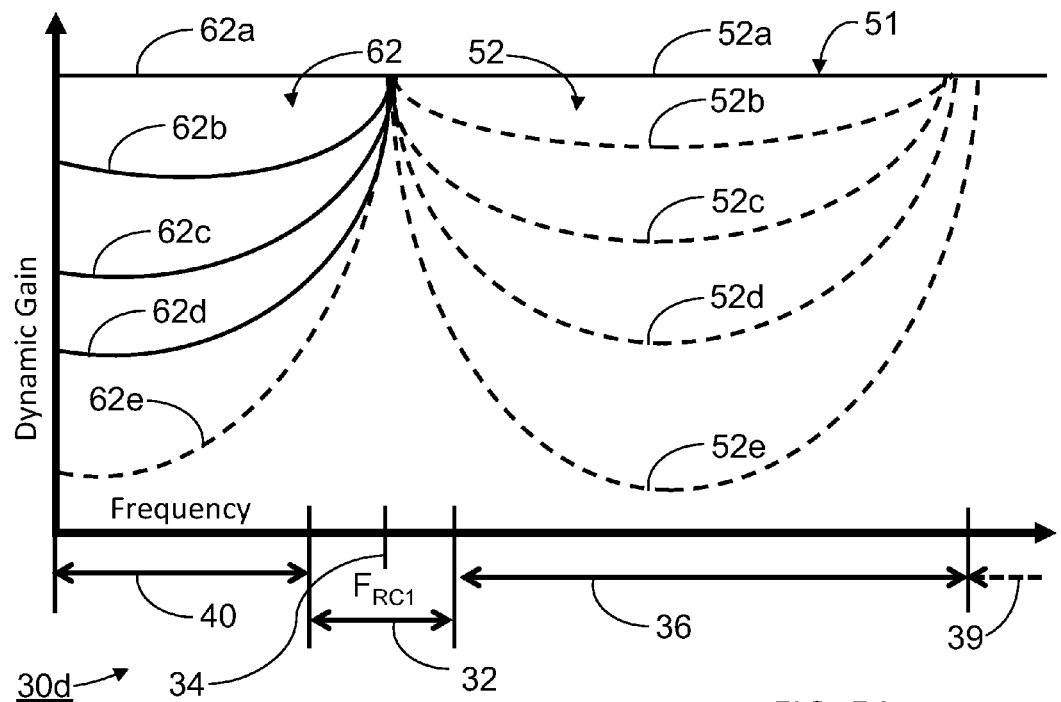
FIG. 5A is graphic representation of the operation of dynamic narrow band gain filters.

FIG. 5A represents one example of dynamic filter gain curves vs. frequency graph 30d illustrating the primary dynamic narrowband filter 25 gain characteristic 52 of frequency band 36 and one possible secondary dynamic band limited filter gain characteristic 62 optional band-limited, secondary dynamic gain filter of frequency band 40. The system resonant chamber enclosure's fundamental resonant frequency ($F_{RC1}$) is shown at 34 residing within the first frequency range 32. Small signal, reference target small signal gain/amplitude response curve 51 shows the relative preferred frequency response curve upon the dynamic systems being in a substantially dormant state below the predetermined threshold levels. Upon the second frequency band 36 having an amplitude within a signal frequency that drives the transducer diaphragm to a displacement amplitude threshold in frequency band 36, a gain within frequency band 36 is gain reduced by the amount required to maintain the diaphragm displacement in that band from exceeding the predetermined overload threshold. The multiplicity of gain reduced curves 52 show a progression of greater and greater activity of gain reduction of the dynamic narrowband filter, with increasing audio signal level, from no gain reduction 52a when below threshold, to gradually increasing gain reductions 52b thru 52e such that approximately equal excursion is reached over a useful range of levels, the excursion set by the maximum limits prior to audible overload of the loudspeaker transducer diaphragm 64 displacement.

During all these gain reductions it can be seen that frequency $F_{RC1}$ 34 remains substantially at full gain, maintaining a perceived physical bass impact.

Optionally, as an additional performance enhancement and avoidance of overload, a fourth frequency range 40 may also have a dynamic gain reduction filter applied upon the threshold detector 24 applying a second threshold set to the frequency range 40 starting below the threshold with non-gain reduced curve 62a and the progressively increased gain reduction of curves 62b thru 62e.

As in the embodiments described above, as the threshold is exceeded and the gain is reduced in the second frequency range 36 the perceived tonal gain in the band 36 will be substantially replaced and maintained by the activation of the dynamic harmonics generator adding harmonics that are harmonics of gain reduced fundamental frequencies within band 36 with appropriately increased gain to create and maintain a perception of a maintained tonal balance of the gain reduced fundamentals in range 36, by way of virtual fundamental frequencies replacing reduced gain frequencies in range 36, which would be lost without the support of the dynamic harmonics in frequency range 39. The harmonics of frequencies within frequency band 36 will be created predominately above frequency band 36 where full gain will tend to be available without driving the transducer to audible overload, as frequency band 36 will tend to operate with a bandwidth of less than two-octaves, and in most embodiments, less than 1.4 octaves, and in one preferred embodiment, with approximately 1.25 octaves of bandwidth or a frequency multiplier of 2.5.

The optionally gain reduced fundamental frequencies in band 40 can also have associated harmonics generated by the dynamic harmonics generator, some of which may fall into the frequency band 36 and some above frequency band 36. As most peak program material varies in frequency and level on a moment by moment basis, it may be that the when either frequency range 36 or 40 are above the specific threshold for their frequency range and therefore gain reduced by the dynamic gain filter, the other frequency range may be below threshold, or at least have less gain reduction at the same point in time, and therefore be available for supporting harmonics generation in that range.

Related to another aspect of the loudspeaker system and signal processor, the inventor has found that for fundamental frequencies below approximately 100 Hz, if the harmonics of those fundamental frequencies are maintained, one can move the fundamental of a tone to another, nearby, frequency without substantially changing the perceived pitch. From this it was found that in the inventive loudspeaker system can benefit from moving, or transposing, at least part of the gain of a fundamental frequency of a rich harmonic tone, from a frequency range of greater diaphragm displacement to a frequency of reduced diaphragm displacement, which allows the system to maintain or increase the perceived physical bass impact when reducing the gain of a displacement vulnerable frequency range to avoid audible overload, which also allows the system to play louder overall, without an apparent loss of physical bass impact. This approach can maintain a convincing perception of fidelity, particularly if the real tones and harmonics are intact at low and average sound levels, or if harmonics are added to enhance the tonal quality when transposing the fundamental frequency to a higher or lower frequency. It may be perceptually convincing to transpose the gain of a fundamental frequency by no more than two octaves and in some examples of the loudspeaker system, by one octave or less.

Also, when transposing a gain of the physical impact fundamentals from a high displacement frequency range, such as frequency range 36, and applying or a corresponding gain to a lower displacement frequency, such as resonant chamber frequency 34, frequency range 36 can be made somewhat wider in bandwidth, to further abate overload distortion at higher levels while effectively replacing a greater amount of physical impact frequencies that are gain reduced, by transposing the frequencies of the second frequency range 36 to a low displacement frequency in the first frequency range 32, preferably the lowest displacement frequency 34a, the resonant cabinet resonance frequency $F_{CR1}$ 34.

Loudspeaker system 10b of FIG. 6 shows a second example of the loudspeaker system with low frequency signal processor 22, including resonant chamber enclosure 12a, woofer transducer 18, including a vibratile diaphragm 64. The loudspeaker system 10b further includes at least one bass-reflex resonant chamber 16, and passive acoustic mass radiator 14b, shown here as a passive diaphragm radiator, but can optionally be interchanged with an elongated vent or port, as shown in FIG. 1 as 14a. The transducer 18 is driven by amplifier 20 and connected to the input of the amplifier 20 is the multi-mode signal processor block 22, including threshold detector/activator 24, a gain filter, incorporating a dynamic narrowband filter 25, a harmonics controller, incorporating a dynamic harmonics controller generator 27, and transpositional gain controller incorporating a dynamic transpositional gain controller 29.

Figure 7:
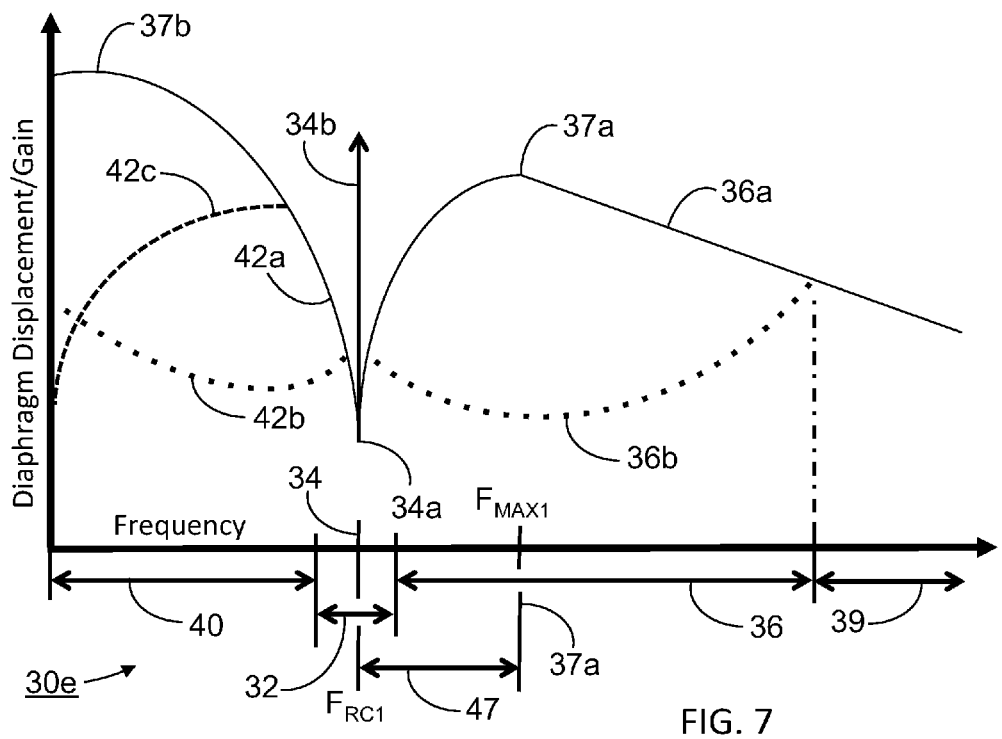
FIG. 7 is a graphic representation of the diaphragm displacement as a function of frequency of a resonant chamber loudspeaker and the dynamic transpositional gain controller.

Referring to loudspeaker system 10b in FIG. 6 and graph 30e of FIG. 7, at small signal levels, the dynamic processes of the processing block 22 will remain substantially dormant until an audio input signal, received by audio input 23, and amplified to output 21a by amplifier 20, increases to a level where an amplitude threshold is exceeded, upon which the threshold detector/activator 24 activates the dynamic narrowband filter 25 to reduce gain (as shown in curve 36b) in a second frequency range 36, which is adjacent to, and above, a first frequency range 32, which contains resonant chamber resonance tuning frequency 34. As discussed above, relative to FIG. 1, FIG. 3, FIG. 4, and FIG. 5, upon the activation of dynamic narrowband gain reduction in the designated frequency band 36, as shown in gain reduced curve 36b, the dynamic harmonics generator 27 creates harmonics in frequency range 39 creating virtual fundamental tones (shown as 72 of FIG. 4) corresponding to the fundamental frequencies being gain reduced in frequency range 36. As the gain in band 36 is reduced from starting displacement level 36a towards reduced level example curve for illustration, 36b, the harmonics of frequencies in band 36b, from an audio input signal, are generated and gain/level set to create a perceived virtual fundamental frequency gain increase in frequency range 36 that corresponds with the gain decrease of fundamental frequencies in frequency range 36, to maintain the same apparent tonal level and balance for frequency range 36 that would be experienced by a listener as having no gain reduction in frequency band 36, as illustrated in FIG. 4 with virtual fundamental 72 being created by the corresponding generated harmonics illustrated as 74a through 74d.

Upon the onset of gain reduction in frequency band 36, in addition to the activation of dynamics harmonics controller generator 27, the dynamic transpositional gain controller 29 is also activated wherein frequencies within band 36 that are gain reduced as shown in gain reduction curve 36b, have at least a portion of the magnitude of their gain reduction, transposed to a frequency at, or near, the diaphragm displacement minimum 34a resonant chamber frequency 34 within first frequency band 32 with a gain boost example 34b at the resonant chamber 16 tuning frequency 34 corresponding to the gain reduction 36b of frequencies in frequency band 36, and the harmonics generator 27 generates harmonics corresponding to the gain reduced fundamentals 36b. The transposed gain replacement of gain reduced frequencies of frequency 36 is balanced between the tonal gain increase from the dynamic harmonics generator 27, and the physical impact gain increase from transpositional gain controller, such that the perceived balance of tone and physical impact fidelity of frequency range 36 after gain reduction meets a preferred tonal and physical bass impact balance or may be comparable with the perceived fidelity below threshold levels prior to any gain reduction of frequency range 36.

Frequency range 40 may include gain reduction filters creating gain reduced curves 42b or 42c reducing gain from the non-gain reduced curve shown as 42a. The gain reduction filter in frequency range 40 may have a curve shape that is at least one of a high-pass filter and a narrowband filter, and the gain reduction filter for frequency range 40 may also have an activation type to be one of a fixed, or static, gain filter and a dynamic gain filter.

Optionally as a predetermined secondary band limited amplitude threshold is reached for frequencies in frequency range 40 creating as an illustrative example, narrowband gain reduction curve 42b or high-pass gain reduction curve 42c, those frequencies and gain corresponding to the amount of reduced gain is dynamically transposed to a frequency of the displacement reduced frequencies in the first frequency range 32, preferably to resonant chamber resonance frequency $F_{RC1}$, 34 with transposed frequency gain illustrated as 34b. A further option is to have the gain reduced frequencies 42b utilized as reference frequencies to have the harmonics generator 27 create harmonics creating virtual fundamental tones corresponding to those gain reduced fundamentals 42b. The harmonics generator may be at least one of a fixed, or static, gain harmonics generator and a dynamic gain harmonics generator. The supplemental process for the gain-reduced frequencies of the fourth frequency range 40 may be one, or both, of the harmonics generator and the transpositional gain controller. The transpositional gain controller may be one of a static transpositional gain controller and a dynamic transitional gain controller. The dynamic or static nature of the transpositional gain controller and harmonics generator may be determined by whether the operational nature of the band limited gain filter in the frequency range 40 is a dynamic or a fixed (or static) gain filter, with it being preferable for the operational aspect of the filter to match that of the harmonics generator and/or transpositional gain controller.

It may be advantageous to utilize the transpositional gain controller of one or more of the loudspeaker system examples to transpose a gain of at least a portion of a diminished amplitude level as a function of frequency that may occur at any of the low frequencies, particularly below 100 Hz, and preferably below 70 Hz, with that gain being transposed to a frequency of reduced diaphragm displacement, to augment a physical impact gain that is lost while minimizing a perception of audible overload of the loudspeaker system, with a tradeoff of overload distortion and perception of physical bass impact being balanced for best overall perceptual performance.

It is perceptually advantageous that the use of transposing the gain of bass frequencies be accompanied by an additional signal process, such as the harmonics generator, to maintain perceptually accurate tonal balance at all signal levels and to override the ear's ability to have the pitch of the transpositional frequency impact the perceived pitch over that of the gain reduced frequencies. It is also a perceptually advantageous feature that the dynamic transpositional gain controller 29 can be dynamic, meaning that it may be dormant and essentially not functional at small signal levels below the amplitude threshold levels. This can be significant with most program material, that most, or all, of the dynamic processes of the signal processing block may be inactive at small signal and/or average level program material, maintaining a low coloration, high fidelity sound quality equivalent to that of a much larger, high quality system without the present loudspeaker system and signal processor, and preferably only activating the multiple signal processing modalities at higher levels, using the interactive modes to maintain, the tonal quality and physical bass impact while being able to increase total system sound pressure levels while effectively minimizing audible overload distortion.

The psychoacoustics of the ear-brain system may establish a large portion of its judgment about a sound based on the sustained average levels, often as much, or even more than the instantaneous peak levels. By maintaining the original, non-dynamically processed audio at small signal levels, for at least a portion of the low frequency range, the loudspeaker system and signal processor may provide the perception of high fidelity sound quality with the multimodal processing being engaged mainly on greater amplitude, or, peak levels. And due to the multi-modal approach, the various aspects of the loudspeaker system and signal processor has the ability to maintain tonal quality and bass impact quality even on high dynamic range program material.

The application of taking signals from low frequency bands and transposing them to a narrow band or single frequency, may be improved with the support of at least one of a dynamic gain filter or fundamental enhancement by way of a harmonics generator over at least a portion of the low frequency range which may reduce a one note bass effect and may better maintain the tonal pitch of the original input signal from low to high signal levels.

Effective implementation of the example loudspeaker system and signal processor may be improved by having a frequency balance at small signal levels that is equalized to a preferred reference target curve for matching a reference sound quality and bandwidth, and then upon increasing level, using the interactive combination of signal processes and their match to the resonant chamber loudspeaker enclosure to substantially maintain a perception of that sound quality at large signal levels while minimizing audible overload distortion and eliminating damage to the loudspeaker.

It can be a further advantage of the embodiment illustrated in the graph 30e of FIG. 7 (as compared to embodiment illustrated in graph 30a of FIG. 3) that the diaphragm displacement sensitive frequency ranges 36 and 40 and dynamic filter gain reduction curves 36b and 42b may be even wider and deeper as transposing the gain-reduced energy to the tuning frequency is used to compensate for all gain/impact reductions, which can allow even greater perceived acoustic output without overload.

Signal processing block 22 in FIG. 1 and FIG. 6 may contain additional support processes to further enhance the primary dynamic signal processes. These may include additional fixed or dynamic gain filters or additional harmonic generators relating to any depressed amplitude frequency range. Additionally, the above mentioned processing blocks and threshold detector/activator 24 may incorporate one or more additional thresholds that may activate an overall dynamic high-pass gain filter process that may be engaged upon the audio signal levels reaching the transducer 18 driving the diaphragm 18 beyond a predetermined displacement limit to the point of being unable to be addressed by the primary processes or the audio signals being so large as to overdrive the transducer in the low displacement frequency range 32 or a range outside of that addressed by the primary processes discussed referring to FIG. 1 and FIG. 3 and FIG. 6 and FIG. 7. In the example system 10b, the feedback path 21 may be applied to provide information from amplifier output/loudspeaker input point 21a back to the threshold detector/activator 24. Alternatively a predictive model may be used that senses the input signal and includes information about a volume control setting and/or a gain profile of signal processing and the amplifier from input 23 to the amplifier output/loudspeaker input 21a.

An organization of the control blocks in the example of FIG. 6 within signal processor 22 are such that the threshold detector/activator 24 is in series with, and ahead of, the following processor blocks of, the dynamic narrowband filter 25, the dynamic harmonic controller/generator 27, and the dynamic transpositional gain controller, the three of which operating in parallel, all being activated by the threshold detector/activator 24.

Alternatively, in other example systems, all the gain blocks in signal processor 22 could operate in series or a series/parallel combination, for instance, the threshold detector/activator 24 could activate the dynamic narrowband filter 25, which could serially activate both the dynamic harmonics controller/generator 27 and the dynamic transpositional gain controller 29 (operating in parallel with each other) upon a gain reduction being activated in the dynamic narrowband filter 25.

Still referring to FIG. 7, controlling the spacing 47 between the minimum diaphragm displacement frequency 34a at fundamental resonant chamber resonance frequency $F_{RC1}$ 34, and high diaphragm displacement frequency $F_{MAX1}$ 37a can impact the selection of parameters and optimization of relationships of between the multiple signal processes of signal processor 22 to maximize system performance. It has been found by the inventor that a frequency spacing ratio $F_{SR1}$ of the maximum displacement frequency and the minimum displacement frequency spacing relationship that provides an effective configuration for the efficient functioning of the example processing, includes a frequency spacing value $F_{SR1}$ determined by the ratio formula $F_{MAX1}/F_{RC1}=F_{SR1}$, wherein the examples of the loudspeaker system with multi-mode signal processing are effective when the value of $F_{SR1}$ is between 1.2 and 2.9, and other examples of the loudspeaker system with multi-mode signal processing are effective with a value be between 1.3 and 2.6, and a range of examples of the loudspeaker system with multi-mode signal processing are effective with an $F_{SR1}$ value between 1.43 and 2.3. The more optimal spacing may provide combinations of system parameters to extend to a lower frequency capability, while allowing a reduction in enclosure volume, and still maintaining a fidelity of tonal quality and physical impact while minimizing audible overload distortion. These ratios can also apply to other examples of the loudspeaker system and signal processor besides the example of FIG. 6 and FIG. 7.

FIG. 8A represents one example of gain relationships of three dynamic processes, dynamic narrowband filter, dynamic harmonics generator, and dynamic transpositional gain controller, below, and above a level, or amplitude threshold. Graph 30f has a vertical axis representing positive and negative gain change around a reference gain at zero, and the horizontal axis may correspond to an amplitude, in this case an amplitude of the signal output at terminal 21a of the amplifier 20 which drives the diaphragm 64 displacement amplitude, within the narrowband frequency range 36 of FIG. 3 representing example system of FIG. 1, illustrated in this example for a dynamic narrowband filter and dynamic harmonics, and narrowband frequency range 36 of FIG. 7, representing example system of FIG. 6, illustrated in this example further including the dynamic transposed gain.

Again, describing the activity of the signal processor as discussed relative to previous drawings, and starting with reference to the example of the loudspeaker system and signal processor in FIG. 1 and the graph in FIG. 3, the non-linear gain of the dynamic processes are such that when the audio input signal, projected through any system equalization, signal path and amplifier gain profile are taken into account, while the loudspeaker system is operating in a smaller signal range 121, below threshold 122, the gain changes, shown in the vertical axis, of the dynamic processes are essentially dormant, or inactive.

As the threshold 122 is exceeded, with the system operating in the above-threshold operating-range 124, the threshold detector/activator 24 activates the dynamic filter gain 125, and in this example, the dynamic narrowband filter 25, activates a gain reduction that is further reduced in correspondence with further increases in a signal amplitude 120. Also, when the amplitude 120 exceeds threshold 122 into above threshold amplitude range 124, the dynamic harmonics generator 27 is activated creating harmonics in frequency range 39 to create a virtual fundamental tonal replacement gain increase 72 (shown in FIG. 4) in gain-reduced frequency range 36 corresponding inversely to the dynamic narrowband gain reduction. The activation of harmonics generation may correspond to the dynamically reduced gain 125 from the dynamic narrowband gain filter 25.

Now referring to the activity of the signal processor 22 as discussed relative to previous drawings, and starting with reference to the example of the loudspeaker system and signal processor in FIG. 6 and the graph in FIG. 7, in addition to the above description, relative to the example loudspeaker system and signal processor of FIG. 1, when the loudspeaker system is operating in the range 121 below threshold 122, the dynamic transpositional controller 29 may be essentially dormant, but, as the threshold 122 is exceeded, the dynamic transpositional gain controller 29 dynamically transposes a gain increase 127 to a minimized displacement frequency in the reduced displacement frequency range 32, corresponding to the gain reduction 125 of the dynamic narrowband filter in frequency range 36, the minimum displacement frequency preferably being that of resonant chamber resonance frequency 34.

The gain vs. amplitude graph 30f may also represent other determiners of the threshold point, such as a voice coil thermal limit, a dynamic impedance change, an amplifier overload, or a passive acoustic radiator distortion limit, or a diaphragm displacement in another frequency range, such as a limited bandwidth frequency range, with one example being that of frequency range 40. Also, the non-linear effect of a dynamic process, such as the processes remaining inactive below the threshold level, and becoming active above the threshold level, may have a linear action or inter-process relationship, when above the threshold, or may deviate from a linear change or inter-process relationship above the threshold, as the system is optimized to maximize overload protection and maintain audio fidelity.

In various examples of the loudspeaker system and signal processor the threshold may be detected by detecting an amplitude level at an output from a point after amplifier 20. Alternatively, the threshold may be predicted from an analysis of an input audio signal by way of a predictive analysis of the gain profile of the signal path from an input signal to the loudspeaker transducer input.

Figure 8B:
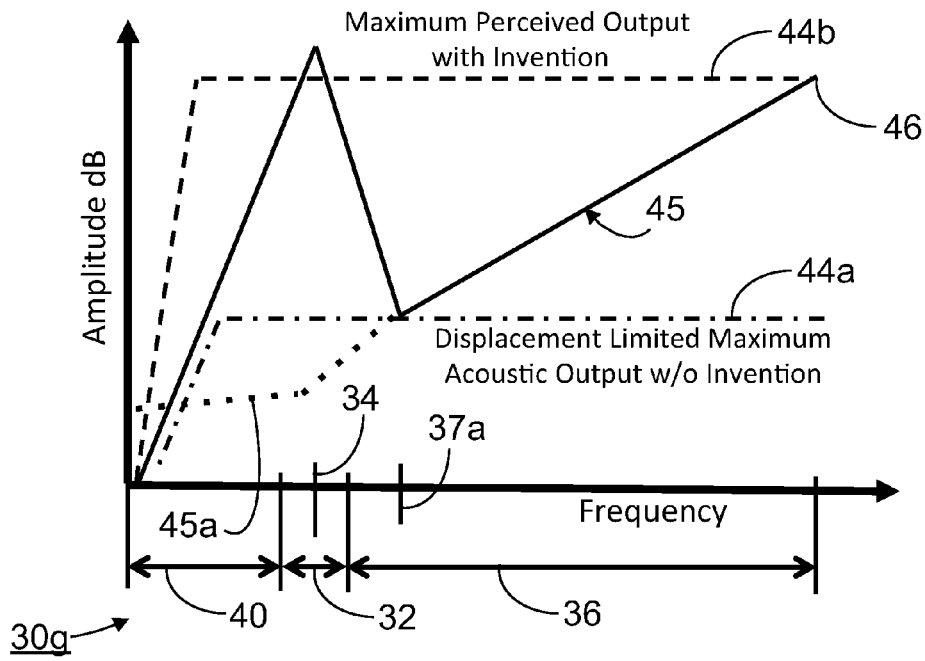
FIG. 8B is a graphic representation of displacement limited acoustic output with an example of the invention and without.

FIG. 8B shows large-signal amplitude vs. frequency graph 30g with maximum amplitude vs. frequency curve 45 representing the maximum acoustic output capability of transducer 18 in resonant chamber 16 enclosure 12a relative to distortion limited maximum linear displacement capability of diaphragm 64. As an additional point of reference, the continued decline in output at low frequencies due to distortion limited maximum displacement when, unlike the loudspeaker system and signal processor disclosed herein, an enclosure type without a resonant chamber is used, such as an acoustic suspension enclosure, is represented by dotted line 45a, which has even less bass capability than that shown in curve 44a.

It can be seen that both frequency $F_{RC1}$ 34 and the frequency 46 at the upper end of frequency band 36 are of similar amplitude and displacement. To use one example set of frequencies for illustration, the resonant chamber resonance frequency $F_{RC1}$ 34 may be at approximately 40 Hz while frequency 46 may be about 2.5 times higher, at approximately 100 Hz, with displacement vulnerable frequency $F_{MAX1}$ 37a residing at approximately 1.5 times $F_{RC1}$, or about 60 Hz. These relationships may be empirically scaled for optimization, depending on chosen enclosure and transducer parameters to optimize frequency spacings such that the multiple signal processes of signal processor 22 may interact effectively.

Because of the limited low output of the vulnerable displacement frequency 37a, within the operational passband of the loudspeaker, the maximum output of the total usable passband without audible overload can be limited to displacement limited passband curve 44a. By having the threshold detector/activator 24 triggering the dynamic narrowband filter 25 to reduce the gain in band 38 and filling in the gain-reduced fundamentals in band 38 with corresponding harmonics generated by dynamic harmonics generator 27, and maintaining full gain at tuning frequency $F_{RC1}$ 34 with the loudspeaker system and signal processor the maximum output limitation is moved up to the maximum acoustic output level 44b, which may be on the order of 6 to 12 dB greater than that of prior art systems with the displacement limited curve 44a, without the combination of the resonant chamber enclosure and signal processing of the current loudspeaker system and signal processor. This increased capability can be achieved while keeping the perceived tonal response substantially maintained with harmonics generated by the harmonics generator 27 to fill in the tonal fundamentals in band 38 and maintaining perception of physical impact of the low frequencies by maintaining substantially full gain at physical impact frequency 34, which in a one preferred embodiment frequency 34 is in a range of 15 to 50 Hz and in another embodiment it may be between 50 and 80 Hz.

This system of using a loudspeaker enclosure with a resonant chamber with the disclosed signal processing of gain reduction of the second frequency band directly adjacent, and above, the first low displacement frequency band, coordinated with production of and gain increase of a dynamic harmonics generator, is not only beneficial to small systems in enhancing their ability to emulate larger bass systems, it is also very effective at increasing the output of large bass systems configured in the same manner. In large professional sound reinforcement systems, the larger displacement second frequency range 38 with large displacement frequency 37a is the limiting factor, keeping the total system large signal levels to a maximum of displacement limited maximum acoustic output curve 44a. By applying the techniques of the present loudspeaker system and signal processor, the large low frequency systems may have their large signal capability increased towards, or up to, an output the maximum acoustic output curve line 44b, providing approximately a 6 to 12 dB of increased output, which is significant for any scale of audio system.

Figure 8C:
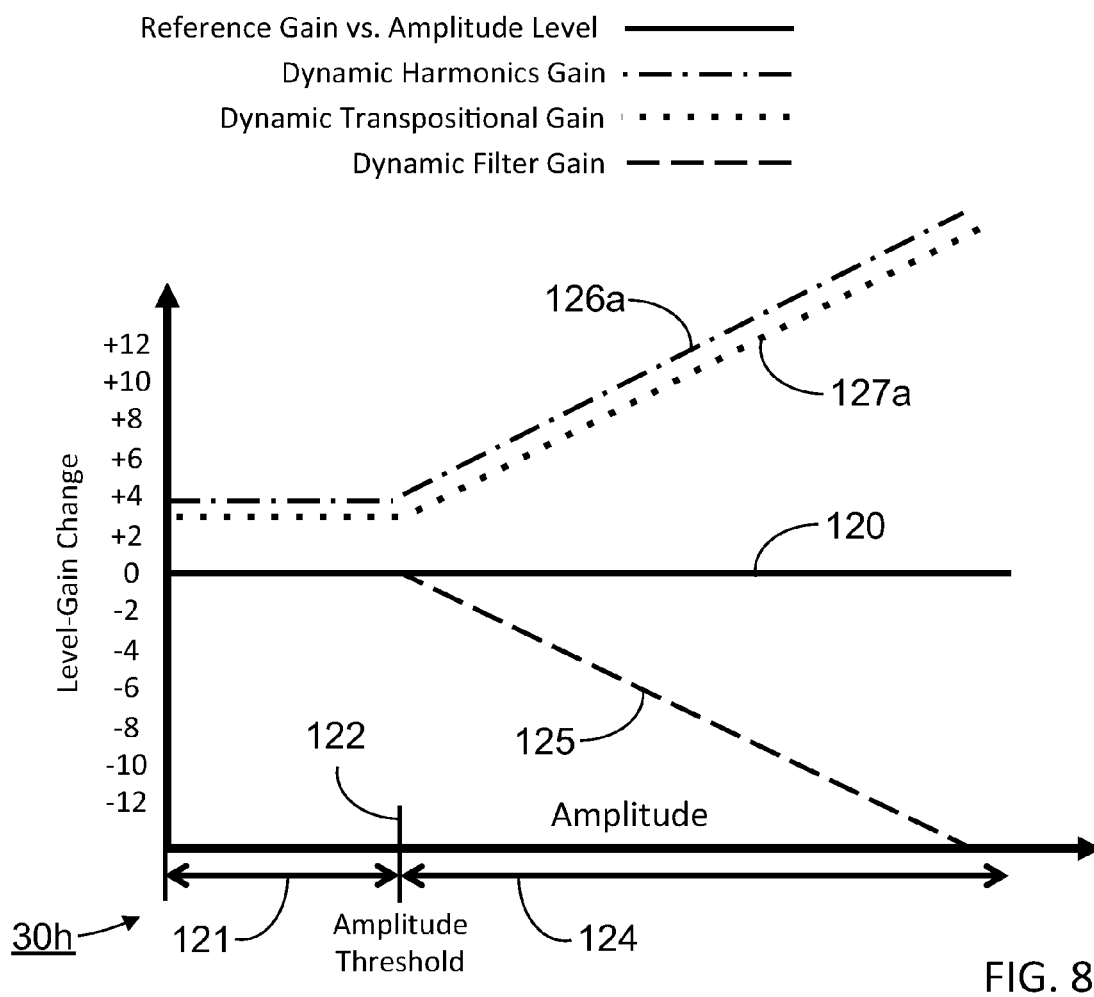
FIG. 8C is an additional example graphic representation of the dynamic filter gain, dynamic harmonics gain and a dynamic transposed frequency gain below and above threshold.

Referring to graph 30h of FIG. 8C, as compared to the graph 30f of FIG. 8A, the dynamic harmonics generator may deploy harmonics corresponding to a reduced level within a frequency range, such as frequency range 36 in FIG. 2 or FIG. 16A, wherein a starting frequency response level that has a level depression falling below the target reference small signal reference frequency response, at least within a narrow bandwidth. In this approach the harmonics generator and/or the transpositional gain controller, may have a starting positive gain offset, as shown by dynamic harmonics gain curve 126a, and dynamic transpositional gain curve 127a in graph 30h of FIG. 8C, wherein curves 126a and 127a have a positive gain offset corresponding to a reduction in level in at least a narrow frequency range of the small signal response curve. This response curve may be inherently depressed in a low frequency range, such as frequency range 36 in FIG. 2 or FIG. 16A, for a variety of reasons including being due to loudspeaker parameters that have other benefits, such as lower cost or reduced diaphragm displacement, desirable parameter tradeoffs, or greater upper range efficiency.

Figure 9:
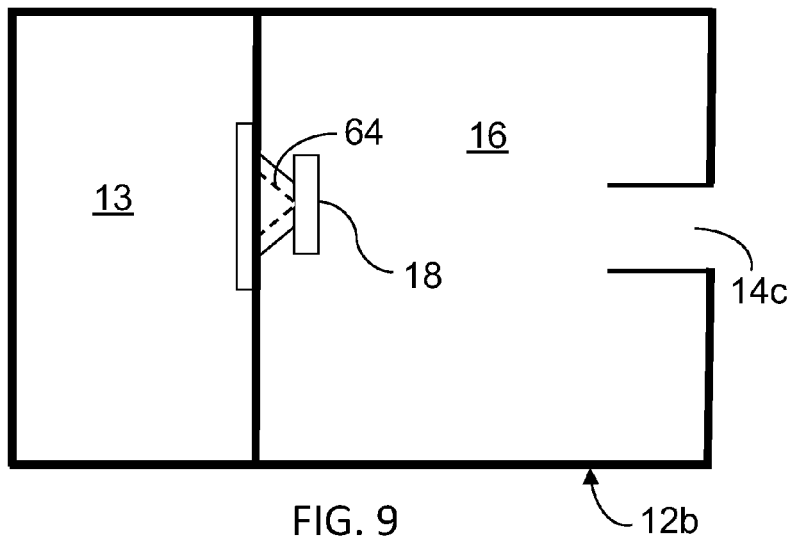
FIG. 9 is a bandpass resonant chamber loudspeaker enclosure including a bass-reflex resonant chamber and a sealed acoustic suspension chamber.
Figure 9A:
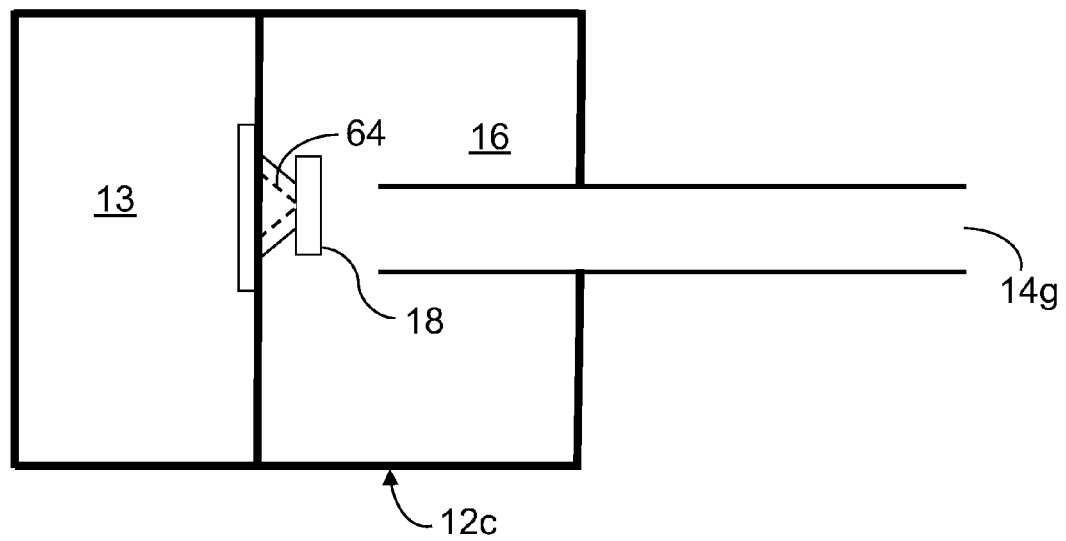
FIG. 9A is a bandpass resonant chamber loudspeaker enclosure including a bass-reflex resonant chamber and a sealed acoustic suspension chamber with an extended vent.
Figure 9B:
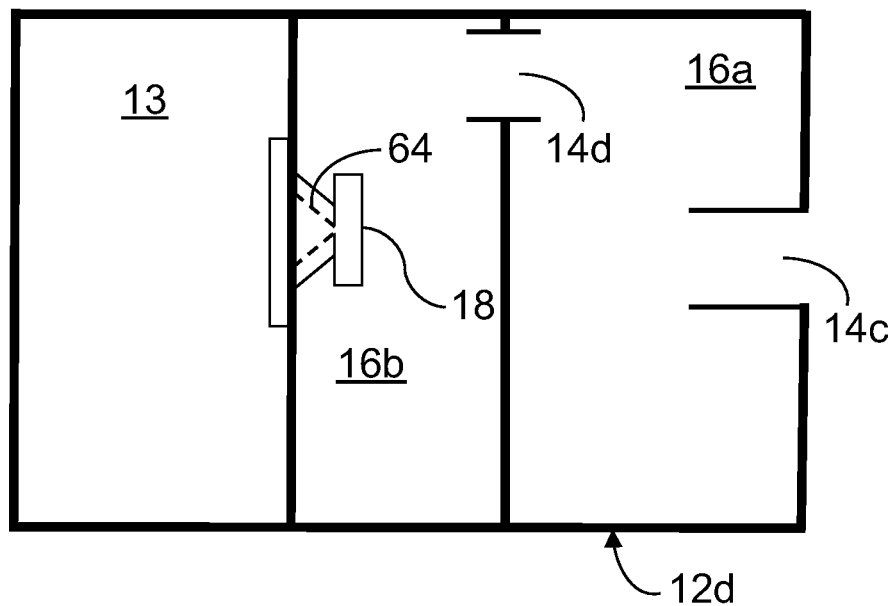
FIG. 9B is a dual tuned bandpass resonant chamber loudspeaker enclosure including two bass-reflex resonant chambers and a sealed acoustic suspension chamber.

Referring to FIGS. 9, 9A, and 9B, FIG. 9 shows another type of resonant air-chamber enclosure 12b with bass-reflex resonant chamber 16, passive acoustic mass radiator 14a (shown here as a elongated vent or port) with transducer 18, including vibratile diaphragm 64. A second sealed, acoustic suspension air chamber 13, creating a bandpass response characteristic. The passive acoustic mass radiator may be an open vent or port, or may be a passive diaphragm radiator, as shown as 14a in FIG. 6. The nature of the this enclosure type combined with the signal processing of the current loudspeaker system and signal processor can be expressed by the graph 30c of FIG. 5, where in addition to the first dynamic narrowband filter 25, with gain reduction example shown as curve 36b in secondary frequency range 36, a fourth frequency range 40 engages a second dynamic gain reduced filter curve 40e or high-pass filter gain curve 40e activity in frequency range 40. This approach is uniquely valuable to the enclosure type in FIG. 9, due to its pass-band continuing to realize efficiency and useful output well below first frequency band 32, wherein many of the other resonant chamber based enclosures of the loudspeaker system and signal processor disclosed herein, have significantly increased displacement be below tuning frequency $F_{RC1}$ 34, and the lower frequency range audible amplitude falls at a rate below frequency range 32 at a rate of approximately 18 to 24 dB per octave.

FIG. 9A shows bandpass enclosure 12c which is a variation on the enclosure of FIG. 9, with the main difference being that resonant chamber 16 can be reduced in volume and acoustical compliance in exchange for the passive acoustic radiator 14g being longer and of greater acoustic mass than the passive acoustic radiator 14c of FIG. 9. In the enclosure 12c the vent 14g may be of a length to operate also as a quarter wave-resonant air-column chamber forming an resonant chamber resonance independent of or supplemental to, the resonant chamber resonance of chamber 16, which may offer advantages particularly compatible with the resonant chamber and signal processor of the present loudspeaker system and signal processor, one of which may be more effective coupling to the transpositional gain controller transposing displacement gain to the resonant tuning frequency of enclosure 12c.

Figure 14A:
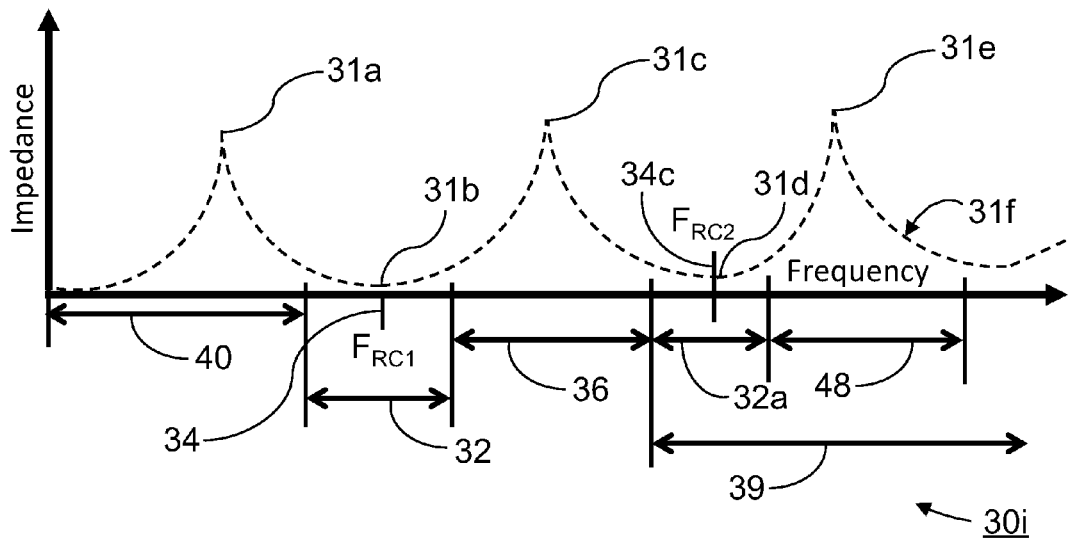
FIG. 14A is a graphic representation of impedance magnitude as a function of frequency of a multi-resonant, multi-tuned resonant chamber loudspeaker enclosure.
Figure 14B:
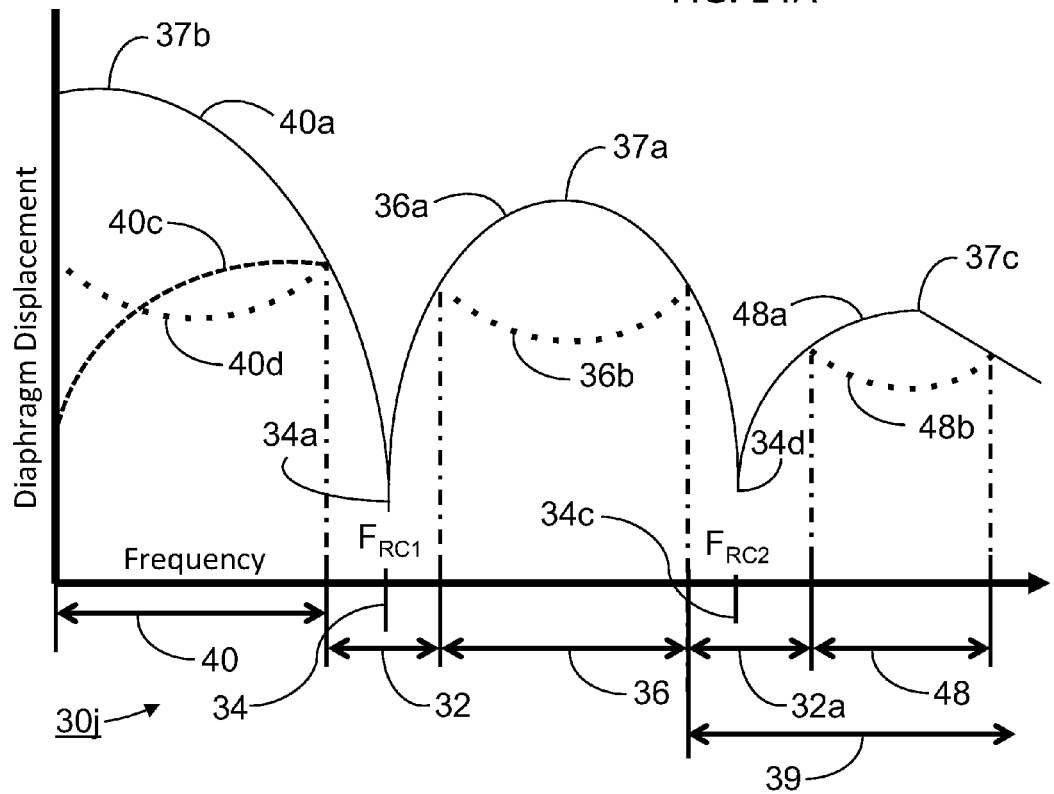
FIG. 14B is a graphic representation of the diaphragm displacement as a function of frequency of a multi-resonant, multi-tuned resonant chamber loudspeaker enclosure.

FIG. 9B shows example enclosure 12d, which is bandpass enclosure and part of a class of resonant chamber enclosures of the loudspeaker system and signal processor that incorporate more than one resonant chamber resonance frequency. Enclosure 12d is similar to that of 12c in FIG. 9, further including an additional bass-reflex resonant tuning chamber 16b and passive acoustic radiator 14d are added, which provide a second bass-reflex resonant tuning frequency. For multi-tuned resonant chamber systems, an example impedance curve graph 30i is shown in FIG. 14A and an example diaphragm displacement curve graph 30j is shown in FIG. 14B. This system also has the same feature as the enclosure of FIG. 9 of greater efficiency below the fundamental resonant chamber resonance frequency FRC1. An additional resonant chamber enclosure configuration (not shown) can be realized with the removal of sealed chamber 13, so that one surface side of the diaphragm 64 of transducer 18 radiates directly into the external environment, but the enclosure system still includes two resonant chambers 16a, 16b with two bass reflex tunings.

Figure 10:
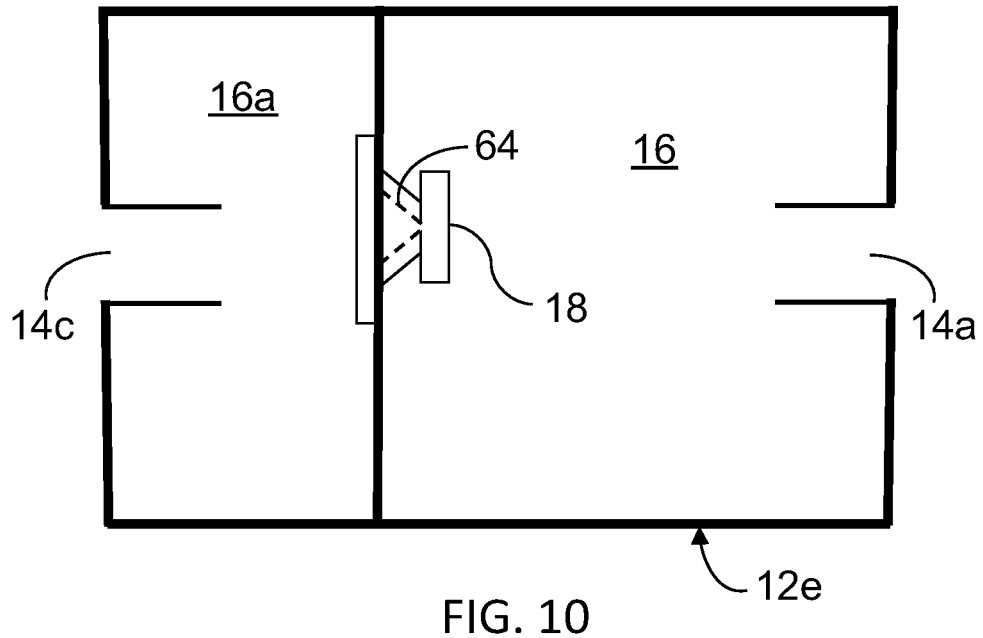
FIG. 10 is another dual tuned bandpass resonant chamber loudspeaker enclosure including two bass-reflex resonant chambers.

FIG. 10 shows resonant chamber based example enclosure 12e, with bass-reflex resonant chamber 16, passive acoustic mass radiator 14a (shown here as an elongated vent or port) with transducer 18, including vibratile diaphragm 64. Also included is a second bass-reflex resonant chamber 16a, with a passive acoustic mass radiator 14c (shown here as a vent or port) creating a dual-tuned, bandpass response characteristic.

Figure 10A:
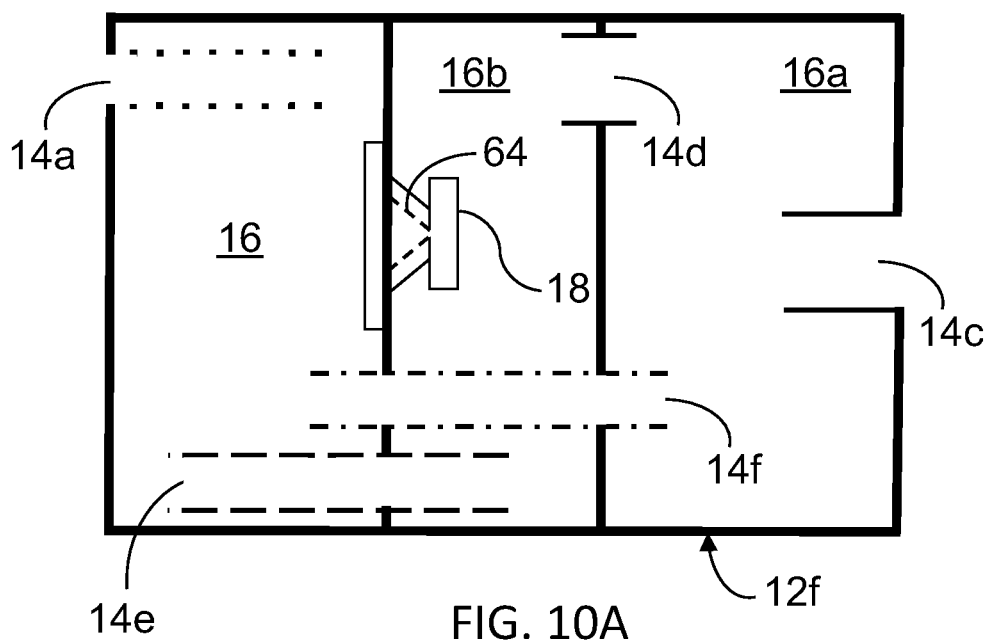
FIG. 10A is a triple tuned bandpass resonant chamber loudspeaker enclosure with three bass-reflex resonant chambers.

FIG. 10A shows example resonant chamber based enclosure 12f, configured as a bandpass enclosure with transducer 18 with diaphragm 64, with three bass reflex resonant chambers creating three tuning bass reflex tuning frequencies with resonant chambers; 16a with passive acoustic radiator 14c, and 16b with passive acoustic radiator 14d. The third bass reflex resonant chamber tuned to the lowest frequency of the three, creates a third chamber resonance with one of three possible vent/port passive acoustic radiator orientations, of 14a or 14e or 14f.

Figure 11:
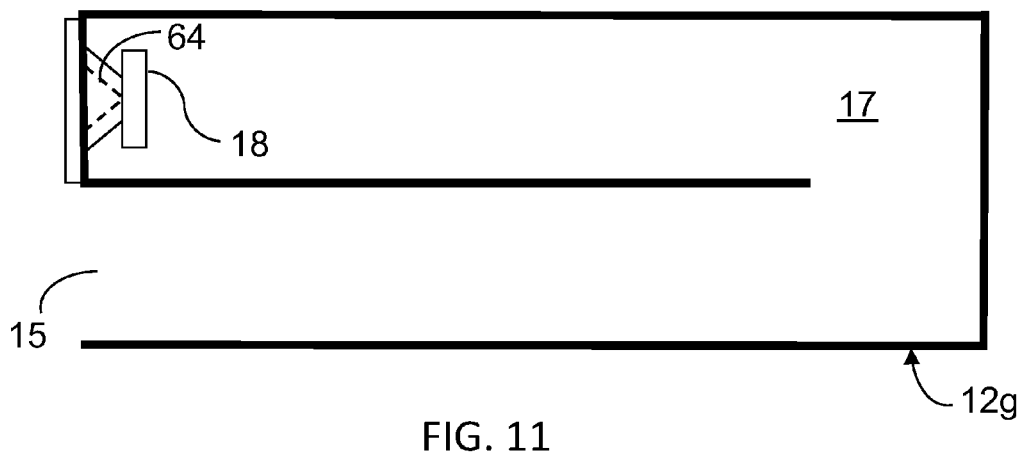
FIG. 11 is a multi-resonant chamber loudspeaker enclosure including a wave-resonant air-column chamber.

FIG. 11 shows another type of resonant chamber enclosure 12g with wave-resonant air-column 17, air-column mouth exit 15, with transducer 18, including vibratile diaphragm 64. This type of enclosure creates multiple resonant chamber wave based tunings at approximately ¼-wavelength relative to the length of air-column chamber 17, and each odd quarter wavelength thereafter. Wave-resonant air-column 17 may have a constant cross section area, or a positive taper cross section, expanding towards air-column mouth 15, or negative taper cross-section, contracting towards air-column mouth 15.

Figure 11A:
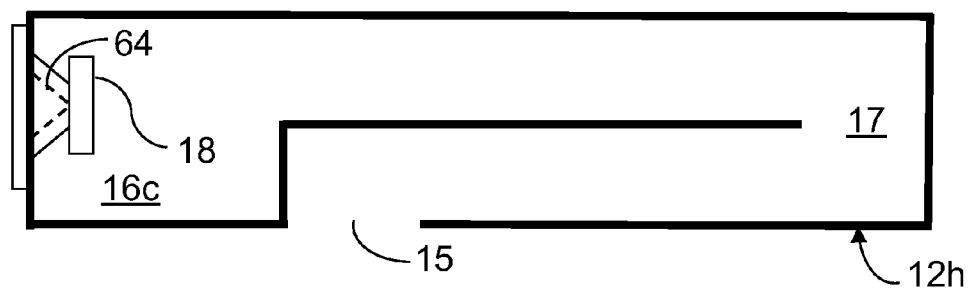
FIG. 11A is a resonant chamber loudspeaker enclosure including a bass-reflex resonant chamber coupled to a wave-resonant air-column chamber.

FIG. 11A shows example resonant chamber enclosure 12h with resonant air-column 17, air-column mouth exit 15, with transducer 18, including vibratile diaphragm 64. This type of enclosure creates multiple resonant chamber wave based tunings at approximately ¼-wavelength relative to the length of wave-resonant air-column chamber 17, and each odd quarter wavelength thereafter. Additionally, the enclosure 12h includes bass-reflex resonant coupling chamber 16c.

Figure 12:
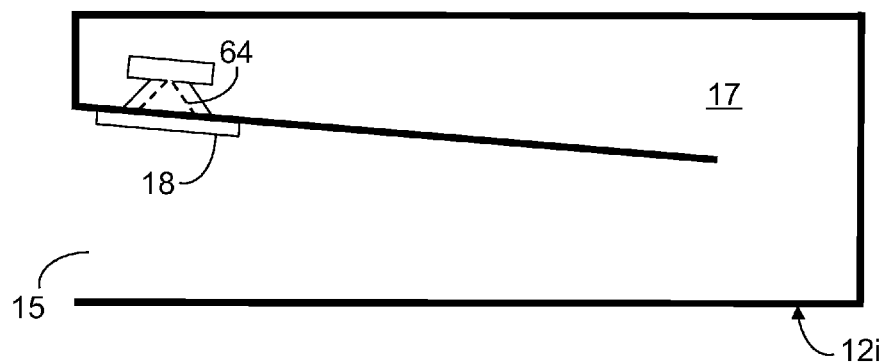
FIG. 12 is a multi-resonant regenerative wave-resonant air-column chamber loudspeaker enclosure.

FIG. 12 shows another type of resonant chamber enclosure 12i with a regenerative wave-resonant air-column 17, air-column mouth exit 15, with transducer 18, including vibratile diaphragm 64. This type of enclosure creates multiple wave-resonant tunings at approximately ¼-wavelength relative to the length of resonant air-column chamber 17, and each odd quarter wavelength thereafter, creating a tapped or regenerative wave-resonant air-column waveguide. Wave-resonant air-column 17 may be constant cross section area, or expanding towards resonant air-column mouth 15 (as shown), or contracting towards resonant air-column mouth 15.

Figure 13:
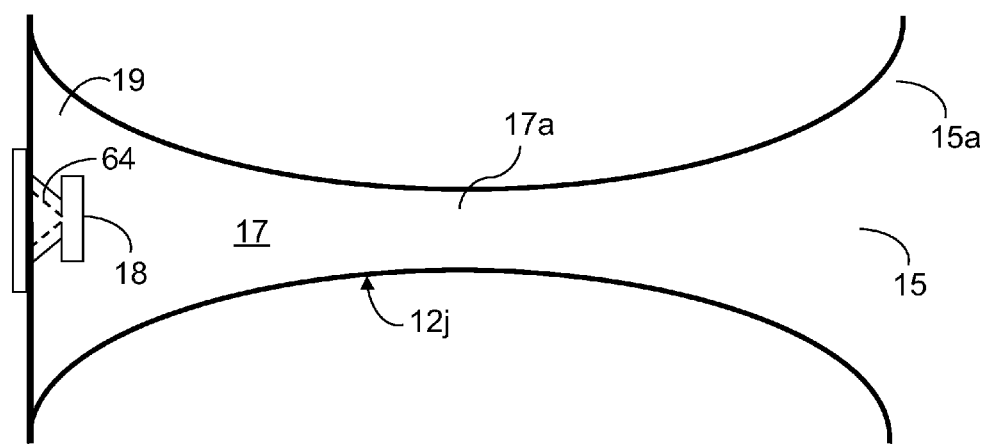
FIG. 13 is a multi-resonant dual flare wave-resonant air-column chamber loudspeaker enclosure.

FIG. 13 shows still another type of resonant chamber enclosure 12j with constricted 17a center, wave-resonant air-column 17, with mouth flare 15a at air-column mouth exit 15, and transducer 18, including vibratile diaphragm 64, coupled to flared throat 19. This type of enclosure creates multiple resonant tunings at approximately quarter-wavelength relative to the length of air-chamber 17, and each odd quarter wavelength multiple thereafter, with increased output capability at fundamental quarter-wave tuning frequency, $F_{RC1}$.

With the above enclosure type embodiment examples of resonant-chamber based enclosures of the loudspeaker system and signal processor, a preferred element is that of exhibiting at least one, fundamental, low frequency resonant chamber tuning frequency $F_{RC1}$ 34, with associated suppression of transducer diaphragm displacement, based on either a bass-reflex passive-mass/air-volume-compliance chamber resonance or a wave-resonant, air-column wavelength based resonance in an elongated waveguide, pipe, transmission-line or horn. The enclosure may further include variations including but not limited to examples of; bass reflex, Helmholtz-reflex, bandpass enclosures, each including a passive acoustic radiator, such as a vent, port, or passive acoustic diaphragm, and air-column based air chambers, including but not limited to examples of a quarter wave pipe, horn, tapped horn, inverse-horn, tapped/regenerative waveguide, Voigt pipe, or other resonant chamber systems with an associated transducer diaphragm displacement minimum, or a combination of one or more of the above enclosure types.

FIG. 14A shows graph 30i, illustrating enclosure/transducer impedance curve 31f, corresponding to multi-resonant enclosures, such as shown in FIGS. 9B, 10, 10A, 11, 11A, 12, and 13, wherein an impedance minimum 31b corresponds to a lowest, fundamental, resonant chamber resonance frequency $F_{RC1}$ 34 in first frequency range 32. Transducer resonance impedance peak 31a may be within frequency range 40 or at the lower frequency portion of frequency range 32, and transducer impedance peak 31c may fall within second frequency range 36 or may be at a somewhat higher frequency, in frequency range 39.

The next impedance minimum 31d, above impedance peak 31c, is that of a second diaphragm displacement minimum, resonance frequency 34c, $F_{RC2}$ in second reduced diaphragm displacement frequency range 32a, followed by transducer impedance peak 31e in frequency range 48 and broader frequency range 39.

Resonant chamber based loudspeakers of the loudspeaker system and signal processor, including resonant bass-reflex and wave-resonant air-columns, exhibit at least one chamber resonance causing the loudspeaker system 10 to exhibit a fundamental resonant chamber resonance frequency 34 at a low operating frequency range where the diaphragm displacement as a function of frequency is minimized as opposed to a, non-resonant chamber based enclosure, such as an acoustic suspension or open baffle for which there is no resonant chamber resonance or diaphragm displacement minimum as a function of frequency, and transducer diaphragm motion is increased for all low frequencies.

FIG. 14B is a diaphragm displacement vs. frequency chart 30j showing the displacement response shape of the first two lowest frequency resonant chamber resonance modes that corresponds to operation of multi-tuned bass-reflex, and wave-resonant air-column enclosure examples shown in FIGS. 9B, 10, 10A, 11, 11A, 12, and 13. It can be seen that there are two frequencies of diaphragm displacement minimums 34a and 34d, at resonant chamber, resonant frequency resonances of $F_{RC1}$ 34 and $F_{RC2}$ 34c. As another example approach to the loudspeaker system and signal processor, resonant chamber resonance frequencies $F_{RC1}$ 34 and/or $F_{R2}$ 34c, may be used as a dynamic transpositional target frequency and may depend on which is closest in frequency or harmonic relationship to a dynamic gain reduced frequency. This may work well particularly if the system is arranged to operate at very low frequencies, such that $F_{RC2}$ is preferably below 70 Hz and $F_{RC1}$ is at an even lower frequency. Graph 30j also shows additional increased diaphragm displacement frequency range 48 with additional displacement maximum frequency 37c and a potential additional application of dynamic narrowband gain reduction as in illustrative example curve 48b, for which in a one preferred embodiment there may also be a correspondingly generated dynamic harmonics for frequency range 48 upon dynamic gain reduction 48b and in another preferred embodiment, a transpositional gain controller may be applied to transpose an increase in gain in frequency range 32 or frequency range 32a as replacement gain for gain reduced frequencies in frequency range 48. Frequency ranges, filter gain curves, and displacement curves below frequency range 32a are essentially the same as those discussed for FIG. 5, as are the applications of the multi-modal signal processes, gain filters, harmonic generators and controllers, and transpositional gain controllers. The systems of this type of multiple resonant chamber resonance frequencies with multiple diaphragm minimum frequencies may work better for improving low frequency capability in larger systems, or systems that are operating in the lower frequency ranges, such as extending downward in frequency to include at least some portion of the frequency ranges from below approximately 20 Hz to 70 Hz, where larger cubic volume displacements may be required.

Figure 15:
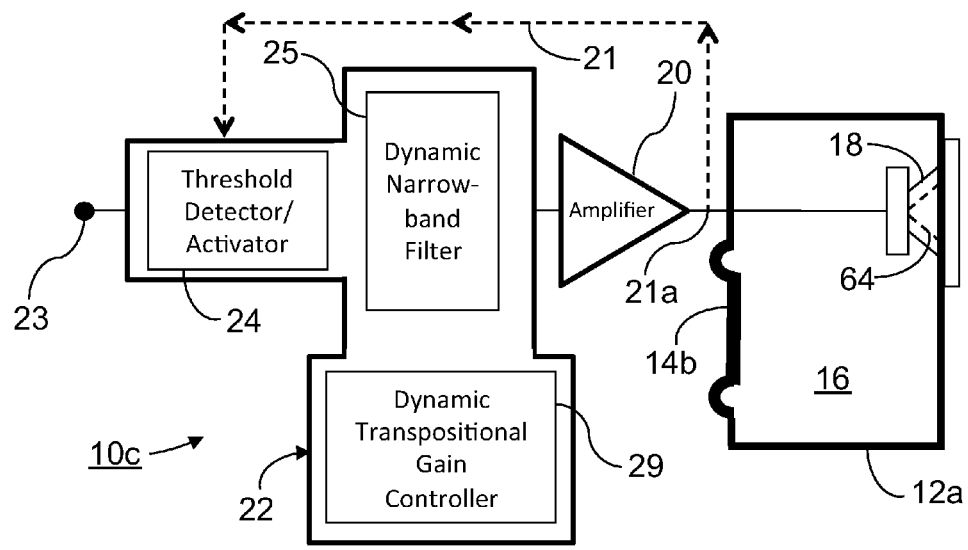
FIG. 15 is another example bass-reflex resonant chamber loudspeaker enclosure and signal processor.

Loudspeaker system 10c of FIG. 15 shows another example of the loudspeaker system and signal processor with low frequency signal processing 22, including resonant chamber enclosure 12a, woofer transducer 18, including a vibratile diaphragm 64. The loudspeaker enclosure 12a further includes at least one bass-reflex resonant chamber 16, and passive acoustic mass radiator 14b, shown here as a passive diaphragm radiator, but can optionally be interchanged with a vent or port, as shown in FIG. 1 as 14a. The transducer 18 is driven by amplifier 20 and connected to the input of the amplifier 20 is the multi-mode signal processor block 22, including threshold detector/activator 24, dynamic narrowband filter 25, and transpositional gain controller 29.

Figure 15A:
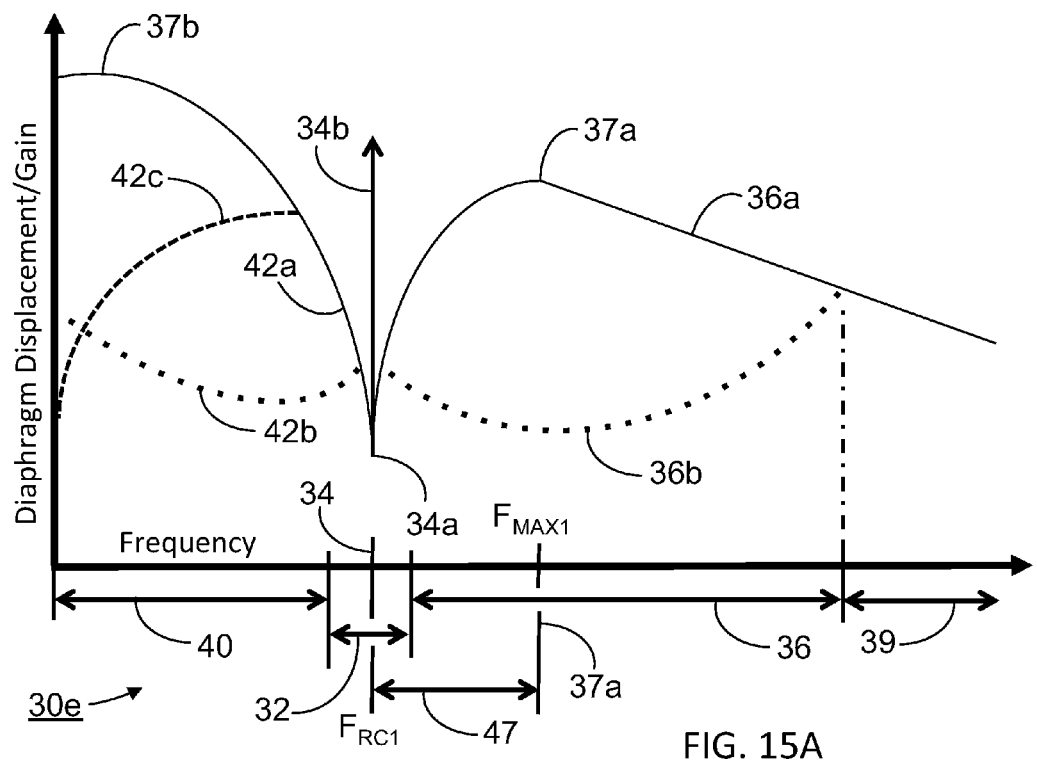
FIG. 15A is a graphic representation of the diaphragm displacement as a function of frequency of the resonant chamber loudspeaker and the dynamic transpositional gain controller of FIG. 15.

Referring to loudspeaker system 10c in FIG. 15 and graph 30e of FIG. 15A, at small signal levels, the dynamic processes of the processing block 22 may remain substantially dormant until an audio input signal, received by audio input 23, and amplified to output 21a by amplifier 20, increases to a level where an amplitude threshold is reached, upon which the threshold detector/activator 24 activates the dynamic narrowband filter 25 to reduce gain incrementally as a smooth or incremental gain change filter, or in a gain stepped manner, as a gain step gain change filter, with gain steps (as one fully gain reduced curve is represented in curve 36b) in a second frequency range 36, which is adjacent to, and above, a first frequency range 32, which contains resonant chamber resonance tuning frequency 34. There may be limited to a an asymmetrical step process with a single step to maximum gain reduction and a multiple steps of recovering gain back to zero gain reduction, or a symmetrical step process with one step between minimum and maximum gain reduction or multiple gain steps of approximately 2 to 6 dB per step of gain reduction to maximum gain reduction and multiple steps in gain recovery back to zero gain reduction in frequency range 36. The stepped and incremental approaches described above may be applied to other example dynamic processes and filters of signal processor 22.

Upon the onset of gain reduction in frequency band 36, the dynamic transpositional gain controller 29 is activated wherein frequencies within band 36 that are gain reduced as shown in gain reduction curve 36b, have at least a portion of the magnitude of their gain reduction, transposed to a frequency at, or near, the diaphragm displacement minimum 34a resonant chamber frequency 34 within first frequency band 32 with a gain boost example 34b at the resonant chamber 16 tuning frequency 34 corresponding to the gain reduction 36b of frequencies in frequency band 36. The transposed gain replacement of gain reduced frequencies of frequency 36 is balanced such that the perceived physical impact fidelity of frequency range 36 after gain reduction sustains a perception of preferred physical bass impact or may correspond to a perceived physical impact fidelity below threshold levels prior to any gain reduction of frequency range 36.

Frequency range 40 may include gain reduction filters creating gain reduced curves 42b or 42c reducing gain from the non-gain reduced curve shown as 42a. The gain reduction filter in frequency range 40 may have a curve shape that is may be one or both of a high-pass filter and a narrowband filter, and the gain reduction filter for frequency range 40 may also have an activation type to be a fixed gain filter or a dynamic gain filter. As a dynamic gain filter operating in frequency range 40, there may be an incremental gain reduction or alternatively, a stepped gain reduction, with a singular step or there may be multiple steps of approximately 2 to 6 dB per step of gain reduction in frequency range 40.

Optionally or alternatively, as a predetermined secondary band limited amplitude threshold is reached for frequencies in frequency range 40 creating as an illustrative example, narrowband gain reduction curve 42b or high-pass gain reduction curve 42c, those frequencies and gain corresponding to the amount of reduced gain is dynamically transposed to a frequency of the displacement reduced frequencies in the first frequency range 32, preferably to resonant chamber resonance frequency $F_{RC1}$, 34 with transposed frequency gain illustrated as 34b. The supplemental process for the gain-reduced frequencies of the fourth frequency range 40 may be the transpositional gain controller and the transpositional gain controller may be one of a static transpositional gain controller and a dynamic transitional gain controller. The dynamic or static nature of the transpositional gain controller may be determined by whether the operational nature of the band limited gain filter in the frequency range 40 is a dynamic or a fixed (or static) gain filter, with it being preferable for the operational aspect of the filter to match that of the transpositional gain controller in onset and release, and also to inversely match that of the transpositional gain controller in relation to a gain change in frequency range 40.

It may be advantageous to utilize the transpositional gain controller of one or more of the loudspeaker system and signal processor examples to transpose a gain of at least a portion of a diminished amplitude level as a function of frequency that may occur at any of the low frequencies, particularly below 100 Hz, and preferably below 70 Hz, with that gain being transposed to a frequency of reduced diaphragm displacement, to augment a physical impact gain that is lost while minimizing a perception of audible overload of the loudspeaker system, with a tradeoff of overload distortion and perception of physical bass impact being balanced for best overall perceptual performance.

It is perceptually advantageous that the use of transposing the gain of bass frequencies be accompanied by an additional signal process, such as the dynamic gain filter, to maintain perceptually accurate tonal balance at all signal levels and to override the ear's ability to have the pitch of the transpositional frequency impact the perceived pitch over that of the gain reduced frequencies. It also may be a perceptually advantageous feature the loudspeaker system and signal processor, that the dynamic transpositional gain controller 29 is dynamic, when used with the dynamic gain filter, meaning that it may be dormant and essentially not functional at small signal levels below the amplitude threshold levels. This can be significant with most program material, that most, or all, of the dynamic processes of the signal processing block can be inactive at small signal and/or average level program material, maintaining a low coloration, high fidelity sound quality equivalent to that of a much larger, high quality system without the present loudspeaker system and signal processor, and preferably only activating the multiple signal processing modalities at higher levels, using the interactive modes to maintain, the tonal quality and physical bass impact while being able to increase total system sound pressure levels while effectively minimizing audible overload distortion.

The psychoacoustics of the ear-brain system may establish a large portion of its judgment about a sound based on the sustained average levels, often as much, or even more than the instantaneous peak levels. By maintaining the original, non-dynamically processed audio at small signal levels, for at least a portion of the low frequency range, the present loudspeaker system and signal processor may provide the perception of very high fidelity sound quality with the multi-modal processing being engaged mainly on greater amplitude, or, peak levels. And due to the multi-modal approach, the various aspects of the loudspeaker system and signal processor provide the ability to maintain tonal quality and bass impact quality even on high dynamic range program material.

The application of taking signals from low frequency bands and transposing them to a narrow band or single frequency, may be best deployed with support of at least one additional mode of the multi-mode signal processor, such as incorporating a dynamic gain filter over at least a portion of the low frequency range to avoid the sonic effect of what is known to be experienced as "one note bass" to more effectively maintain the tonal pitch and physical impact fidelity of the original input signal at low levels or high signal levels.

Effective implementation of the loudspeaker system and signal processor may be improved by having a frequency balance at small signal levels that is equalized to a preferred reference target curve for matching a reference sound quality and bandwidth, and then upon increasing level, using the interactive combination of signal processes and their match to the resonant chamber loudspeaker enclosure to substantially maintain a perception of that sound quality at large signal levels while minimizing audible overload distortion and eliminating damage to the loudspeaker.

It can be a further advantage of the embodiment illustrated in the graph 30e of FIG. 15A (as compared to embodiment illustrated in graph 30a of FIG. 3) that the diaphragm displacement sensitive frequency ranges 36 and 40 and dynamic filter gain reduction curves 36b and 42b may be even wider (and may even extending somewhat into frequency range 39) and deeper as transposing the gain-reduced energy to the tuning frequency is used to compensate for all gain/impact reductions, which can allow even greater perceived acoustic output without overload.

As an optimizing coordination of the enclosure system 12a parameters, with the multi-modal processes of signal processor 22, the frequency range 47, representing a difference in frequency between diaphragm displacement minimum frequency 34a, of resonant chamber resonance frequency $F_{RC1}$ 34, and a maximum displacement frequency $F_{MAX1}$ 37a, it can be advantageous for the frequency spacing ratio $F_{SR1}=F_{MAX1}/F_{RC1}$ to have a value $F_{SR1}$ of between 1.2 and 2.9. It can be effective for a range of examples of the loudspeaker system with multi-mode signal processor for the frequency spacing ratio $F_{SR1}$ to be between 1.3 and 2.6, for some example systems, including some larger example enclosure systems, or fourth order Butterworth bass-reflex enclosure alignments, whereas some example systems, including the smaller system examples with low frequencies more extended for a given enclosure volume may be more advantageously optimized for maximum low frequency extension and capability and compatibility with the signal processes of signal processor 22, when the frequency spacing ratio $F_{SR1}$ is between 1.43 and 2.3. These same ratio values may also be applied advantageously to the other examples of the loudspeaker system disclosed herein.

Signal processing block 22 in FIG. 1 and FIG. 6 and other examples of the signal processing block 22 of the loudspeaker system may contain additional support processes to further enhance the primary dynamic signal processes. These may include additional fixed or dynamic gain filters or additional transpositional gain controllers relating to any depressed amplitude, or gain reduced frequency range. Additionally, the above mentioned processing blocks and threshold detector/activator 24 may incorporate one or more additional thresholds that may activate an overall dynamic high-pass gain filter process that may be engaged upon the audio signal levels reaching the transducer 18 driving the diaphragm 18 beyond a predetermined displacement limit to the point of being unable to be addressed by the primary processes or the audio signals being so large as to overdrive the transducer in the low displacement frequency range 32 or a range outside of that addressed by the primary processes discussed referring to in the examples FIG. 1 and FIG. 3 and FIG. 15 and FIG. 15A or other examples of the loudspeaker system and signal processor. If an audio input signal is so high in amplitude as it appears at the amplifier 20 output 21a that, even low displacement frequency range 32 may start to overload, an example of the loudspeaker system with processor may include a full frequency range gain reduction or additional gain reduction filtering that may be applied such that a narrowband filter, a high-pass filter, or a shelving filter may be activated for gain reduction over a frequency range that includes frequency range 32, to minimize audible overload distortion in the loudspeaker system.

In the example system 10c, the feedback path 21 may be applied to provide information from amplifier output/loudspeaker input point 21a back to the threshold detector/activator 24. Alternatively a predictive model may be used that senses the input signal and includes information about a volume control setting and/or a gain profile of signal processing and the amplifier from input 23 to the amplifier output/loudspeaker input 21a.

Figure 16:
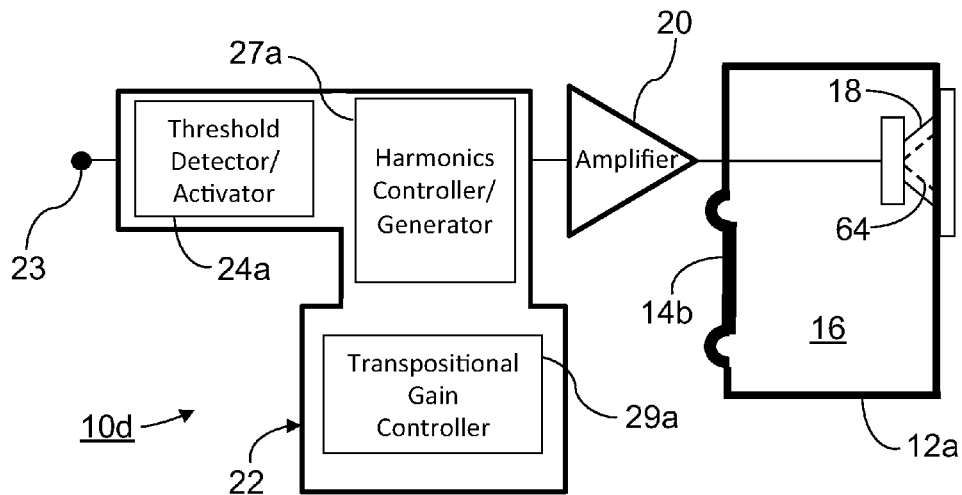
FIG. 16 is still another example bass-reflex resonant chamber loudspeaker enclosure and signal processor.

A fourth example of the loudspeaker system and low frequency signal processor 10d in FIG. 16 comprises loudspeaker enclosure system 12a including resonant chamber 16 and passive acoustic mass radiator 14b, to form a bass-reflex resonant chamber enclosure, incorporating transducer 18 with diaphragm 64. Further included is signal processor 22, including threshold detector/activator 24a, harmonics generator/controller 27a and transpositional gain controller 29a.

Figure 16A:
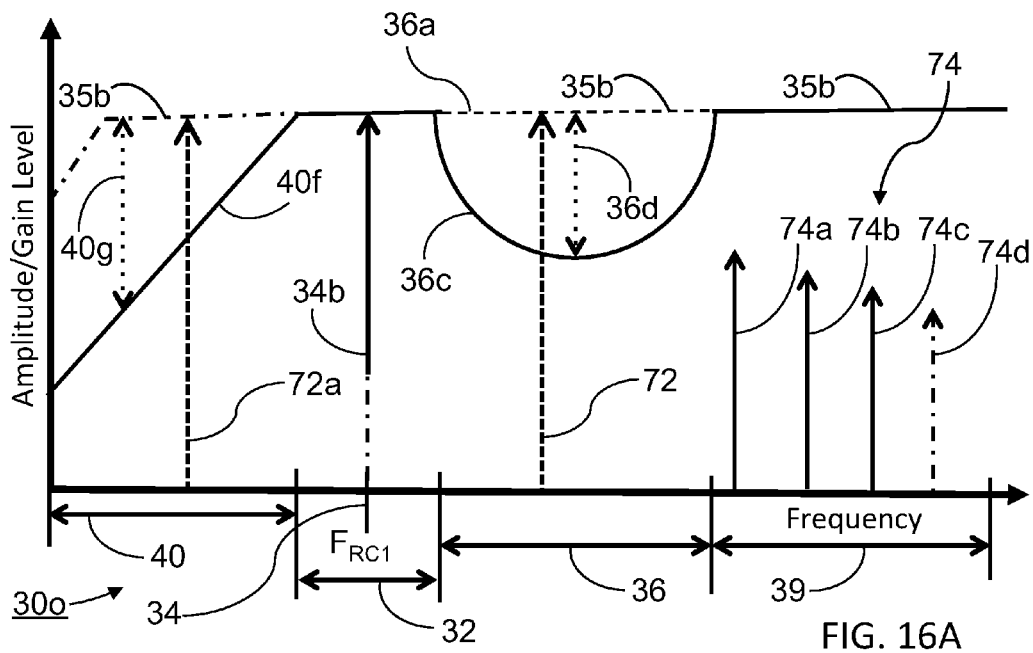
FIG. 16A is a graphic representation of the amplitude and gain level as a function of frequency of the resonant chamber loudspeaker system and signal processor of FIG. 16.

Referring to FIG. 16 and FIG. 16A, the system 10d may have a predetermined, reference target response curve 35b, but does not meet the preferred amplitude level, as shown by amplitude depression 36c, with differential amplitude loss 36d, and amplitude depression 40f, with differential amplitude loss 40g. A threshold detector/activator 24a may be utilized to detect a minimum differential amplitude loss, with an example as greater than 2 dB, and activating at least a partial corrective action from the harmonics generator and/or transpositional gain controller. Alternatively, the system may operate without a threshold detector/activator, by having these corrective actions of the harmonics generator and/or transpositional gain controller but preset at the time of system design or assembly. For amplitude depressions 40f and 36c the harmonics generator may generate harmonics 74 that correspond to at least a portion of the amplitude loss of fundamental frequencies within frequency ranges 36 and 40, creating virtual frequency gain 72 and 72a to tonally replace at least a portion of the amplitude differential losses 36d and 40g to regain a perceived tonal balance closer to that of the target reference curve level 35b. Additionally, for amplitude depressions 40f and 36c the transpositional gain controller may generate and transpose at least a portion of the amplitude differential losses 36d and 40g to a low displacement frequency range 32 and may transpose the gain to resonant chamber resonance $F_{RC1}$ 34 of that corresponds to at least a portion of the amplitude loss of fundamental frequencies within frequency ranges 36 and 40, creating physical impact transposed gain 34b to replace at least a portion of the amplitude differential losses 36d and 40g to regain a perceived physical impact balance closer to that of the target reference curve level 35b.

FIG. 16A shows gain and harmonics generation in amplitude/gain level graph 30o showing frequency range 36 and frequency range 36 being represented with level reduced frequency range example 36c. Frequency 34 shows chamber fundamental, resonant chamber resonance tuning frequency $F_{RC1}$. When frequency range 36 has reduced level 36c, as a frequency response error, or a pre-equalized setting to minimize diaphragm 64 displacement in high displacement frequency range 36, the harmonics generator produces harmonic series 74 in frequency range 39, including harmonics, 74a, 74b, 74c, (74d representing more or less included harmonics as they may be even or odd harmonics or a mix of both and may be carried up to a higher harmonic count or limited to just the lower harmonics first, second, third, and may be attenuated with each increasing harmonic number) creating perceived, virtual fundamental frequency 72 at reference target level 35b and 36a as the harmonics create a psycho-acoustic, virtual pitch 72 representation of the reduced level fundamental frequencies in curve 36c which is perceived by the listener as substantially the same tonal character and tonal level as the target amplitude level 35b in frequency range 36 and it is perceived at substantially full gain level 36a, creating a virtual fundamental 72, tonally duplicating the fundamental as if it was not level reduced. This can be applied to one or more level reduced fundamentals frequencies in the frequency range 36.

This balance of having the level reduced in frequency range 36 as a frequency response error or limitation of the loudspeaker system or to protect from audible overload distortion, and the harmonics in frequency range 39 having a corresponding gain increase to create virtual tone replacement frequencies 72 may substantially regain and maintain the perceived tonal balance of the loudspeaker system while allowing the system to operate at much greater output levels while minimizing audible overload distortion. Also, by maintaining the system gain at frequencies in frequency range 32, much of the perceived physical impact from reproduced bass frequencies is preserved such that the system minimizes overload distortion while playing louder, while sustaining tonal and physical impact fidelity.

The dynamic harmonics generator 27 may operate effectively for a given gain suppressed frequency band of two octaves or less, and in some examples when creating a virtual tonal replacement of approximately 1.5 octaves or less, and therefore the bandwidth of the dynamic narrowband filter may be effective when realizing a maximum bandwidth of two octaves, and in some examples of the loudspeaker system and signal processor, approximately 1.5 octaves or less, and to have the narrowband level reduction bandwidth 36c and the harmonics generator virtual fundamentals 72, within frequency range 36, have a bandwidth that substantially matches the level reduced bandwidth 36c. Beside the bandwidths corresponding between the narrowband level depression and the virtual tones of the harmonics generator, the level reduction of the narrowband depression and the gain increase of the generated harmonic series 74, may have a corresponding inverse gain relationship to have the tonal effect of the narrowband level reduction 36c be effectively, perceptually replaced by the perceived level of the virtual tone or tones, 72.

Figure 17:
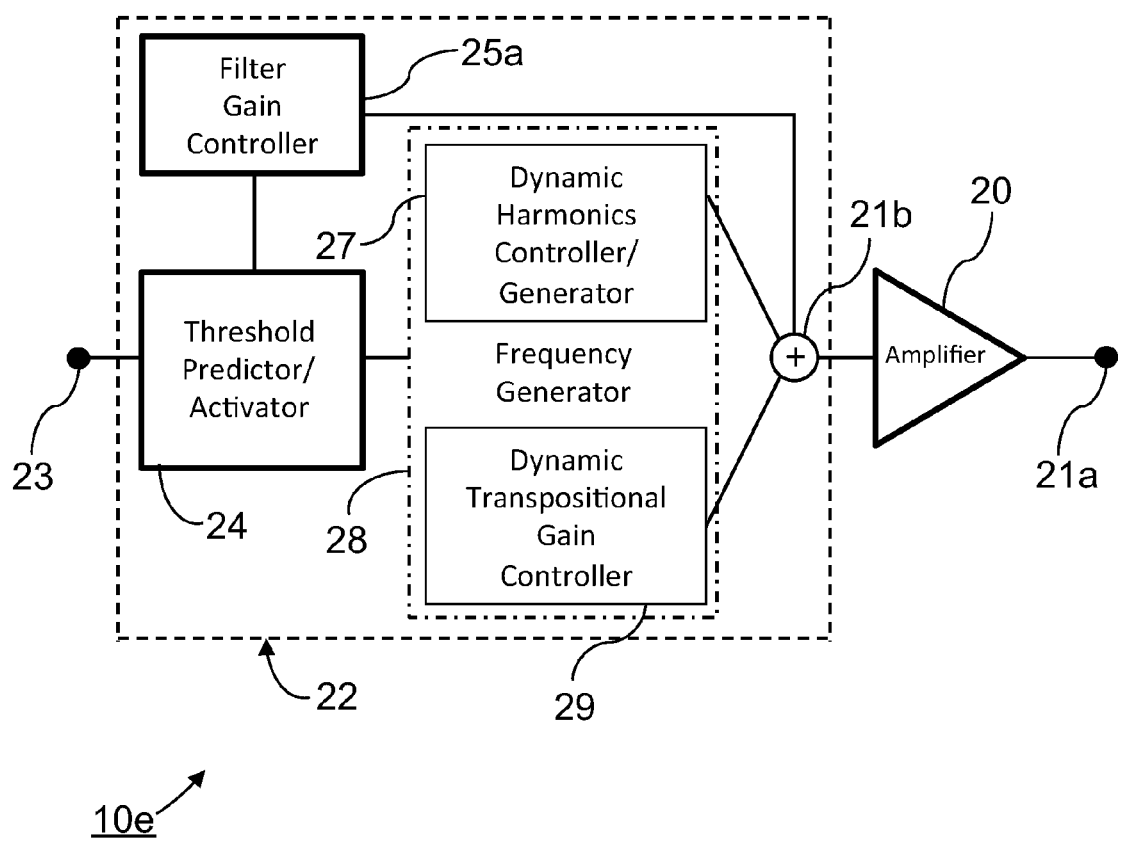
FIG. 17 is an example signal processor system.

FIG. 17 represents a fifth example 10e of the inventive loudspeaker system similar to that shown in FIG. 6 and with a variation of the signal processing blocks, filter gain controller 25a and frequency generator block 28 including dynamic harmonics generator 27 and dynamic transpositional gain controller 29. The filter gain controller 25a may include a dynamic narrowband filter 25 (as shown in FIG. 1 and FIG. 6) and may also include additional dynamic gain filters with one example of frequency curves illustrated in FIG. 5 as dynamic gain high pass example curve 40d and additional dynamic narrowband filter shown as an example curve 40e. The filter gain controller block 25a may also include a fixed target response equalization and fixed amplitude suppression filters such as example high-pass filter curve 40b or narrowband filter 40c, shown in FIG. 3, and the signal processing block 22 may also include other supporting, ancillary processes such as transpositional gain controller 29 to transpose gain from any gain reduced, increased diaphragm displacement frequency range to a reduced diaphragm displacement frequency range to maintain system performance at very high signal levels and high amplitudes in any frequency band, as disclosed for the signal processing in FIG. 1 and FIG. 6. The more generalized adaptive signal processing of this example 10e loudspeaker system processing may work effectively to maximize the performance the different versions the resonant chamber enclosures disclosed, driven from amplifier output/loudspeaker input 21a.

The frequency generator block 28 may perform as a signal generator of frequencies not appearing in the input signal and may generate either a set of harmonics for the dynamic harmonics generator 27 or operate as a signal generator to generate a signal at, at least one frequency, and provide gain control at that frequency, as the transpositional target frequency for the dynamic transpositional gain controller 29, such as resonant chamber resonance frequency 34. The dynamic gain filter system may include a dynamic narrowband filter 25 (shown in FIG. 1 and FIG. 3) frequency range illustrative example curve 36b) or a number additional or optional gain filters, such as one or more of a dynamic high pass gain filter, a fixed gain high pass filter, a fixed gain narrowband filter, additional dynamic narrowband gain filters, or other supporting filter processes. The processed signal result of the dynamic gain filter system 25a, dynamic harmonics generator 27 and the dynamic transpositional gain controller 29 may sum together at summing/mixing junction 21b. The processing block preferably engages at least a dynamic gain filter system 25a, and a dynamic harmonics generator 27 and a threshold detector/activator 24, but in some embodiments may engage at least two of a dynamic gain filter system 25a, a dynamic harmonics generator 27, a threshold detector/activator 24 and a transpositional gain controller 29. FIG. 17 shows amplifier 20 and loudspeaker enclosure 12a with resonant air-chamber 16 and transducer 18 with vibratile diaphragm 18 and passive acoustic radiator 14b, as described in FIG. 6, but any of the previously disclosed enclosure types may be substituted for that of 12a in alternative embodiments.

Figure 18:
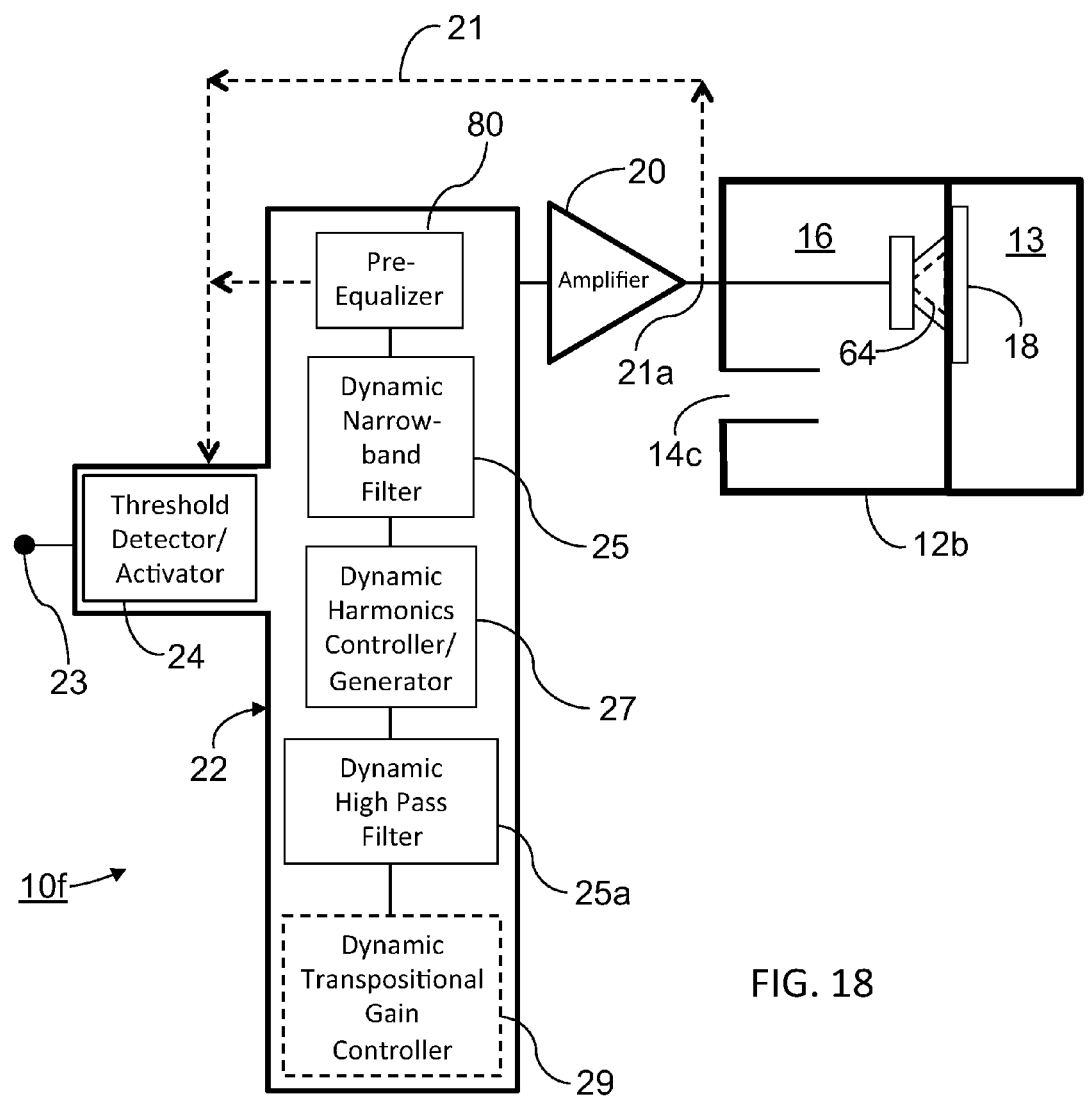
FIG. 18 is an example subwoofer enclosure system with bass-reflex resonant chamber and a sealed, acoustic suspension chamber and corresponding signal processor.

FIG. 18 represents a sixth example 10f of the loudspeaker system and signal processor, including bandpass enclosure 12b with a resonant chamber 16 with passive acoustic radiator 14c, sealed chamber 13, incorporating transducer 18 with diaphragm 64. Also included is signal processor 22 with threshold detector/activator 24, pre-equalizer 80, dynamic narrowband filter 25, dynamic harmonics controller/generator 27, dynamic high-pass filter 25a, and optional dynamic transpositional gain controller 29. Processor 22 drives amplifier 20 to output 21a, with feedback signal line 21 routing back to threshold detector/activator 24. Pre-equalizer 80 provides a small signal fixed equalization curve to match a target reference frequency response curve, for example reference target curve 35b in FIG. 2 or any preferred starting, or below threshold, amplitude curve. Pre-equalizer can be connected directly to the input 23 with a threshold detector 24 pass-through connection, such that the pre-equalized signal is what the threshold detector responds to, be it directly to the threshold detector 24, feedback optionally from pre-equalizer by way of feedback line 21 or by way of feedback line 21 feeding a pre-equalized signal from the amplifier output signal 21a back to the threshold detector/activator 24.

As the pre-equalizer 80 may operate ahead of, or feedback to, the threshold detector 24, the output of the threshold detector/activator 24 can connect serially to activate substantially simultaneously, the dynamic narrowband filter 25, dynamic high-pass filter 25a, dynamic harmonics controller/generator 27, and the optional dynamic transpositional gain controller, of which all three operate in parallel but, alternatively, in some example systems, can operate in series or in a series/parallel combination.

Referring also to graph 30e in FIG. 7, the dynamic narrowband filter 25 operates as discussed relative to the FIG. 1 and FIG. 6 systems with a predetermined amplitude threshold level activating the dynamic narrowband filter 25 reducing a narrowband gain in frequency range 36 and simultaneously applying dynamic harmonics generation in frequency range 39 to replace the narrowband gain with a corresponding virtual tone gain derived from the harmonics generated in frequency range 39. Additionally, dynamic high-pass filter 25a in response to the threshold detector/activator assessment of a diaphragm 64 displacement overload threshold being reached for the limited bandwidth frequency range 40, with representative gain reductions of the high-pass filter being represented by reduced gain curve 42c. For the gain reduced fundamental frequencies in frequency range 40 corresponding harmonic frequencies may be generated by the dynamic harmonics controller/generator 27 to create at least a partial virtual fundamental gain replacement for the gain-reduced frequencies to restore their tonal balance after gain reduction. Optionally, the dynamic transpositional gain controller 29 may produce a transposed gain 34b corresponding to at least a portion of the gain reductions 36b in frequency range 36 and 42c in frequency range 40, and transpose at least a portion of those reduced gains to generate a tonal gain at a gain reduced displacement frequency in frequency range 32, preferably at diaphragm minimum 34a at chamber resonance frequency $F_{RC1}$ 34.

Figure 19:
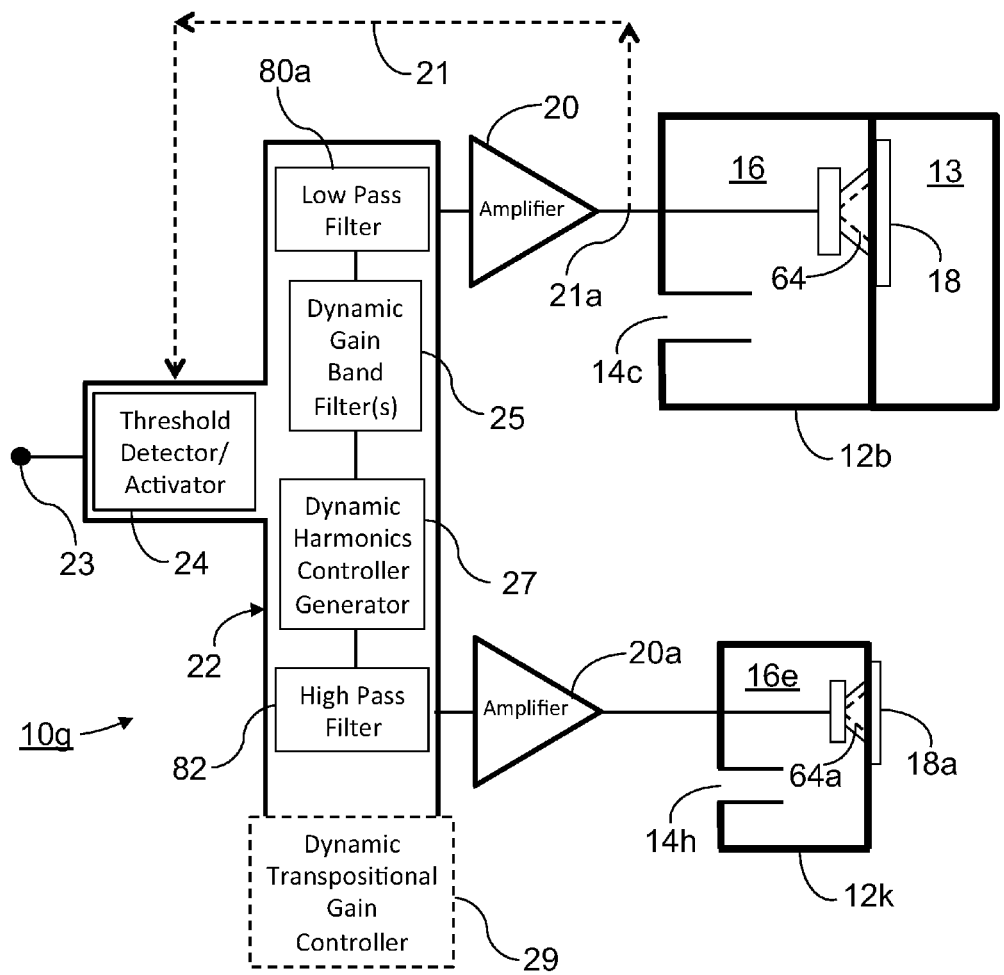
FIG. 19 is an example subwoofer enclosure and a smaller upper range loudspeaker enclosure system and signal processor.

FIG. 19 represents a seventh example 10g of the loudspeaker system and signal processor, wherein the loudspeaker system includes a low frequency woofer system enclosure 12b with transducer 18 with diaphragm 64, bass-reflex resonant chamber 16 with passive acoustic radiator 14c and sealed, acoustic suspension chamber 13. Also including in this example loudspeaker system is an upper frequency system enclosure 12k, with upper range transducer 18a including diaphragm 64a, loaded into resonant chamber 16e with passive acoustic radiator 14h. The upper frequency enclosure system may, in an alternative version, utilize a non-resonant chamber based enclosure or baffle, such as an acoustic suspension, sealed chamber enclosure, or an open baffle.

The loudspeaker system signal processor block 22 includes signal input terminal 23 adapted to receive an electrical input signal, threshold detector/activator 24, low-pass filter 80a, dynamic gain band filters 25, dynamic harmonics generator 27, high-pass filter 82, and optional dynamic transpositional gain controller 29, amplifier 20, and upper frequency amplifier 20a. The signal processing block 22 includes high pass filter 82 to create a high pass input to amplifier 20a and upper frequency range enclosure 12k to attenuate low frequencies and cross over to the lower frequency enclosure system 12b. The low pass filter has at least one function to create a low pass crossover characteristic to attenuate the upper frequencies of the lower frequency enclosure 12b to cross over in a manner that matches the upper frequency enclosure system 12k with a smooth transition. Also, feedback loop 21 may feedback displacement information from amplifier output 21a to the threshold detector/activator 24.

Figure 20:
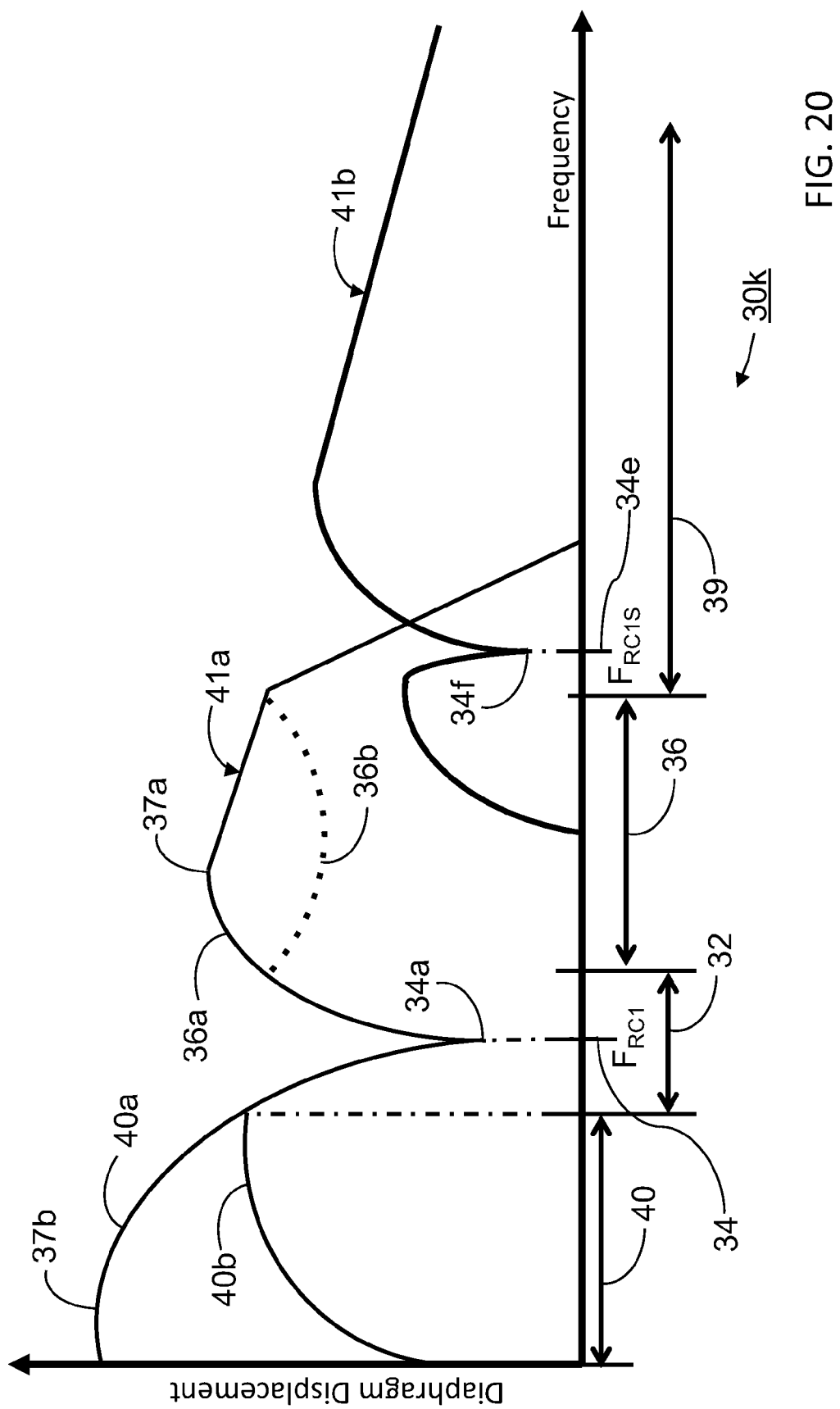
FIG. 20 is graphic representation of the diaphragm displacement of a subwoofer enclosure and a smaller upper range loudspeaker enclosure system and signal processor of FIG. 19.
Figure 21:
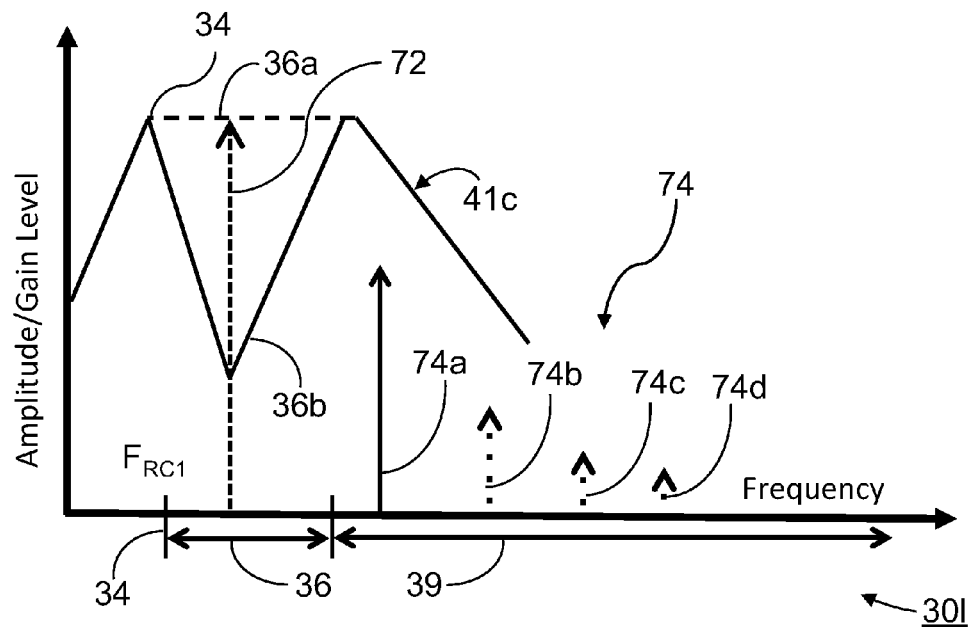
FIG. 21 is graphic representation of the dynamic harmonics generation of a bandpass subwoofer enclosure when used with a smaller upper range loudspeaker enclosure system and signal processor of FIG. 19.
Figure 22:
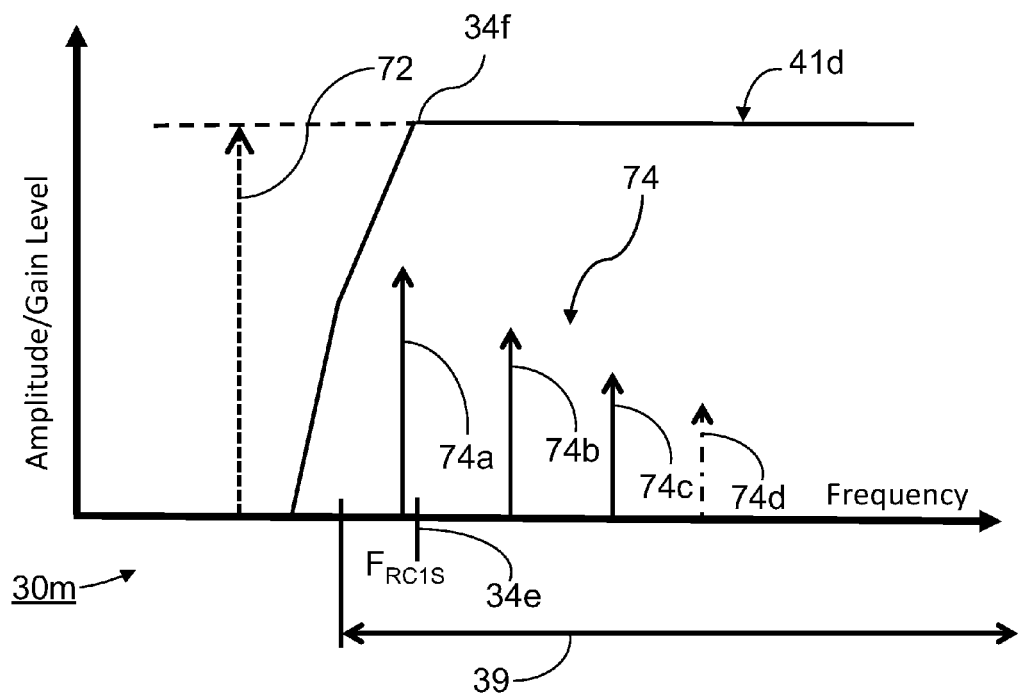
FIG. 22 is graphic representation of the dynamic harmonics generation of a smaller upper range loudspeaker when used with a bandpass subwoofer enclosure system and signal processor of FIG. 19.

Referring to example loudspeaker system 10g of FIG. 19, and also the corresponding graphs 30k in FIG. 20, 30l in FIGS. 21, and 30m in FIG. 22, it may be advantageous to utilize a second transducer or a second loudspeaker enclosure to realize the loudspeaker system and signal processor, such as when a bandpass woofer enclosure system 12b may not have the upper frequency bandwidth to produce the generated harmonics adequately to support the gain reduced frequencies, such as those in frequency range 36, or if there may be an opportunity to have the generated harmonics maintain greater dispersion by assigning at least a portion of them to smaller transducer 18a or sound source, or there may be directionality or spatial sonic imaging issues that allow the harmonics to be generated while not disturbing the spatial and tonal integrity of the total loudspeaker system. It may also be advantageous to have the harmonics appear in another diaphragm displacement reduced frequency range of another transducer or loudspeaker enclosure with an enclosure with a resonant chamber resonance, such as enclosure 12k, resonant chamber 16e with passive acoustic radiator 14h, with a diaphragm 64a displacement minimum 34d which may more easily support the increased gain applied to the generated harmonics. There may be other advantages from deployment of the generated harmonics in the operational range of a transducer 18a that is separate from the primary transducer 18, as shown in this example, enclosure 12b.

As one example, it can be seen in graph 30k of FIG. 20, that the bandwidth of diaphragm displacement curve 41a falls in amplitude with a low pass characteristic immediately above frequency range 36 which would make it difficult to provide extended harmonic support in a frequency range 39. By including an upper frequency transducer or loudspeaker enclosure system, such as 12k in FIG. 19, it can be seen in graph 30k that the diaphragm displacement curve 41b, representing the diaphragm 64a displacement of transducer 18a in the enclosure system 12k, can extend into frequency range 39 to effectively reproduce the generated harmonics from dynamic harmonics generator 25 that would desirably appear in frequency range 39 to support a gain reduced frequency curve 36b with virtual fundamental frequencies corresponding to the harmonics generated in frequency range 39 and corresponding to gain reduced frequencies in frequency range 36. In some cases the supporting, generated harmonics, may support a gain reduction frequency range 40, and at least a portion of those supporting harmonics may be placed in frequency range 39, and produced by transducer 18a in loudspeaker enclosure 12k. It can be seen that the diaphragm 64a displacement curve 41b for enclosure system 12k has a resonance frequency diaphragm displacement minimum of 34f at bass-reflex, resonant chamber resonance frequency $F_{RC1S}$ 34e.

With the system operating as with the previously described operational attributes in previous examples, such as that of FIG. 1 and FIG. 3, as a narrowband amplitude threshold is reached in frequency range 36, that contains a maximum excursion frequency $F_{MAX1}$ 37a, the gain is reduced in frequency range 36 to avoid audible overload distortion by way of gain reduced curve 36b, and at the same time the dynamic harmonics generator 27, generates harmonics in frequency range 39, corresponding to gain reduced frequencies in frequency range 36, such that virtual fundamental frequency tonal replacement gain is produced in frequency range 36.

It can be seen in curve 41c in FIG. 21 amplitude/gain level vs. frequency graph 30l, representing lower frequency enclosure system 12b of FIG. 19, that the gain is upheld at resonance frequency $F_{RC1}$ 34 and gain has been reduced in frequency range 36, as shown by curve 36b, and virtual gain replacement frequency 72 appears in frequency range 36 to replace the tonal characteristic of the gain reduced frequencies substantially back to the pre-threshold, pre-gain reduced, and desired tonal amplitude level 36a. Curve 41c in the frequency range 39 is shown to attenuate significantly in the range where the generated harmonics 74 are desirably reproduced, and those harmonics (other than possibly the first harmonic 74a) may not be developed at sufficient amplitude to create the desired level of virtual fundamental frequency 72 in frequency range 36. In amplitude/gain level vs. frequency graph 30m in FIG. 22, representing upper frequency enclosure system 12k of FIG. 19, it can be seen that amplitude curve 41d, representing the upper frequency enclosure system 12k has a full amplitude extended range through frequency range 39 to adequately reproduce the full gain of the generated harmonics 74 to create the virtual frequency 72 at the desired amplitude level to support gain reduced frequencies in frequency range 36 of enclosure 12b.

The example of the loudspeaker system and signal processor shown in FIGS. 19, 20,21, and 22 may be realized with various alternate combinations, including a separate, upper range transducer added to the primary enclosure 12b, the use of a non-resonant chamber based enclosure for the upper range enclosure system 12k, and primary lower range enclosure 12b may be of any enclosure including at least one resonant chamber that is one of a bass-reflex resonant chamber and a wave-column resonant chamber. Additionally, it is possible to realize the concept with separate upper and lower frequency transducers with a single amplifier and passive high-pass and low-pass crossover filters. Further, the transpositional gain controller 29 may be optionally added as discussed in previous examples.

Figure 23:
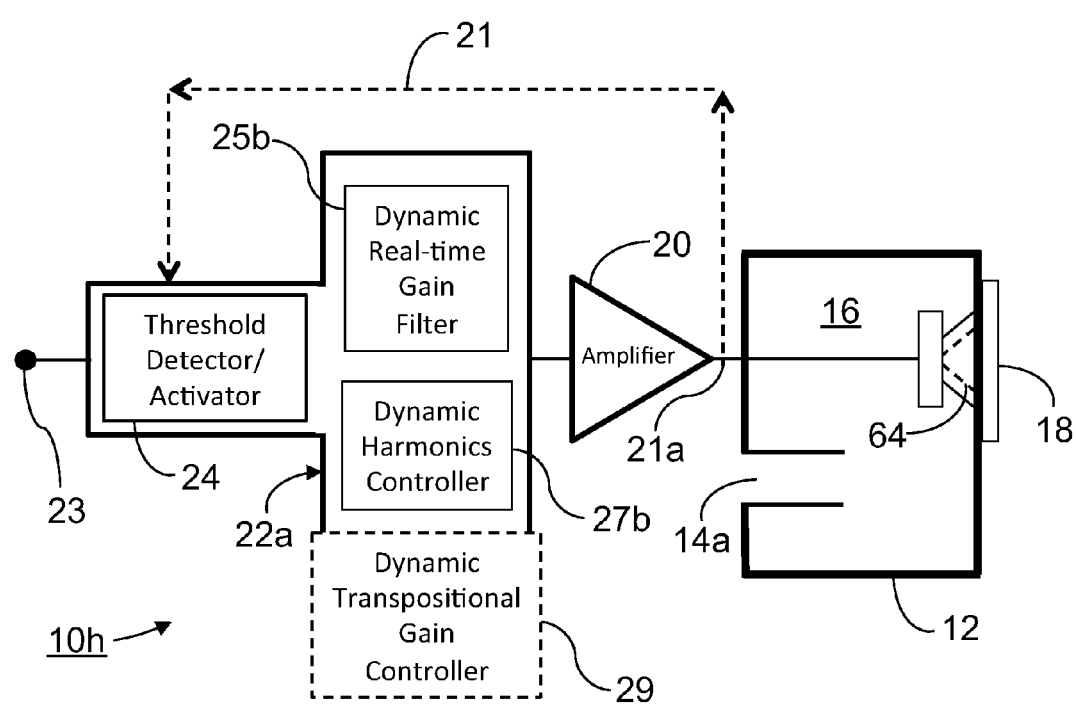
FIG. 23 is another example of the loudspeaker system with bass-reflex resonant chamber loudspeaker enclosure and a real-time example of the signal processor.

FIG. 23 represents another example 10h of the loudspeaker system and processor, wherein as a variation on the example illustrated in FIG. 1, and in other processor architecture examples of the loudspeaker system and signal processor, the dynamic narrowband filter 25 and dynamic harmonics generator 27 may operate in a manner, wherein the dynamic filter operates as a real-time dynamic filter 25b with an instantaneous gain reduction at threshold triggered by the threshold detector/activator 24 and an instantaneous gain recovery release, substantially at the audio signal rate, upon the audio signal falling in level below the threshold level, or essentially as a real-time gain control filter at the audio rate. In this fast onset/fast release approach the dynamic narrowband filter 25 of FIG. 1 may operate in the example 10h as a dynamic real-time gain filter 25b, wherein some desired harmonics, generated only by the dynamic harmonics generator 27, of FIG. 1, may be generated by the dynamic real-time gain filter 25b, so the dynamic harmonics controller 27b may shape or cancel or generate harmonics to end up with a complimentary set of harmonics that add to or cancel or shape the harmonics generated by the fast release time of the dynamic real-time gain filter 25b to have the resultant harmonic series and harmonic amplitude relationships be the desired combination to create the appropriate tonal replacement for the gain reduced fundamental frequencies in a gain reduced frequency band, such as narrowband frequency range 36 of FIG. 3. To generate the optimal harmonic series, the dynamic harmonics controller 27a may operate with the same attack and release time of the dynamic real-time gain filter 25b or with an altered attack and release time to most effectively compliment the dynamic real-time gain filter 25b. As with all forms of the harmonics generated there may be additional processing to shape and form the correct level and relationship of the harmonic series. The real-time dynamic filter and harmonics controller by having substantially instantaneous release time can shorten the time that a gain reduced frequency range will remain suppressed, which in some configurations of the loudspeaker system and signal processor may improve the perceived tonal and impact fidelity by eliminating recovery lag times. The dynamic real-time processing of dynamic gain filter, such as a dynamic narrowband gain filter or dynamic high-pass gain filter, may also include additional dynamic real-time associated processing, such as dynamic transpositional gain processing as disclosed in previous examples. The transpositional gain controller may also adopt the real-time onset and release time when used with the real-time dynamic gain filter. With the potential improvement in some examples of the loudspeaker system and processor by use of real-time processing recovery it may be important to optimize any distortion artifacts or harmonics generated by the instant recovery time, by shaping, cancelling or adding to the harmonics, to create the optimal amount of harmonics energy or a harmonic series with a similar perceptual tonal effect of harmonics generated independently by the dynamic harmonics generator/controller of the example in FIG. 1. Therefore, in an example loudspeaker and signal processor of the type shown in FIG. 23 the harmonics controller controls a real-time attack time and release time distortion and optimizes resultant harmonics and minimizes audible distortion artifacts by at least one of shaping, cancelling and adding to, a harmonic distortion produced by the real-time dynamic gain filter, in some examples of the loudspeaker system and processor, may be a dynamic narrowband filter.

As with the non-real-time dynamic gain filter examples of the loudspeaker system and signal processor, this real-time processing example may be used with the various filters contours, such as a narrowband filter, a shelving filter, or a high-pass filter, or some combination thereof, and may be used singly, for one frequency range, such as the narrowband frequency range 36, or band limited frequency range 40, or with multiple real-time processing filters working in multiple frequency ranges on the same loudspeaker system. The real-time processing 22a may also be applied to the bass reflex resonant chamber enclosure 12 as shown with bass reflex resonant chamber 16, passive acoustic radiator 14a, and transducer 18, with diaphragm 64, or with any of the enclosure systems with at least one resonant chamber resonance. Real-time processor 22a may receive a feedback signal from amplifier 20 output 21a to establish when the threshold level has been reached, or may have a predictive, feed-forward signal for determining the when the predetermined threshold level has been reached, where in the feed forward signal is the input signal calibrated by the gain profiles of the signal processor 22a and amplifier 20.

In one example loudspeaker system and signal processor, shown in FIG. 23, the operational organization of gain blocks in signal processor 22a may start with threshold detector/activator 24 operating in series with the dynamic real-time gain filter 25b, activating the dynamic real-time gain filter 25b upon the amplitude threshold being exceeded, and the dynamic harmonics controller 27b serially follows the dynamic real-time gain filter 25b to supplement, cancel, or shape distortion harmonics that are produced by the dynamic real-time gain filter 25b wherein the output of the dynamic harmonics controller 27b is directed to the amplifier 20. Optionally, the dynamic transpositional gain controller may be triggered by activation from the threshold detector/activator 24 with the dynamic transpositional gain controller output directed to the amplifier 20, in parallel with and summing together with the output of the dynamic harmonics controller 27b. Alternatively, the transpositional gain controller 29, may operate as a real-time dynamic transpositional gain controller with its real-time activation triggered by the dynamic real-time gain filter 25b with control signals in series, but with the transpositional gain controller 29 output being in parallel in one example of the loudspeaker system, and optionally in series in other examples.

Figure 24:
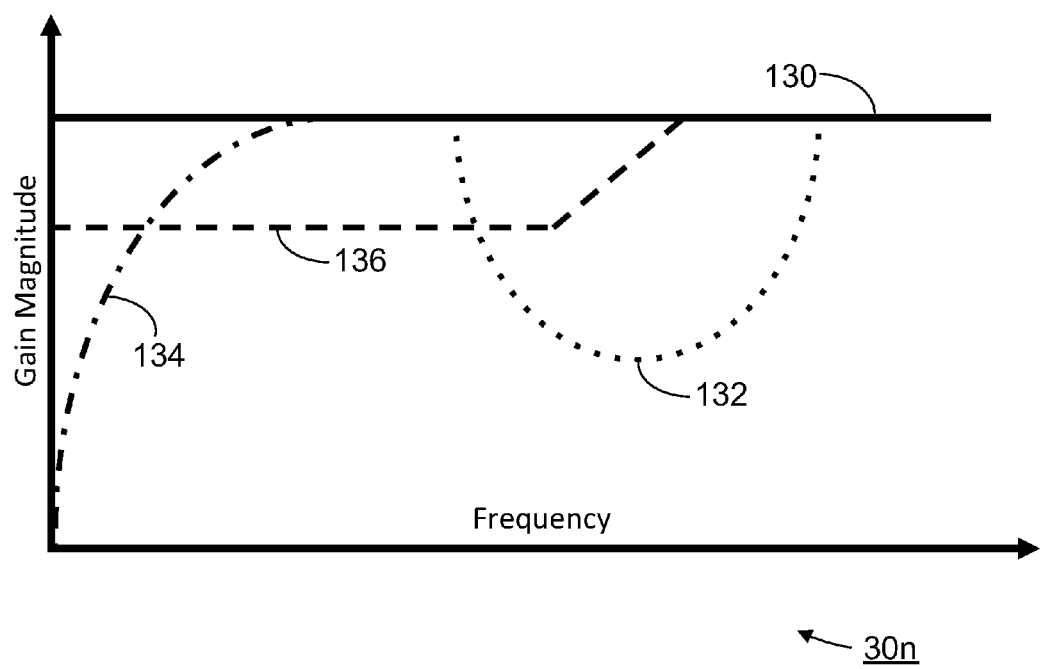
FIG. 24 is graphic representation of one set of gain filter contours for a narrowband gain filter, a high-pass gain filter and a shelf gain filter.

FIG. 24 shows gain magnitude vs. frequency graph 30n, illustrating three of the main gain filter shapes used in examples of the loudspeaker system with signal processing. Reference amplitude response curve 130 is shown without any gain filters applied. Gain filter curve 132 shows a narrowband gain filter shape, gain filter curve 134 shows a high-pass gain filter shape, and gain filter curve 136 shows a shelving gain filter shape. These filter shapes show one gain reduction curve for each filter shape, which could represent a fixed filter response, or just one gain reduction curve of a dynamic gain filter that may exhibit many different gain level curves of each of the curve shapes. These curve shapes can also be used either individually or combined to realize a more complex curve shape.

Figure 25:
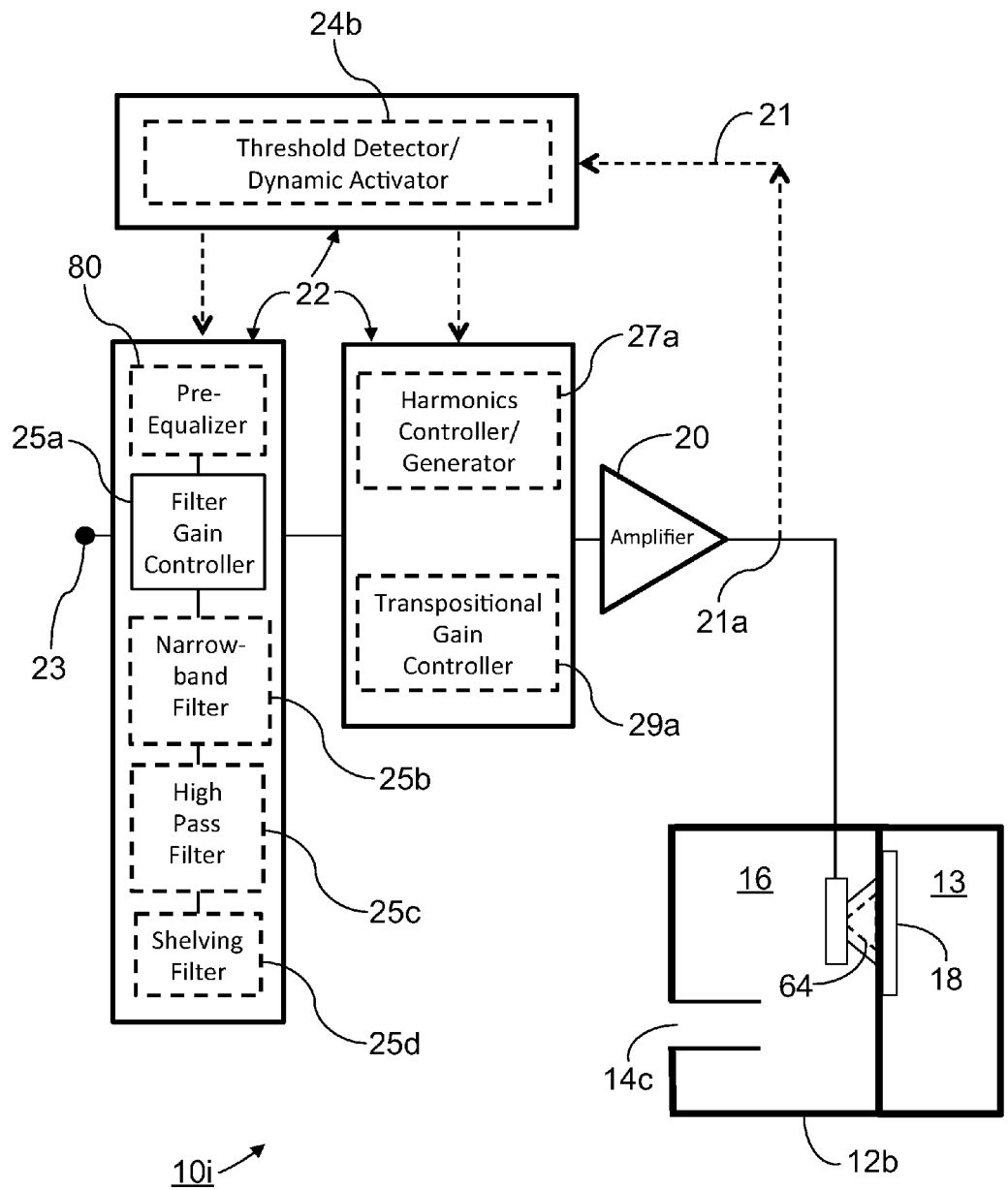
FIG. 25 is another example of the loudspeaker system and signal processor showing interactive modal processing blocks and a low frequency enclosure with a bass-reflex resonant chamber and a sealed, acoustic suspension chamber.

Referring to FIG. 25, shown is loudspeaker system 10i with a signal processor 22 for enhancing low frequency output capability showing another example of the concept disclosed in other examples herein with signal processor 22 organized to illustrate a framework of example combinations of operational signal process options that accomplish the effecting principles of the loudspeaker system with signal processor, provides a system for minimizing audible overload distortion while increasing perceived low frequency output capability. The example system is comprised of at least one loudspeaker enclosure 12b including at least one low frequency resonant chamber 16 and at least one electro-acoustical transducer 18 with a vibratile diaphragm 64 for converting an input electrical signal into a corresponding acoustic output signal. The resonant chamber 16 consists of at least one of a bass-reflex resonant chamber and a wave-resonant air-column chamber, which in this example is bass-reflex resonant chamber with vent 14c. The enclosure 12b also includes sealed, acoustic suspension chamber 13. Other example enclosures with a resonant chamber, such as disclosed herein, may be used with this example loudspeaker system. Also included is amplifier 20 and amplifier output/loudspeaker input 21a and electrical signal input 23.

Referring also to FIG. 5, the loudspeaker system has a first frequency range 32 with a reduced diaphragm displacement and a fundamental resonant chamber 16a resonance frequency $F_{RC1}$ 34 at which a displacement characteristic of the vibratile diaphragm as a function of frequency has a minimum 34a.

The example loudspeaker system 10i has a second frequency range 36 adjacent to, and higher in frequency than, the first frequency range 32, including an increased diaphragm displacement and a frequency $F_{MAX1}$ 37a at which the displacement characteristic of the vibratile diaphragm as a function of frequency, above the resonant chamber resonance frequency 34, has a maximum. The loudspeaker system 10i further has a third frequency range 39 above the frequency $F_{MAX1}$ and a fourth frequency range 40 adjacent to, and lower in frequency than, the first frequency range, including an increased diaphragm displacement and a frequency $F_{MAX2}$ 37b at which the displacement characteristic of the vibratile diaphragm as a function of frequency, below the resonant chamber resonance frequency 34, reaches a maximum.

The loudspeaker 12b and signal processor 22 includes at least one mode of the multi-mode processor 22, the mode being a filter gain controller 25a for adjusting a gain of at least one gain adjusted frequency range, the at least one gain adjusted frequency range being at least one of the second frequency range 36 and the fourth frequency range 40, wherein, each gain filter is one of a narrowband filter 25b and a high-pass filter 25c, and each gain filter is also one of a fixed gain filter and a dynamic gain filter activated by the threshold detector/dynamic activator 24b. At least one additional mode of the multi-mode signal processor 22 for providing at least a portion of a perceived replacement gain inversely corresponding to a reduced gain in the at least one gain adjusted frequency range, with the additional mode being one of a harmonics controller 27a configured for controlling harmonics to create virtual fundamental frequency gain in the at least one gain adjusted frequency range or a transpositional gain controller 29a to transpose a reduced gain from the at least one gain adjusted frequency range to an increased gain in the first frequency range.

Still further, the loudspeaker system and signal processor may include a threshold detector/dynamic activator 24b configured to detect an audio amplitude threshold corresponding to a displacement level of the transducer 18 diaphragm 64 within a gain adjusted frequency range, which may be detected by way of feedback line 21 from amplifier 20 output 21a, or it may be predicatively determined from an audio signal at input 23 based on system gain profiles, wherein, at least one gain filter is a dynamic gain filter, and, when a predetermined transducer amplitude threshold is exceeded, the dynamic gain filter is activated, and as a level of an audio input signal within the gain adjusted frequency range is increased further, the gain of the dynamic gain filter is reduced in the gain adjusted frequency range. In this example of the loudspeaker system and signal processor, optionally, the threshold detector/dynamic activator 24b upon the amplitude threshold being exceeded, can dynamically activate one or both of the narrowband filter 25b and high-pass filter 25c, which are optional portions of the filter gain controller block 25a. The threshold detector/dynamic activator 24b also may optionally dynamically activate one or both of the harmonics controller 27a and the transpositional gain controller 29a. Upon this dynamic activation, the gain filter can reduce gain in one or both of the second frequency range or the fourth frequency range to avoid an audible overload distortion and one or both of the harmonics generator and transpositional gain controller may provide at least a portion of replacement gain for any gain reduction of the frequency range 36 or frequency range 40, with the harmonics generator providing the replacement tonal gain as a virtual tonal gain derived from harmonics generated that correspond to the gain reduced fundamental frequencies in the gain reduced frequency ranges. The transpositional gain controller can replace reduced gain in the gain reduced frequency ranges by transposing at least a portion of the reduced gain as an additional gain in the displacement reduced frequency range 32, and preferably at resonance frequency and displacement minimum frequency 34/34a. The dynamic activator will reduce gain in the dynamic gain filter and the additional mode of the multi-mode processor 22 of a harmonics controller/generator 27a and/or transpositional gain controller will increase replacement gain in an inverse gain relationship to the dynamic gain filter.

As with other examples of the loudspeaker system and signal processor illustrated herein, the high excursion frequency ranges, such as frequency range 36 and frequency range 40, are reduced in level or gain by the filter gain controller 25a, such as including the introduction of including one or more optional control blocks, pre-equalizer 80, narrowband filter 25b, high pass filter 25c and shelving filter 25d to minimize audible overload distortion while additional modes of the multi-modal signal processor 22, such as harmonics controller/generator 27a and transpositional gain controller 29a are applied to substantially restore a perceived tonal and physical impact to a perceptual correspondence with a reference or target frequency response, such as 35b in FIG. 2. These processes may be made dynamic by the processing modes of a threshold detector/dynamic activator 24b to activate at least one of the filter gain controller harmonics controller/generator 27a, or transpositional gain controller 29a upon exceeding a predetermined transducer amplitude threshold. Operationally, the dynamic processing includes a substantially instant, real-time gain reduction onset time, and may have a delayed gain recovery time, or a real-time gain recovery. It may be preferred that the gain onset and recovery times of interacting processes, such as dynamic filter gain control, dynamic harmonics control and transpositional gain control, substantially match between the interacting processes so as to have a perceived tonal and physical gain replacement maintain perceptual correspondence with a predetermined reference or target frequency response curve. An additional aspect of the loudspeaker system and signal processor is to have the affect of the filter gain controller 25a gain reductions of either frequency range 36 or frequency range 40 have little impact on the frequency range 32 so as to substantially maintain the level of frequency range 32 to sustain a perceived tonal and physical impact level.

It may be aurally advantageous in some examples of the loudspeaker system and signal processor, upon invoking a harmonics controller/generator 27a to create a virtual gain in a gain reduced frequency range, or invoking the transpositional gain controller 29a to produce a replacement gain in frequency range 32 to replace a gain reduced frequency range, to also further minimize the gain in the gain reduced frequency range so as to not have the actual fundamental frequencies in the gain reduced frequency ranges perceptually interfere with the replacement gain processes. This, among a number of other interactive processes may be empirically gain balanced to create the most affective perceptual fidelity.

Additionally the loudspeaker and signal processor may be most effective when optimizing the resonant chamber enclosure alignment by incorporating a set of transducer and enclosure parameters to be configured for a resulting frequency spacing ratio $F_{SR1}=F_{MAX1}/F_{RC1}$ such that a value of $F_{SR1}$ is between 1.2 and 2.9, or between 1.3 and 2.6, or between 1.43 and 2.3.

With the examples of the loudspeaker system with signal processor disclosed and other examples of the loudspeaker system, the dynamic harmonics generator 27, and/or the dynamic transpositional gain controller 29 may be used to not only replace the tonal and impact gain of the frequencies that are gain reduced by a dynamic gain filter, such as a dynamic narrowband filter, but to also increase the gain even more on peaks, such that the dynamic range of the bass in not only effective at maintaining fidelity at large signal levels, but to go beyond that to increase the perceived dynamic range of the system, operating as a bass dynamic range expander.

The operation of each block of the signal processing block may be configured and operated in a manner known to those practiced in the signal processing art, particularly dynamic equalization, virtual bass harmonics, may be created by creating a side chain signal path and clipping the portion of the input signal appearing in that side chain for which the fundamental frequencies that are clipped, symmetrically or asymmetrically, and optimized to create even, odd, or even and odd harmonics, and to create harmonics associated with those frequencies wherein those harmonics may be shaped by a filter, as example a low pass filter. By creating a narrowband filter to capture the frequency range that is gain reduced by the dynamic narrowband filter, one may utilize the clipping of that narrowband of frequencies of the input signal to create the appropriate range of harmonics to 'recreate' the perception of the gain reduced fundamentals. The harmonics generated may preferably be the even harmonics, the odd harmonics or a mix of even and odd harmonics of the fundamental frequencies within the gain reduced range.

Referring again to FIG. 1 and FIG. 3, the dynamic narrowband filter 25 represented by the narrow gain suppression band 36 has a number of advantages when matched to the resonant air chamber loudspeaker 12.

One of the advantages of the dynamic narrowband filter may have a more flexible variety of onset/attack and decay times. The onset/attack time is substantially real-time and instantaneous and the decay or release time may be much longer, associated with a timeframe approximating the cycle time of the lowest frequency being dynamically gain adapted. An advantage of the current loudspeaker system and signal processor with its dynamic narrowband filter, at the second frequency band, as with bandwidth 36 in FIG. 3, is that the dynamic narrowband filter has a higher frequency of operation that of a dynamic equalizer broad high pass filter, and then the decay time of the invention can be substantially shorter in duration while avoiding audible pumping and distortion. Alternatively, the dynamic narrowband filter of the current loudspeaker system and signal processor can operate with substantially instantaneous, real-time attack and decay times, or effectively real-time limiting the narrowband 36 of FIG. 3, above the unclipped first band, 32 of FIG. 3.

Having the gain of the gain reduced frequencies of 36 of FIG. 3 transposed to $F_{RC1}$ 34 may be achieved by a number of means, including the use of full wave rectification to derive the absolute value of the gain reduction of the gain reduced frequencies to establish the amount of gain to transpose to $F_{RC1}$ 34 when the range 36 exceeds the threshold to activate gain reduction of frequency range 36 or frequency range 40.

In examples of the current loudspeaker system and signal processor, particularly as in first example 10a, a first harmonics generation is created on a dynamic basis, wherein at low, sub-threshold levels there are no harmonics generated and the harmonics are activated only when the signal exceeds the predetermined threshold, and then harmonics are gain increased in coordination with the gain reduction of the dynamic narrowband filter, creating a non-linear relationship with the input signal gain. This has multiple benefits over a fixed or linear harmonics generator that operates with full virtual pitch harmonics gain at all signal levels of the bass. By using a non-linear harmonics generation that only fills in for 'reduced gain fundamentals', rather than totally 'missing fundamentals', and because in one example harmonics generator of the current loudspeaker system and signal processor may be engaged fully when bass levels reach a predetermined threshold, the natural fundamentals at low or average levels may support the maintenance of a more natural, realistic perception of sound quality by requiring less harmonics generation enhancement to create the full perceived level of bass in the gain reduced frequency band, 36, as excess harmonics generation of 'missing fundamentals' can cause greater audible coloration and distortion of the sound quality.

In another preferred embodiment of the current loudspeaker system and signal processor, transposition of gain reduced frequencies to $F_{RC1}$ 34 may also be created on a dynamic basis, wherein at low levels there may be no transposition of frequencies and gain of those frequencies, and the transposition may be fully activated when the signal exceeds the predetermined threshold, and then harmonics are gain increased by the dynamic harmonics generator 27 in coordination with the gain reduction of the dynamic narrowband filter 25, creating a non-linear relationship with the input signal gain. It is important that any transposed frequency have a dynamic filter gain or harmonics generation supporting the fidelity of the transpositional gain controller and the singular transposition frequency (preferably at or near $F_{RC1}$ 34) to maintain the perception of a high fidelity tonality to the original input signal, and with frequency gaps in the sound with one frequency (transpositional frequency) may stand out and be audibly perceived as not harmonically related to the audio program signal. As the actual fundamental frequencies are transposed to a processor generated frequency $F_{RC1}$ 34 which in most of the loudspeaker system and signal processor examples isn't related to the input signal (not a frequency derived from the audio program material), dynamic gain of frequencies from the dynamic harmonics generator may be important to create a convincing harmonic structure and pitch that corresponds to the audio input signal, even if it isn't the same as the audio input signal. While the ear/brain system is less and less pitch sensitive as the frequency range falls below 100 Hz and even more so below 70 Hz. The reduced pitch sensitivity, combined with pitch enhancement from the dynamic harmonics generator may allow the loudspeaker system and signal processor to maintain an effective tonal and physical perceptual replication of a large, high output, non-signal processed system.

An additional novel aspect of the loudspeaker system and signal processor that can be incorporated is to have any one or more of the dynamic narrowband filter, dynamic harmonics generator, and transpositional gain controller have a phase lead or time delay relative to the other process or processes.

Referring to graph 30a in FIG. 3, for frequencies below first frequency range 32, at least a portion of the fundamental frequencies that are gain reduced by the fixed high pass filter, shown as an example curve 40b may have an additional harmonics generation process for creating harmonics that correspond to the gain reduced fundamentals 40b. For this additional, or fourth, frequency range 40, there may be a fixed harmonics generating process, or a dynamic harmonics generator.

It is an additional feature of the loudspeaker system and signal processor that the loudspeaker enclosure reproducing the harmonics generated by the dynamic harmonics generator 27 may be the same as the enclosure receiving the dynamic narrowband filter processing or the harmonics may be reproduced by a separate enclosure and transducer, from the same channel or from a different channel of a multichannel audio system, such as, but not limited to, a smaller upper range loudspeaker operating in a range above the lower frequency bass, woofer or subwoofer system.

The signal processes in signal processor block 22 of analog or digital hardware, or software based or some mix of one or more of the three.

Referencing FIG. 1 and FIG. 3, the current loudspeaker system and signal processor, the example includes primary system and processes wherein gain is substantially maintained in a first frequency range and the processor 22 includes a threshold detector 24, for first detecting a threshold level relative to the second frequency band 36, the dynamic narrowband filter 25 for first, upon the threshold being exceeded, reducing gain in second frequency band 36, a dynamic harmonics generator 27 for generating harmonics predominantly above frequency band 36 that correspond to gain reduced frequencies within frequency band 36, to allow total system gain to increase beyond the threshold while protecting the transducer from one of an displacement overload and a thermal overload. In addition to this primary system and process, a number of secondary complimentary attributes may be included or added in certain preferred examples of the current loudspeaker system and signal processor, including; a fixed pre-equalization to optimize the small signal starting frequency balance of the system, a gain control system operating below the first frequency range 32, in frequency range 40, including a fixed amplitude suppression curve, such as example curve high pass filter 40b or a fixed narrowband filter 40c, or a dynamic high pass equalizer with an example curve 40d in FIG. 5 or secondary dynamic narrowband (or notch) gain filter with one example curve shown as 40e in FIG. 5, a fixed or dynamic harmonics generator corresponding to fundamental frequencies in frequency band 40 or other beneficial frequency or amplitude modifications that compliment the primary system and processes.

Additionally, the dynamic gain filters may also incorporate increased gain, or gain increasing ability, in combination with gain reducing ability, to offer a bass boost or correct for an amplitude depression within the operating range of the system.

Throughout the specification, the term 'fundamental frequencies' is most often referring to frequencies that are the fundamentals in relationship to the generated harmonics, e.g. those generated harmonics are harmonics of the fundamental, wherein the fundamentals may be gain reduced, frequencies. "Fundamental" may also refer to a fundamental resonant chamber resonance frequency, being the first or lowest frequency resonance frequency of a series of resonant chamber resonance frequencies.

Referring now to FIG. 6 and FIG. 7 the dynamic transpositional gain controller 29 as one example of operation, may, for purposes of understanding, be viewed as a dynamic gain/amplitude carrier frequency, or a specific frequency gain generator, at or near resonant chamber resonance frequency $F_{RC1}$ 34 that operates at the carrier frequency rate, but adopts and accumulates corresponding gain from the gain reduced frequencies as shown in an example curve 36b of band 36 and optionally the gain reduced frequencies show as example curve 42b of band 42. In one preferred embodiment the transpositional carrier is substantially dormant at small signal levels and activated upon a predetermined threshold, and above such threshold, transpose gain reduced frequencies shown in one example curve 36b from frequency range 36 and/or gain reduced frequencies 42b from frequency range 42, while using the transpositional frequency 34 to represent the acoustic energy from the gain reduced bands and also engage the transpositional frequency, and as an option, in addition frequencies near transpositional frequency 34, as shown in first frequency band 32, to reproduce the audio input frequencies that fall into frequency band 32. Alternatively, above the predetermined threshold and all frequencies in frequency band 36 and below frequency band 36 of FIG. 7 may be transposed and gain represented by transpositional frequency 34.

As a guideline, transpositional frequency 34 may be equal to air-chamber resonant frequency $F_{RC1}$, but in practical applications, the transpositional frequency 34 may vary somewhat from air-chamber resonant frequency $F_{RC1}$, due to systems design tolerances, variation over time, drift, or a design or performance preference. This variation away from precisely $F_{RC1}$ would tend to be on the order of plus and minus less than approximately 10% frequency change from $F_{RC1}$. This would be in keeping with staying substantially centered within the frequency range 32 in FIG. 3, which is a displacement minimized frequency range.

In examples of the loudspeaker system and signal processor, the level based threshold may be most effective sensed or derived by sampling at a point in the signal path at least after a volume control and volume control setting, and preferably after an amplifier output. Alternatively the gain profiles of the electronic signal path may be known and allow a predictive threshold detector.

Referring to FIG. 1 and FIG. 3, the threshold detector/activator 24 may be based on a threshold curve that substantially corresponds to the diaphragm displacement curve, for example the graph of the diaphragm displacement curve 30a portion 36a shown in frequency band 36, with displacement maximum 37a and optionally frequency band 40 with displacement maximum 37b.

As the current loudspeaker system and signal processor reduces the gain of the higher displacement frequency bands, such as band 36 and band 40 in graph 30a in FIG. 3, and allows system gain to continue to increase at tuning frequency $F_{RC1}$ 34 and frequencies above band 36, the inventive system can provide substantially increased output capability without displacement overload of the transducer 18, eventually as the program volume is increased and gain increase at, or near, frequency $F_{RC1}$ 34 to the point where even at that displacement minimum, the displacement begins to exceed the maximum linear displacement capability of the transducer 18, a final threshold may be deployed which in addition to the narrow band gain reductions that have been imposed by the dynamic narrowband filter, an additional broader band dynamic high pass gain filter may begin to gain reduce the gain applied to the transducer 18 from a frequency as high as somewhat above frequency band 36 all the way down to the lowest frequency portion of frequency band 40, substantially keeping the transducer from being audibly overloaded. The dynamic harmonics generator 27 can be further coordinated with this broad band high pass dynamic gain filter by generating additional harmonics in the frequency range above the upper half of frequency range 36 with the generated harmonics corresponding to at least a portion of the gain reduced fundamentals being gain reduced by the dynamic high pass gain filter.

Another technology that can be effectively integrated into the examples of the loudspeaker system and signal processor, as a further enhancement, is that of a haptics or tactile transducer to further stimulating the sensation of physical bass impact. As the predetermined threshold of the threshold detector/activator 24 is exceeded, in addition to the other signal processes being engaged, as discussed above, the tactile transducer can be activated and gain increased correspondingly to the gain reduction of the dynamic gain reduction processes and the gain increase of the program material. Alternatively, a frequency of reduced level or gain reduction may have at least a portion of that level or gain transposed to a frequency of operation in a tactile transducer or haptic device, wherein those devices would be utilized to enhance a perceived physical impact.

In an example of the loudspeaker system and signal processor, it can be useful to incorporate at least a portion of or all of, the starting fixed target equalization into the dynamic gain filter, or the dynamic narrowband filter, as the target equalization established below the amplitude threshold level.

Dynamic gain filters, including the dynamic narrowband filter, may have a positive gain in there operational frequency range, such as the second frequency range or the fourth frequency range, or any dynamically gain reduced frequency range.

It contributes to perceived physical impact to maintain the gain in the gain reduced frequency range 32 above the gain reduced gain levels in a gain reduced frequency range.

Besides the application to small systems, the current loudspeaker system and signal processor can provide significant dynamic enhancement to larger-scale loudspeaker systems such as used in professional sound reinforcement systems and consumer audio systems, in that many of them are sound pressure level limited by the narrow band of frequencies such as the frequency band 36 in FIG. 3. By applying the processing and structures of the examples of the loudspeaker system with signal processing, these large scale systems can be enhanced to increase their apparent low frequency output by approximately six decibels or more, which is four times the power or more and can allow the use of half the number of bass speakers which may be very useful in providing more output from a system of reduced size and cost.

Applying the inventive loudspeaker enclosure signal processing system can be effective for, most any small or large electro-acoustic system, such as cell phones, small multimedia systems, stereo and surround sound systems, professional sound reinforcement systems, subwoofers, portable systems and most any other audio system of one or more channels, for increasing the apparent low frequency capability and dynamic range of the loudspeaker system.

In any of the example systems the signal processor 22 may be applied to further enhance the dynamic range of the low frequency system of the loudspeaker system by operating dynamically as a low frequency dynamic range expander, with non-linear expansion of low frequency signal gain.

When transpositional frequency target, the first frequency range can be as little as little as a quarter-octave or less in bandwidth. The threshold can be determined from a predictive analysis of the input signal or from a feedback signal from at least one of the output 21a of the amplifier 20, a sensor on the transducer, and a sensor at the output of the transducer. The threshold can be derived from at least one of an onset of diaphragm 64 displacement, amplifier 20 overload and/or a voice coil thermal limit.

In the example loudspeaker system and signal processing includes at least two of a gain filter, a harmonics generator, and a transpositional gain controller, wherein the gain filter is at least one of a narrowband gain filter and a high-pass filter. It is desirable that the low displacement frequency range 32 is substantially maintained at a signal level or gain level when level or gain is reduced in second frequency range 36 or fourth frequency range 40.

Some, or all, of the signal processes of signal processor 22 may be accomplished by processing with one or more of software or hardware, analog or digital circuitry. The processing may also arranged to process downloaded program material, or program material stored an online or cloud storage medium or any storage medium. At least a portion of the disclosed processing may also be applied as a preprocess to program material, and may be dedicated to a particular loudspeaker type or specification, and may be a process that program material can be uploaded to a location and processed with the inventive processing and returned to a user or distributor of the program material. Program material from any source may be processed and returned to a storage medium in processed form with at least a portion of the disclosed processing steps.

It is evident that those skilled in the art may now make numerous uses of and departures from the specific apparatus and techniques disclosed herein without departing from the inventive concepts. Consequently, the current loudspeaker system and signal processor invention is to be construed as embracing each and every novel feature and novel combination of features disclosed herein, and the examples of the present invention disclosed herein are intended to be illustrative, but not limiting, of the scope of the invention Finally, it should be noted that the language used in the specification has been principally selected for readability and instructional purposes, and may not have been selected to delineate or circumscribe the inventive subject matter. Accordingly, the disclosure of the present loudspeaker system and signal processor invention is intended to be illustrative, but not limiting, of the scope of the invention.

What is claimed is:

1. A signal processing system for controlling a lower frequency acoustic range of an acoustic output of a loudspeaker system, comprising;
    an input to receive at least a first channel audio signal corresponding to an acoustic output of at least one loudspeaker including at least one electro-acoustic transducer with a vibratile diaphragm,
    at least one transpositional gain controller processor for transposition of at least a portion of an amplitude of at least one band of frequencies in a lower frequency audio signal range of the audio signal, to an increased gain in at least one transpositional target frequency in the lower frequency audio signal range, wherein
    the transpositional gain controller processor includes at least one of at least one static transpositional gain controller and at least one dynamic transpositional gain controller.

2. The signal processing system of claim 1, wherein;
    at least a portion of the at least one band of frequencies in the acoustic output of the loudspeaker has a depressed amplitude, below a reference target curve, in the lower frequency acoustic range, wherein,
    at least a portion of the depressed amplitude is due to at least one of a gain reduction of a gain filter, an acoustic amplitude response of the at least one loudspeaker, and an acoustic environment external to the loudspeaker, and,
    the increased gain at the transpositional target frequency provides a perception of replacing at least a portion of the depressed amplitude.

3. The signal processing system of claim 1, wherein;
    at least a portion of the at least one band of frequencies in the acoustic output of the loudspeaker has a depressed amplitude, below a reference target curve, in the lower frequency acoustic range, wherein, at least a portion of the depressed amplitude is due to at least one of a gain reduction of a gain filter, an acoustic amplitude response of the at least one loudspeaker, and an acoustic environment external to the loudspeaker, and the increased gain at the transpositional target frequency provides a perception of replacing at least a portion of the depressed amplitude.

4. The signal processing system of claim 1, wherein;
at least a portion of the at least one band of frequencies in the acoustic output of the loudspeaker has a depressed amplitude, below a reference target curve, in the lower frequency acoustic range, wherein,
at least a portion of the depressed amplitude is due to at least one of a gain reduction of a gain filter, an acoustic amplitude response of the at least one loudspeaker, and an acoustic environment external to the loudspeaker, wherein,
the increased gain at the transpositional target frequency provides a perception of replacing at least a portion of the depressed amplitude,
the signal processing system further including,
at least one additional signal processor, in addition to the transpositional gain controller processor, including at least one of at least one dynamic gain filter, and at least one harmonics generator, wherein the harmonics generator is at least one of a static harmonics generator and a dynamic harmonics generator, and an increased gain of the harmonics generator provides a perception of an increased tonal gain replacing at least a portion of the depressed amplitude.

5. The signal processing system of claim 1, further including;
at least one additional signal processor, in addition to the transpositional gain controller processor, to support a preservation of a perceived fidelity of the acoustic output.

6. The signal processing system of claim 1, further including;
at least one additional signal processor, in addition to the transpositional gain controller processor, to support a preservation of a perceived fidelity of the acoustic output during the transposition.

7. The signal processing system of claim 1, further including;
at least one additional signal processor, in addition to the at least one transpositional gain controller processor, to support a preservation of a perceived fidelity of the acoustic output, wherein
the at least one additional signal processor includes at least at least one of at least one harmonics generator, at least one dynamic gain filter, and at least one time delay.

8. The signal processing system of claim 1, further including;
at least one additional signal processor, in addition to the at least one transpositional gain controller processor, to support a preservation of a perceived fidelity of the acoustic output, wherein
the at least one additional signal processor includes at least one of at least one harmonics generator, at least one dynamic a gain filter, and at least one time delay, wherein;
the harmonics generator includes at least one of a static harmonics generator and a dynamic harmonics generator, the dynamic gain filter includes at least one of a high pass filter, a band filter and a shelf filter, and,
the time delay includes a time delay of at least one of the dynamic gain filter, the harmonics generator, and the transpositional gain controller processor.

9. The signal processing system of claim 1, further including;
at least one additional signal processor in addition to the at least one transpositional gain controller processor, wherein
the at least one additional signal processor includes a static harmonics generator processor to generate harmonics of at least a portion of the frequencies in the at least one band of frequencies, wherein,
the at least one transpositional gain controller processor includes a static transpositional gain controller.

10. The signal processing system of claim 1, further including;
at least one additional signal processor in addition to the at least one transpositional gain controller processor, wherein
the at least one additional signal processor includes a harmonics generator processor to generate harmonics of at least a portion of the frequencies in the at least one band of frequencies, wherein,
the harmonics generator processor includes at least one of a static harmonics generator and a dynamic harmonics generator with a threshold detector including at least one amplitude threshold.

11. The signal processing system of claim 1, further including;
at least one threshold detector, each including at least one amplitude threshold,
at least one additional signal processor in addition to the at least one transpositional gain controller processor, wherein
the at least one additional signal processor includes at least one dynamic gain filter, wherein
the transpositional gain controller processor includes the dynamic transpositional gain controller, wherein
at least one of the dynamic gain filter and the dynamic transpositional gain controller is responsive to the at least one amplitude threshold.

12. The signal processing system of claim 1, further including;
at least one threshold detector each including at least one amplitude threshold,
at least one additional signal processor in addition to the at least one transpositional gain controller processor, wherein
the at least one additional signal processor includes at least one of a dynamic gain filter for dynamically adjusting a gain and at least one of a dynamic harmonics generator for generating harmonics, of at least a portion of the frequencies of the at least one band of frequencies,
the transpositional gain controller processor includes the dynamic transpositional gain controller, and
at least one of the dynamic gain filter, the dynamic harmonics generator and the dynamic transpositional gain controller is responsive to the at least one amplitude threshold.

13. The signal processing system of claim 1, further including;
a non-linear gain processor to provide a non-linear expansion of a signal gain to at least a portion of the audio signal in the lower frequency audio signal range.

14. The signal processing system of claim 1, further including;
  at least one additional signal processor in addition to the at least one transpositional gain controller processor, wherein the at least one additional signal processor includes;
  at least one dynamic gain filter for dynamically adjusting a gain of at least a portion of the frequencies of the at least one band of frequencies, wherein the characteristics include;
  at least one of a real-time fast release time and a release time slower than an attack time,
  at least one of an incremental gain change and a stepped gain change.

15. The signal processing system of claim 1, wherein; the transpositional target frequency in the lower frequency audio signal range is within a frequency band wherein an impedance magnitude of the loudspeaker as a function of frequency has a maximum.

16. The signal processing system of claim 1, wherein; the transpositional target frequency in the lower frequency audio signal range is within a frequency band wherein an impedance magnitude of the loudspeaker as a function of frequency has a minimum between a first impedance maximum and a second impedance maximum of the loudspeaker.

17. The signal processing system of claim 1, further including;
  a level dependent threshold detector with at least one amplitude threshold, wherein
  the at least one transpositional target frequency is at least a first transpositional target frequency and a second transpositional target frequency, wherein
  when the signal level is below the amplitude threshold the transpositional target frequency is the first transpositional target frequency, and when the signal level is above the amplitude threshold the transpositional target frequency is the second transpositional target frequency.

18. The signal processing system of claim 1, wherein;
  at least one of the at least one transpositional target frequency includes a frequency of operation of a tactile transducer and at least a portion of the transposed gain is coupled to the tactile transducer.

19. The signal processing system of claim 1, further including;
  at least one additional channel audio signal corresponding to an acoustic output of at least one additional loudspeaker including at least one electro-acoustic transducer with a vibratile diaphragm.

20. The signal processing system of claim 1, further including;
  at least one additional channel audio signal corresponding to an acoustic output of at least one additional loudspeaker including at least one electro-acoustic transducer with a vibratile diaphragm,
  at least one additional signal processor in addition to the at least one transpositional gain controller processor, including
  at least one of at least one time delay of the transpositional gain and at least one harmonics generator to generate harmonics of at least a portion of the frequencies in the at least one band of frequencies.

21. The signal processing system of claim 1, further including;
  at least one additional channel audio signal corresponding to an acoustic output of at least one additional loudspeaker including at least one electro-acoustic transducer with a vibratile diaphragm, wherein
  at least one of the at least one transpositional target frequencies is in at least one of the audio signal channels.

22. The signal processing system of claim 1, further including;
  at least one additional channel audio signal corresponding to an acoustic output of at least one additional loudspeaker including at least one electro-acoustic transducer with a vibratile diaphragm,
  at least one additional signal processor in addition to the at least one transpositional gain controller processor, including
  at least one of at least one of a time delay of the transpositional gain and at least one harmonics generator to generate harmonics of at least a portion of the frequencies in the at least one band of frequencies, wherein
  the at least one transpositional target frequency is in at least one of the audio signal channels, and
  the generated harmonics of the at least one harmonics generator are in at least one of the audio signal channels.

23. The signal processing system of claim 1, further including;
  at least one additional channel audio signal corresponding to an acoustic output of at least one additional loudspeaker including at least one electro-acoustic transducer with a vibratile diaphragm,
  at least one of at least one additional signal processor in addition to the at least one transpositional gain controller processor, including
  at least one of a time delay of the transpositional gain and a harmonics generator to generate harmonics of at least a portion of the frequencies in the at least one band of frequencies, wherein,
  the at least one transpositional target frequency is in at least one of the audio signal channels,
  the time delay is in at least one of the audio signal channels,
  the generated harmonics of the at least one harmonics generator are in at least one of the audio signal channels, and
  the harmonics generator is one of a static harmonics generator and a dynamic harmonics generator.

24. The signal processing system of claim 1, further including;
  at least one additional channel audio signal corresponding to an acoustic output of at least one additional loudspeaker including at least one electro-acoustic transducer with a vibratile diaphragm, wherein the at least one transpositional target frequency is in at least one of the audio signal channels,
  at least one of at least one additional signal processor in addition to the at least one transpositional gain controller processor including at least one of; a time delay, a dynamic gain filter for dynamically adjusting an amplitude of at least a portion of an amplitude of the at least one band of frequencies, and a harmonics generator to generate harmonics of at least a portion of the frequencies in the at least one band of frequencies, wherein
  the time delay provides a delay of at least one of the transposed gain and the generated harmonics,
  the generated harmonics are produced in at least one of the audio signal channels, and the harmonics generator is one of a static harmonics generator and a dynamic harmonics generator, each dynamic processor is responsive to an amplitude threshold of an amplitude threshold detector.

25. The signal processing system of claim 1, wherein; the at least one loudspeaker enclosure further includes;

at least one low frequency resonant chamber with the resonant chamber consisting of at least one of a bass-reflex resonant chamber and a wave-resonant air-column chamber, a first frequency range, in the lower frequency audio signal range, with a reduced diaphragm displacement including a fundamental resonant chamber resonance frequency $F_{RC1}$ at which a displacement characteristic of the vibratile diaphragm as a function of frequency has a minimum, a second frequency range, in the lower frequency audio signal range, adjacent to, and higher in frequency than $F_{RC1}$, including an increased diaphragm displacement and a frequency $F_{MAX1}$ at which the displacement characteristic of the vibratile diaphragm as a function of frequency, above $F_{RC1}$, has a maximum, a third frequency range above the frequency the first frequency range, a fourth frequency range, in the lower frequency audio signal range, adjacent to, and lower in frequency than $F_{RC1}$, including an increased diaphragm displacement and a frequency $F_{MAX2}$ at which the displacement characteristic of the vibratile diaphragm as a function of frequency, below $F_{RC1}$, reaches a maximum, the at least one band of frequencies in the lower frequency audio signal range includes at least one of $F_{MAX1}$ and $F_{MAX2}$, at least one of the at least one transpositional target frequency is in the first frequency range.

26. The signal processing system of claim 1, wherein;

at least a portion of a signal process from the signal processing system is applied to a downloadable program.

27. The signal processing system of claim 1, further including;

at least one additional signal processor in addition to the at least one transpositional gain controller processor, wherein the at least one additional signal processor includes a harmonics generator processor to generate harmonics of at least a portion of the frequencies in the at least one band of frequencies.

28. The signal processing system of claim 1, further including;

at least one gain filter controlling at least a portion of an amplitude of the at least one band of frequencies, the at least one gain filter including at least one of at least one high pass filter, at least one band filter, and at least one shelf filter, at least one additional signal processor in addition to the at least one transpositional gain controller processor, wherein the at least one additional signal processor includes a harmonics generator processor to generate harmonics of at least a portion of the frequencies in the at least one band of frequencies.

29. The signal processing system of claim 1, further including;

at least one static gain filter controlling at least a portion of an amplitude of the at least one band of frequencies, the at least one static gain filter including at least one of at least one high pass filter, at least one band filter, and at least one shelf filter, at least one additional signal processor in addition to the at least one transpositional gain controller processor, wherein the at least one additional signal processor includes a static harmonics generator processor to generate harmonics of at least a portion of the frequencies in the at least one band of frequencies, wherein, the at least one transpositional gain controller processor includes a static transpositional gain controller.

* * * * *